United States Patent
Haynes et al.

(10) Patent No.: US 11,018,618 B2
(45) Date of Patent: May 25, 2021

(54) PHOTOVOLTAIC SYSTEMS

(71) Applicant: Zinniatek Limited, Auckland (NZ)

(72) Inventors: Andrew Leo Haynes, Auckland (NZ); Ashton Cyril Partridge, Auckland (NZ); David J. Bates, Brookline, MA (US); Pengcheng Liu, Auckland (NZ); Seng Oon Toh, Berkeley, CA (US); Sing Kiong Nguang, Auckland (NZ); Sorin Spanoche, Santa Clara, CA (US)

(73) Assignee: Zinniatek Limited, Auckland (NZ)

( * ) Notice: Subject to any disclaimer, the term of this patent is extended or adjusted under 35 U.S.C. 154(b) by 36 days.

(21) Appl. No.: 15/651,300

(22) Filed: Jul. 17, 2017

(65) Prior Publication Data
US 2018/0123503 A1 May 3, 2018

Related U.S. Application Data

(62) Division of application No. 14/892,366, filed as application No. PCT/NZ2014/000094 on May 23, 2014, now Pat. No. 9,954,480.

(51) Int. Cl.
*H02S 20/25* (2014.01)
*H02S 40/32* (2014.01)
*H02S 20/26* (2014.01)
*H02S 40/36* (2014.01)
*H01L 31/048* (2014.01)
(Continued)

(52) U.S. Cl.
CPC .............. *H02S 20/25* (2014.12); *F24S 25/61* (2018.05); *H01L 31/048* (2013.01); *H02S 20/26* (2014.12); *H02S 40/32* (2014.12); *H02S 40/36* (2014.12); *F24S 2020/13* (2018.05); *F24S 2025/6008* (2018.05); *F28F 3/044* (2013.01); *F28F 3/048* (2013.01); *Y02B 10/10* (2013.01); *Y02B 10/20* (2013.01); *Y02E 10/47* (2013.01); *Y02E 10/50* (2013.01)

(58) Field of Classification Search
CPC .......... H02S 20/25; H02S 20/26; H02S 40/32; H01L 31/048
See application file for complete search history.

(56) References Cited

U.S. PATENT DOCUMENTS

| 167,833 A | 9/1875 | Garland |
| 510,027 A | 12/1893 | Johnson |

(Continued)

FOREIGN PATENT DOCUMENTS

| CA | 2849258 A1 | 3/2013 |
| CA | 2794345 A1 | 5/2013 |

(Continued)

OTHER PUBLICATIONS

U.S. Appl. No. 15/615,300, filed Jul. 17, 2017, Zinniatek Ltd.
(Continued)

*Primary Examiner* — Tae-Sik Kang
(74) *Attorney, Agent, or Firm* — Foley & Lardner LLP

(57) ABSTRACT

This invention relates to a roofing panel for interconnection with one or more additional roofing panels. The roofing panel comprises a PV cell coupled to an inverter, and wireless (or optionally wired) power transfer circuitry for transmitting power to another roofing panel and/or the AC grid and/or to an AC inverter, and/or for receiving power from another roofing panel.

20 Claims, 76 Drawing Sheets

(51) Int. Cl.
*F24S 25/61* (2018.01)
*F28F 3/04* (2006.01)
*F24S 20/00* (2018.01)
*F24S 25/60* (2018.01)

(56) References Cited

U.S. PATENT DOCUMENTS

| | | |
|---|---|---|
| 1,004,338 A | 9/1911 | Austin |
| 1,266,137 A | 5/1918 | Melde |
| 1,634,126 A | 6/1927 | Tyra |
| 1,678,333 A | 7/1928 | Figge |
| 1,741,515 A | 12/1929 | Halprin |
| 1,941,216 A | 12/1933 | McKeown |
| 2,149,818 A | 3/1939 | North |
| 2,260,446 A | 11/1941 | Ormsby |
| 2,362,236 A | 11/1944 | Bassler |
| 2,568,603 A | 9/1951 | Anthony |
| 2,624,298 A | 1/1953 | Farren |
| 2,680,565 A | 6/1954 | Lof |
| 2,756,699 A | 7/1956 | Lockwood |
| 2,766,861 A | 10/1956 | Abramson |
| 3,058,265 A | 10/1962 | Lapsensohn |
| 3,223,018 A | 12/1965 | Tucker |
| 3,332,830 A | 7/1967 | Tomlinson |
| 3,357,064 A | 12/1967 | Munse |
| 3,661,410 A | 5/1972 | Larson et al. |
| 4,141,182 A | 2/1979 | McMullen |
| 4,173,243 A | 11/1979 | Wilde et al. |
| 4,173,253 A | 11/1979 | Wiegand |
| 4,201,196 A | 5/1980 | Zani |
| 4,281,639 A | 8/1981 | Kuronen |
| 4,288,959 A | 9/1981 | Murdock |
| 4,319,437 A | 3/1982 | Murphy |
| 4,411,117 A | 10/1983 | Bolha |
| 4,426,823 A | 1/1984 | Kobe |
| 4,712,351 A | 12/1987 | Kasprzak |
| 4,956,140 A | 9/1990 | Rolles et al. |
| 5,053,180 A | 10/1991 | Wang et al. |
| 5,070,671 A | 12/1991 | Fifield et al. |
| 5,076,037 A | 12/1991 | Crick et al. |
| 5,094,058 A | 3/1992 | Slocum |
| 5,100,274 A | 3/1992 | Hasan et al. |
| 5,104,770 A | 4/1992 | Usifer et al. |
| 5,295,339 A | 3/1994 | Manner |
| 5,347,785 A | 9/1994 | Terrenzio et al. |
| 5,437,735 A | 8/1995 | Younan et al. |
| 5,475,963 A | 12/1995 | Chelednik |
| 5,487,247 A | 1/1996 | Pigg |
| 5,615,523 A | 4/1997 | Wells et al. |
| 5,615,527 A | 4/1997 | Attley |
| 5,630,305 A | 5/1997 | Hlasnicek |
| 5,651,226 A | 7/1997 | Archibald |
| 5,690,876 A | 11/1997 | Gallo, Jr. |
| 5,711,126 A | 1/1998 | Wells |
| 6,021,611 A | 2/2000 | Wells et al. |
| 6,061,978 A | 5/2000 | Dinwoodie et al. |
| 6,145,264 A | 11/2000 | Dallaire |
| 6,164,034 A | 12/2000 | Roetheli et al. |
| 6,201,179 B1 | 3/2001 | Dalacu |
| 6,220,956 B1 | 4/2001 | Kilian et al. |
| 6,248,271 B1 | 6/2001 | Graham et al. |
| 6,856,496 B1 | 2/2005 | Mucci et al. |
| 6,908,295 B2 | 6/2005 | Thielman et al. |
| 6,941,706 B2 | 9/2005 | Austin et al. |
| 7,735,287 B2 | 6/2010 | Gaudreau |
| 8,020,353 B2 | 9/2011 | Gaudreau |
| 8,100,341 B1 | 1/2012 | Roderick et al. |
| 8,215,070 B2 | 7/2012 | Railkar et al. |
| 8,245,475 B1 | 8/2012 | Thomson et al. |
| 8,307,599 B2 | 11/2012 | Jenkins et al. |
| 8,333,356 B2 | 12/2012 | Ernst et al. |
| 8,402,707 B2 | 3/2013 | Mitchell et al. |
| 8,468,754 B2 | 6/2013 | Railkar et al. |
| 8,567,601 B2 | 10/2013 | Turek et al. |
| 8,713,860 B2 | 5/2014 | Railkar et al. |
| 8,713,882 B2 | 5/2014 | Kalkanoglu et al. |
| 8,763,339 B2 | 7/2014 | Bryson et al. |
| 8,782,967 B2 | 7/2014 | Daniels |
| 9,182,136 B2 | 11/2015 | Oaten et al. |
| 9,322,173 B2 | 4/2016 | Pisani |
| 9,416,540 B2 | 8/2016 | Allen et al. |
| 9,518,391 B2 | 12/2016 | Haynes et al. |
| 2001/0022055 A1 | 9/2001 | Zhang |
| 2002/0037630 A1 | 3/2002 | Agarwal et al. |
| 2002/0117166 A1 | 8/2002 | Okumura |
| 2003/0154667 A1 | 8/2003 | Dinwoodie |
| 2004/0009338 A1 | 1/2004 | Jo et al. |
| 2004/0020528 A1 | 2/2004 | Patwardhan |
| 2005/0072091 A1 | 4/2005 | Morris |
| 2005/0072092 A1 | 4/2005 | Williams |
| 2005/0178429 A1 | 8/2005 | McCaskill et al. |
| 2005/0239394 A1 | 10/2005 | O'Hagin et al. |
| 2005/0262797 A1 | 12/2005 | Davis |
| 2006/0026908 A1 | 2/2006 | Gregori et al. |
| 2006/0080942 A1 | 4/2006 | O'Neill |
| 2007/0039274 A1 | 2/2007 | Harrington et al. |
| 2007/0078191 A1 | 4/2007 | Guhde et al. |
| 2007/0119109 A1 | 5/2007 | Kuelker |
| 2007/0144096 A1 | 6/2007 | O'Neal |
| 2007/0193620 A1 | 8/2007 | Hines et al. |
| 2007/0266562 A1 | 11/2007 | Friedman et al. |
| 2008/0000174 A1 | 1/2008 | Flaherty et al. |
| 2008/0000512 A1 | 1/2008 | Flaherty et al. |
| 2008/0121270 A1 | 5/2008 | Mayer et al. |
| 2008/0184645 A1 | 8/2008 | Trabue et al. |
| 2008/0185748 A1 | 8/2008 | Kalkanoglu |
| 2008/0271773 A1 | 11/2008 | Jacobs et al. |
| 2008/0302030 A1 | 12/2008 | Stancel et al. |
| 2008/0302031 A1 | 12/2008 | Bressler et al. |
| 2009/0000222 A1 | 1/2009 | Kalkanoglu et al. |
| 2009/0215304 A1 | 8/2009 | Faust et al. |
| 2010/0037548 A1 | 2/2010 | Kalkanoglu et al. |
| 2010/0083602 A1 | 4/2010 | Pollack |
| 2010/0141042 A1* | 6/2010 | Kesler ............ H02J 50/80 307/104 |
| 2010/0170169 A1 | 7/2010 | Railkar et al. |
| 2010/0236162 A1 | 9/2010 | Tweedie |
| 2010/0237709 A1 | 9/2010 | Hall et al. |
| 2010/0313501 A1 | 12/2010 | Gangemi |
| 2011/0000535 A1 | 1/2011 | Davidson |
| 2011/0012430 A1 | 1/2011 | Cheng et al. |
| 2011/0017282 A1 | 1/2011 | Tas et al. |
| 2011/0037322 A1 | 2/2011 | Kanno |
| 2011/0041428 A1 | 2/2011 | Posnansky |
| 2011/0041518 A1 | 2/2011 | Peterson et al. |
| 2011/0047894 A1 | 3/2011 | Shadwell et al. |
| 2011/0214372 A1 | 9/2011 | Mullet et al. |
| 2011/0277408 A1 | 11/2011 | Turek et al. |
| 2012/0019074 A1 | 1/2012 | Frolov et al. |
| 2012/0024283 A1 | 2/2012 | Skillman |
| 2012/0098350 A1 | 4/2012 | Campanella et al. |
| 2012/0117908 A1 | 5/2012 | Turek et al. |
| 2012/0149291 A1 | 6/2012 | Roderick et al. |
| 2013/0095293 A1 | 4/2013 | Boss et al. |
| 2013/0167463 A1 | 7/2013 | Duve |
| 2013/0193769 A1* | 8/2013 | Mehta ............ H02J 5/005 307/104 |
| 2013/0233385 A1 | 9/2013 | Reese et al. |
| 2013/0255755 A1 | 10/2013 | Chich |
| 2013/0263534 A1 | 10/2013 | Railkar et al. |
| 2014/0090696 A1 | 4/2014 | Rodrigues et al. |
| 2014/0090697 A1 | 4/2014 | Rodrigues et al. |
| 2014/0190921 A1 | 7/2014 | Thomson et al. |
| 2014/0259998 A1 | 9/2014 | Railkar et al. |
| 2014/0259999 A1 | 9/2014 | Rodrigues et al. |
| 2014/0260001 A1 | 9/2014 | Kiik et al. |
| 2014/0265609 A1 | 9/2014 | Rodrigues et al. |
| 2015/0047285 A1 | 2/2015 | Dejarnette et al. |
| 2015/0240495 A1 | 8/2015 | Vermilion et al. |
| 2017/0059184 A1 | 3/2017 | Haynes et al. |

(56) References Cited

U.S. PATENT DOCUMENTS

| | | | |
|---|---|---|---|
| 2017/0355392 A1 | 12/2017 | Nagatani et al. | |
| 2018/0123503 A1 | 5/2018 | Haynes et al. | |

FOREIGN PATENT DOCUMENTS

| | | |
|---|---|---|
| CN | 1261417 A | 7/2000 |
| DE | 46673 C | 8/1888 |
| DE | 20 02 738 A1 | 7/1971 |
| DE | 42 16 171 A1 | 1/1993 |
| DE | 20 2005 002 105 | 6/2005 |
| DE | 10 2010 009 595 | 9/2011 |
| DE | 10 2010 019 815 A1 | 11/2011 |
| EP | 0 436 572 | 11/1995 |
| EP | 2 009 704 | 12/2008 |
| EP | 2 075 389 A2 | 7/2009 |
| EP | 2 256 894 | 12/2010 |
| EP | 2 494 124 | 5/2014 |
| EP | 2 785 930 | 11/2015 |
| EP | 2 547 837 | 4/2017 |
| EP | 3 227 507 | 10/2017 |
| GB | 2 141 157 | 12/1984 |
| GB | 2 199 860 | 7/1988 |
| GB | 2 344 836 | 8/2002 |
| JP | S54-121515 | 9/1979 |
| JP | S6193750 | 5/1986 |
| JP | S61-169562 A | 7/1986 |
| JP | S63-065240 | 3/1988 |
| JP | S63-165633 | 7/1988 |
| JP | S63-210346 A | 9/1988 |
| JP | 03-086928 U1 | 9/1991 |
| JP | H534623 A | 2/1993 |
| JP | 06-032527 U | 4/1994 |
| JP | H06-108549 | 4/1994 |
| JP | 06-212742 A | 8/1994 |
| JP | H7217011 | 8/1995 |
| JP | H7218002 | 8/1995 |
| JP | 08-068566 A | 3/1996 |
| JP | 09-032141 A | 2/1997 |
| JP | H960981 | 3/1997 |
| JP | H972618 | 3/1997 |
| JP | H09-275644 A | 10/1997 |
| JP | 10-227103 A | 8/1998 |
| JP | 10-325214 A | 12/1998 |
| JP | H11-136540 | 2/1999 |
| JP | 11-006231 A | 3/1999 |
| JP | H11-504403 A | 4/1999 |
| JP | 2000-510210 | 8/2000 |
| JP | 2001-295422 | 10/2001 |
| JP | 2002-235955 | 8/2002 |
| JP | 2003-049509 | 2/2003 |
| JP | 2005-191578 A | 7/2005 |
| JP | 2006-022481 A | 1/2006 |
| JP | 2008-034557 A | 2/2008 |
| JP | 2008-180414 A | 8/2008 |
| JP | 2009-503309 A | 1/2009 |
| JP | 2009-127921 | 6/2009 |
| JP | 2011-041464 | 2/2011 |
| JP | 5118102 | 1/2013 |
| JP | 2015-502726 | 1/2015 |
| JP | 60-060652 B2 | 1/2017 |
| JP | 2018-011504 | 1/2018 |
| KR | 20110128094 | 11/2011 |
| NZ | 715037 | 5/2013 |
| WO | WO-98/57009 | 12/1998 |
| WO | WO-00/23673 A1 | 4/2000 |
| WO | WO-02/093655 | 11/2002 |
| WO | WO-2006/063333 A2 | 6/2006 |
| WO | WO-2007/058548 | 5/2007 |
| WO | WO-2008/070907 A1 | 6/2008 |
| WO | WO-2008/137966 | 11/2008 |
| WO | WO-2010/036980 | 4/2010 |
| WO | WO-2010/150316 | 12/2010 |
| WO | WO-2011/027627 A1 | 3/2011 |
| WO | WO-2011/099109 A1 | 8/2011 |
| WO | WO-2012/021145 | 2/2012 |
| WO | WO-2013/067484 A1 | 5/2013 |
| WO | WO-2013/081477 A1 | 6/2013 |
| WO | WO-2013/112248 | 8/2013 |
| WO | WO-2015/132756 | 9/2015 |

OTHER PUBLICATIONS

ASTM D3462, Standard Specification for Asphalt Shingles Made from Glass Felt and Surfaced with Mineral Granules, downloaded Aug. 26, 2018, 4 pps.
Extended European Search Report, EP Application No. 15864647.1, dated Jul. 20, 2018, 9 pps.
Extended European Search Report for European Patent Application No. 12852960.9, dated May 27, 2015, 6 pages.
International Search Report for International Application No. PCT/NZ2012/000221, dated Apr. 3, 2013, 6 pages.
International Search Report regarding PCT/NZ2012/000222, dated Apr. 2, 2013, 7 pages.
Supplementary European Search Report for European Patent Application No. 1285444, dated Oct. 16, 2016, 10 pages.
Examination Report for European Patent App. No. 15866038.1 dated Apr. 18, 2019, 6 pages.
Office Action regarding Japanese Application No. 2017-528829, dated May 19, 2020, 3 pps. (with translation, also 3 pps.).

* cited by examiner

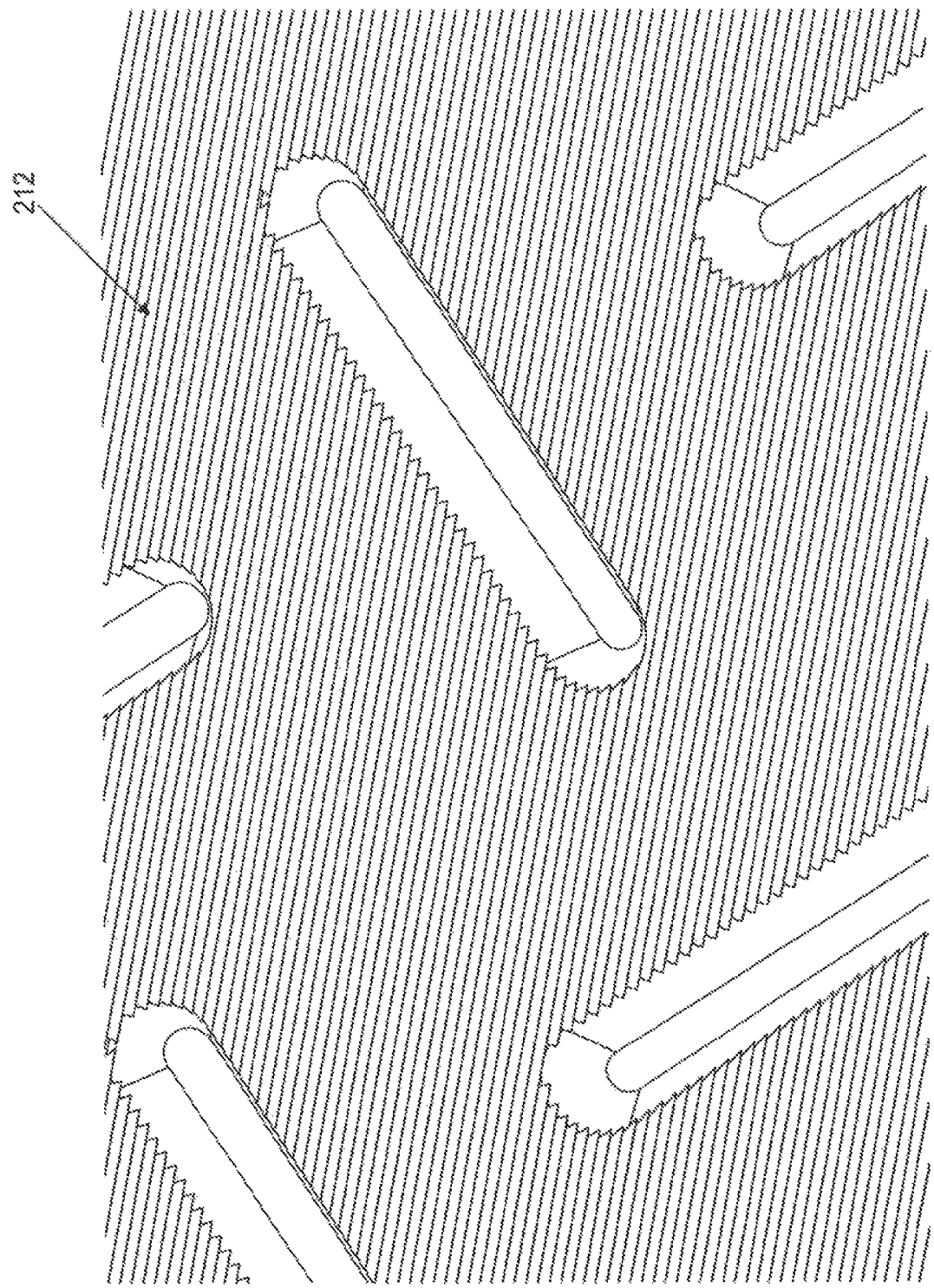

PHOTOVOLTAIC SYSTEMS

CROSS-REFERENCE TO RELATED APPLICATIONS

This application is a divisional of U.S. patent application Ser. No. 14/892,366, filed on Nov. 19, 2015, which is the U.S. National Stage of International Application No. PCT/NZ2014/000094, filed May 23, 2014, which claims the benefit of and priority to New Zealand Application No. NZ 610987, filed May 23, 2013. All of these applications are incorporated by referenced herein in their entireties.

FIELD OF THE INVENTION

The present invention relates to photovoltaic (PV) systems and assemblies and their use on roofing products.

More particularly the present invention relates to a method whereby photovoltaic wafers, sails, cells, modules or the like (generally termed "cells") can be linked or coupled upon installation and/or during installation so as to enable a useful electrical output.

BACKGROUND TO THE INVENTION

There are many systems where a substrated PV unit or an unsubstrated PV unit requires an electrical connection to a bus, cable or the like. An instance includes PV electricity generating systems reliant upon an array of PV units whether as standalone arrays or when forming part of, for example, the cladding of a building structure (roof and/or walls).

In many instances the PV unit in whatsoever form it takes (whether stand alone or substrated) is subject to weathering at any electrical connection.

Furthermore, where a plurality of PV units require connection on installation, for example when installed as an array on a roof top, it can be difficult, expensive and time consuming to make the numerous wired or otherwise contacting electrical connections required in order to derive a useful output. It is crucial to the functioning of the units that these connections are made properly at the outset (i.e. before they are subject to weathering and environmental degradation); however it is easy to overlook the quality of each individual connection when a large number of them need to be made in a short space of time to complete the installation.

SUMMARY OF THE INVENTION

It is an object of the present invention to provide an improved roofing panel.

In an aspect the invention relates to a roofing panel for interconnection with one or more additional roofing panels, the roofing panel comprising: a PV cell coupled to an inverter, and wireless power transfer circuitry for transmitting power to another roofing panel and/or the AC grid and/or to an AC inverter, and/or for receiving power from another roofing panel.

Preferably the wireless power transfer circuitry comprises receiving circuitry comprising an inductor and a rectifier.

Preferably the wireless power transfer circuitry comprises transmitting circuitry comprising an inductor coupled to the inverter and if present the receiving circuitry.

Preferably the panel further comprises a grid inverter for receiving and inverting power from the PV cell coupled to the inverter and the rectifier of the receiving circuitry for transmission to the grid.

Preferably the grid inverter is a unipolar inverter.

In an aspect the invention relates to a roofing system that provides energy output comprising a plurality of interconnected roofing panels according to any preceding claim with power conversion modules and PV cells integrated into formed features of the roofing panels to provide for capture, transfer and inversion of output from the PV cells for transfer to an AC grid.

In an aspect the invention relates to two or more roofing panels comprising one or more slave roofing panels according to any described and at least one master roofing panel according to any described arranged such that each roofing panel receives power from a previous slave panel via the wireless power transfer circuitry and each slave roofing panel transmits power to a subsequent roofing panel via the wireless power transfer circuitry.

Preferably the roofing panels comprise a bus with nodes for receiving power transmitted from a previous roofing panel via the wireless power transfer circuitry and transmitting that power to a subsequent roofing panel via wired or wireless power transfer.

In an aspect the invention relates to a roofing panel for interconnection with one or more additional roofing panels, the roofing panel comprising: a PV cell coupled to an inverter, and wired power transfer circuitry and/or conductors and/or terminals or the like, for transmitting power to another roofing panel and/or the AC grid, and/or for receiving power from another roofing panel.

In an aspect the invention relates to a roofing panel comprising: an overlapping region and an underlapping region, one or more PV regions for PV cells in the overlapping region, a recess for a power conversion module, preferably in the underlapping region.

Preferably the roofing panel comprises one or more formed features in the underlapping region.

Preferably the formed features create airflow channels which provide for airflow when the roofing panel is arranged with other roofing panels in a roofing system.

Preferably the roofing panel further comprises one or more PV cells in one or more PV regions, and a power conversion module in the recess connected to the output of the one or more PV cells.

Preferably the roofing panel further comprises a first coil region and a second coil region each for carrying a coil for wireless power transfer, and/or a transformer.

Preferably the power conversion module comprises an input connected to/for connection to the output of one or more PV cells, a DC to AC inverter coupled to the input, and an output for connection to an output AC grid bus.

Preferably the roofing panel comprises a first coil in the first coil region and a second coil in the second coil region, each coil coupled to the power conversion module, the first and second coils for inductive coupling with a respective coils of a corresponding roofing panel.

Alternatively the roofing panel comprises a first coil in the first coil region for inductive coupling with a respective coil on a DC or AC bus.

In another aspect the invention comprises a plurality of roofing panels as above arranged so that the first coil region of a first roofing panel coincides with a corresponding coil region of an adjacent roofing panel so that the respective first and corresponding coils inductively couple to transfer power from one roofing panel to the other.

Alternatively, in another aspect the roofing panel comprises a plurality of roofing panels as above arranged so that the first coil region of a first roofing panel coincides with a corresponding coil on a DC or AC bus that wirelessly couples to other roofing panels and that couples directly or indirectly to the output AC grid bus.

Preferably the first coil region mechanically couples to a coil region on the DC or AC bus carrying the corresponding coil.

Preferably the plurality of roofing panels are arranged so that one of the panels couples the output from its power conversion module to an output bus.

Preferably the plurality of roofing panels are arranged on a substrate or frame to form a roof.

Preferably the one or more formed features displace the roofing panels from the substrate or frame to create the airflow channels.

Preferably the recess is in the airflow channels created by the one or more formed features.

Preferably the recess comprises profiling to increase thermal transfer from a power conversion module in the recess to airflow in the channels.

Preferably the recess has a thermal paste for thermally coupling the power conversion module therein to the airflow in the airflow channels. Preferably the thermal paste is doped with a thermally conductive material, such as aluminium.

A roofing system that provides energy output comprising a plurality of interconnected roofing panels (such as any described above) with power conversion modules and PV cells integrated into formed features of the roofing panels to provide for capture, transfer and inversion of output from the PV cells for transfer to an AC grid.

Preferably inductive and/or capacitive power transfer is coupled to energy storage of a microinverter in place of electrolytic solutions or other storage means.

Preferably the inductive coupling of coils produces a transformer enabling galvanic isolation of power controls from the utility grid, load or batter.

In an aspect the invention relates to a photovoltaic unit adapted to provide wireless power transfer output comprising: one or more photovoltaic cells that generate electrical output, at least one wireless power transfer transmitter coupled to transfer the electrical output via wireless power transfer.

Preferably the photovoltaic unit is for installation on a roof or a substrate panel to serve as a roofing product.

Preferably the electrical output is transferred via wireless power transfer to a load and/or output conductor.

Preferably the wireless power transfer is via capacitive coupling whereby the wireless power transfer transmitter forms a capacitor with a wireless power transfer receiver coupled to (or for coupling to) the load and/or output conductor.

Preferably the wireless power transfer transmitter comprises a capacitor plate.

Preferably the capacitor plate has surface texturing.

Preferably the surface texturing is nanoscopic and/or microscopic surface texturing.

Preferably two or more photovoltaic cells coupled together to generate the electrical output, wherein the photovoltaic cells are coupled together using wireless power transfer.

In an aspect the present invention relates to two or more photovoltaic units coupled together to generate electrical output, each according to the photovoltaic units defined herein, wherein the photovoltaic cells are coupled together using wireless power transfer.

In an aspect the invention relates to a roof or roofing component comprising a photovoltaic unit according to photovoltaic units defined herein.

Preferably roof or roofing component further comprising at least one wireless power transfer receiver coupled to (or for coupling to) a load or output conductor for receiving electrical output from the wireless power transfer transmitter.

Preferably the wireless power transfer is via capacitive coupling whereby the wireless power transfer transmitter forms a capacitor with the wireless power transfer receiver coupled to (or for coupling to) the load and/or output conductor.

Preferably the wireless power transfer transmitter comprises a capacitor plate.

Preferably the capacitor plate has surface texturing.

Preferably the surface texturing is nanoscopic and/or microscopic surface texturing.

In an aspect the invention relates to a PV unit of any appropriate form (substrated or not) able to be mounted or adapted to be mounted so as to receive solar energy directly or indirectly and generate an electrical output, the apparatus being characterised in that it is able to transfer energy output using wireless power transfer (such as inductive and/or capacitive coupling), said transfer occurring over an inductive and/or capacitive transfer region.

Preferably or optionally the projected area of the transfer region is less than 50% of the area of the solar receiving area of the PV unit.

Preferably or optionally the surface area of the transfer region is from 5% to 1000%, or from 100% to 800%, or from 200% to 600% of the area of the solar receiving area of the PV unit.

Preferably or optionally the surface area of the transfer region is from 5% to 1000%, or from 100% to 800%, or from 200% to 600% of the projected area of the transfer region.

Preferably or optionally the inductive region is greater than or equal to 0.5% of the area of the solar receiving area of the unit.

Most preferably or optionally an optimum area is provided whereby transfer losses (such as inductive and/or capacitive transfer losses) are rendered substantially insignificant with respect to the certainty of the output transfer and the output of the PV unit.

Preferably or optionally the transfer of energy output is achieved by inductive coupling.

Preferably or optionally the transfer of energy output is achieved by capacitive coupling.

Preferably or optionally inductive and/or capacitive coupling is achieved by the interaction of a transmitter able to transmit energy/power generated by the PV unit and a receiver able to receive the transmitted energy.

Preferably or optionally the transmitter is an induction coil or pad.

Preferably or optionally the transmitter is a capacitor plate.

Preferably or optionally the transmitter is mounted on or associated with the PV unit.

Preferably or optionally the transmitter is housed in a recess on the PV unit.

Preferably or optionally the transmitter is housed in a sealed containment on the PV unit.

Preferably or optionally the receiver is connected to a reticulation bus, cable or the like for distributing the electrical output.

Preferably or optionally the PV unit is substrated.

Preferably or optionally the transmitter is mounted on or associated with the substrate.

Preferably or optionally the transmitter is housed in a recess on the substrate.

Preferably or optionally the transmitter is housed in a sealed containment within the substrate.

Preferably or optionally the transmitter is a pad (e.g. implementing inductive and/or capacitive coupling) with nanoscopic and/or microscopic surface texturing on it.

Preferably or optionally the receiver is a pad (e.g. implementing inductive and/or capacitive coupling) with nanoscopic and/or microscopic surface texturing on it.

Preferably or optionally the transmitter and receiver are a plurality of induction coils enabling energy storage, power control and wireless transfer.

Preferably or optionally the photovoltaic unit is a photovoltaic cell with a single transfer region.

Preferably or optionally the photovoltaic unit is a photovoltaic cell with two transfer regions.

Preferably or optionally the photovoltaic unit is a photovoltaic cell with more than two transfer regions.

In a further aspect the invention consists in PV units linked (for example neurally) by wireless power transfer (such as inductive and/or capacitive coupling).

Preferably or optionally the said PV units are photovoltaic cells linked neurally and mounted upon a substrate panel to serve as a roofing product.

In a further aspect of the invention consists in PV units linked (for example neurally) by wireless energy transfer (such as inductive and/or capacitive coupling).

Preferably or optionally the said PV units are photovoltaic cells linked neurally and mounted upon a substrate panel to serve as a roofing product.

In another aspect the present invention relates to PV units coupled by wireless power transfer (such as by inductive and/or capacitive coupling) to a reticulation bus, cable or the like for distributing the electrical output.

Preferably or optionally the wireless power transfer coupling is achieved by energy transfer occurring over a (e.g. inductive and/or capacitive) transfer region.

Preferably or optionally the projected area of the transfer region is less than 50% of the area of the solar receiving area of the PV unit.

Preferably or optionally the surface area of the transfer region is from 5% to 1000%, or from 100% to 800%, or from 200% to 600% of the area of the solar receiving area of the PV unit.

Preferably or optionally the surface area of the transfer region is from 5% to 1000%, or from 100% to 800%, or from 200% to 600% of the projected area of the transfer region.

Preferably or optionally the transfer region is greater than or equal to 0.5% of the area of the solar receiving area of the unit.

Most preferably or optionally an optimum area of the power transfer region is provided whereby inductive transfer losses are rendered substantially insignificant with respect to the certainty of the output transfer and the output of the PV unit.

Preferably or optionally the wireless power transfer coupling is achieved by inductive coupling.

Preferably or optionally the wireless power transfer coupling is achieved by capacitive coupling.

Preferably or optionally wireless power transfer coupling is achieved by the interaction of a transmitter able to transmit energy generated by the PV unit and a receiver able to receive the transmitted energy.

Preferably or optionally the transmitter is an induction coil or pad.

Preferably or optionally the transmitter is a capacitor plate.

Preferably or optionally the transmitter is mounted on or associated with the PV unit.

Preferably or optionally the transmitter is housed in a recess on the PV unit.

Preferably or optionally the transmitter is housed in a sealed containment on the PV unit.

Preferably or optionally the receiver is connected to a reticulation bus, cable or the like for distributing the electrical output.

Preferably or optionally the PV unit is substrated.

Preferably or optionally the transmitter is mounted on or associated with the substrate.

Preferably or optionally the transmitter is housed in a recess on the substrate.

Preferably or optionally the transmitter is housed in a sealed containment within the substrate.

Preferably or optionally the transmitter is a pad (e.g. implementing inductive and/or capacitive coupling) with nanoscopic and/or microscopic surface texturing on it.

Preferably or optionally the receiver is a pad (e.g. implementing inductive and/or capacitive coupling) with nanoscopic and/or microscopic surface texturing on it.

Preferably or optionally the photovoltaic unit is a photovoltaic cell with a single transfer region.

Preferably or optionally the photovoltaic unit is a photovoltaic cell with two transfer regions.

Preferably or optionally the photovoltaic unit is a photovoltaic cell with more than two transfer regions.

In another aspect the present invention relates to PV units connected wirelessly to a reticulation bus, cable or the like for distributing the electrical output.

Preferably or optionally the wireless connection is achieved by energy transfer occurring over a wireless energy transfer region.

Preferably or optionally the projected area of the wireless energy transfer region is less than 50% of the area of the solar receiving area of the PV unit.

Preferably or optionally the surface area of the wireless energy transfer region is from 5% to 1000%, or from 100% to 800%, or from 200% to 600% of the area of the solar receiving area of the PV unit.

Preferably or optionally the surface area of the wireless energy transfer region from 5% to 1000%, or from 100% to 800%, or from 200% to 600% of the projected area of the wireless energy transfer region.

Preferably or optionally the wireless energy transfer region is greater than or equal to 0.5% of the area of the solar receiving area of the unit.

Most preferably or optionally an optimum area of the power transfer region is provided whereby wireless energy transfer losses are rendered substantially insignificant with respect to the certainty of the output transfer and the output of the PV unit.

Preferably or optionally the wireless connection is achieved by inductive coupling.

Preferably or optionally the wireless connection is achieved by capacitive coupling.

Preferably or optionally the wireless connection is achieved by the interaction of a transmitter able to transmit energy generated by the PV unit and a receiver able to receive the transmitted energy.

Preferably or optionally the transmitter is an induction coil or pad.

Preferably or optionally the transmitter is a capacitor plate.

Preferably or optionally the transmitter is mounted on or associated with the PV unit.

Preferably or optionally the transmitter is housed in a recess on the PV unit.

Preferably or optionally the transmitter is housed in a sealed containment on the PV unit.

Preferably or optionally the receiver is connected to a reticulation bus, cable or the like for distributing the electrical output.

Preferably or optionally the PV unit is substrated.

Preferably or optionally the transmitter is mounted on or associated with the substrate.

Preferably or optionally the transmitter is housed in a recess on the substrate.

Preferably or optionally the transmitter is housed in a sealed containment within the substrate.

Preferably or optionally the transmitter is a pad (e.g. implementing inductive and/or capacitive coupling) with nanoscopic and/or microscopic surface texturing on it.

Preferably or optionally the receiver is a pad (e.g. implementing inductive and/or capacitive coupling) with nanoscopic and/or microscopic surface texturing on it.

Preferably or optionally the photovoltaic unit is a photovoltaic cell with a single wireless energy transfer region.

Preferably or optionally the photovoltaic unit is a photovoltaic cell with two wireless energy transfer regions.

Preferably or optionally the photovoltaic unit is a photovoltaic cell with more than two wireless energy transfer regions.

In a further aspect the invention relates to any assembly and/or subassembly which inductively and/or capacitively transfers the output from one or more PV units into a reticulation device.

Preferably or optionally the transfer occurs over a transfer region (e.g. implementing inductive and/or capacitive coupling).

Preferably or optionally the projected area of the transfer region is less than 50% of the area of the solar receiving area of the PV unit.

Preferably or optionally the surface area of the transfer region is from 5% to 1000%, or from 100% to 800%, or from 200% to 600% of the area of the solar receiving area of the PV unit.

Preferably or optionally the surface area of the transfer region from 5% to 1000%, or from 100% to 800%, or from 200% to 600% of the projected area of the transfer region.

Preferably or optionally the transfer region is greater than or equal to 0.5% of the area of the solar receiving area of the unit.

Most preferably or optionally an optimum area is provided whereby transfer losses are rendered substantially insignificant with respect to the certainty of the output transfer and the output of the PV unit.

Preferably or optionally the transfer is achieved by inductive coupling.

Preferably or optionally the transfer is achieved by capacitive coupling.

Preferably or optionally inductive coupling is achieved by the interaction of a transmitter able to transmit energy generated by the PV unit and a receiver able to receive the transmitted energy.

Preferably or optionally the transmitter is an induction coil or pad.

Preferably or optionally the transmitter is a capacitor plate.

Preferably or optionally the transmitter is mounted on or associated with the PV unit.

Preferably or optionally the transmitter is housed in a recess on the PV unit.

Preferably or optionally the transmitter is housed in a sealed containment on the PV unit.

Preferably or optionally the receiver is connected to a reticulation bus, cable or the like for distributing the electrical output.

Preferably or optionally the PV unit is substrated.

Preferably or optionally the transmitter is mounted on or associated with the substrate.

Preferably or optionally the transmitter is housed in a recess on the substrate.

Preferably or optionally the transmitter is housed in a sealed containment within the substrate.

Preferably or optionally the transmitter is a pad (e.g. implementing inductive and/or capacitive coupling) with nanoscopic and/or microscopic surface texturing on it.

Preferably or optionally the receiver is an inductor pad (e.g. implementing inductive and/or capacitive coupling) with nanoscopic and/or microscopic surface texturing on it.

Preferably or optionally the photovoltaic unit is a photovoltaic cell with a single transfer region.

Preferably or optionally the photovoltaic unit is a photovoltaic cell with two transfer regions.

Preferably or optionally the photovoltaic unit is a photovoltaic cell with more than two transfer regions.

In a further aspect the invention is the use of a photovoltaic device (preferably or optionally on or with cladding or roofing), characterised in that the photovoltaic device has an alternating current or transient direct current passing through a zone in proximity to a bus, said bus being receptive to an wireless power transfer (e.g. inductive and/or capacitive coupling) from the photovoltaic device produced current to that zone.

In various aspects, the present invention relates to a PV unit utilising wireless power transfer used or installed on a roofing, cladding or siding product which is light weight, easy to install, weatherproof, durable, resistant to environmental wear, and aesthetically pleasing. One embodiment relates to a module that can be used to form a weatherproof covering over top of a building surface. Another embodiment is a module which can, in additional to forming a weatherproof covering, be used as part of a thermal energy recovery or removal system. Yet another embodiment is a module which can, in addition to forming a weatherproof covering, and optionally in addition to being useful as part of a thermal energy recovery or removal system, bears an array of solar cells to generate electrical energy.

In an aspect the present invention relates to a PV unit utilising wireless power transfer for installation on a roofing, cladding, or siding module comprising a plurality of formed surfaces moulded from one or more polymeric materials, wherein each of the formed surfaces comprise three dimensional surface features, and wherein the formed surfaces are joined (i.e., integrated together, juxtaposed, or united) without weld lines or injection moulding points.

In one embodiment, each formed surface is a moulded segment along the length of the module. In one embodiment, the three dimensional surface features of each of the formed surfaces are the same or different. In one embodiment, the three dimensional surface features have the same or variable thickness. In one embodiment, the module is substantially flat. In one embodiment, each formed surface comprises an underlapping region and an exposed region, wherein the underlapping region is adapted to be substantially covered by the exposed region of an adjacent module when installed on a building surface.

In one embodiment, the roofing, cladding, or siding module comprises a plurality of formed surfaces moulded from one or more polymeric materials, wherein each of the formed surfaces comprise three dimensional surface features, and wherein the formed surfaces are sequentially formed in a continuum. In some embodiments, the module is formed as it runs through a continuous forming process (as opposed to a die stamping or injection moulding process). Thus, the formed surfaces with the three dimensional surface features are sequentially formed in the continuous forming process.

In an aspect the present invention relates to a PV unit utilising wireless power transfer for installation on a roofing, cladding, or siding module comprising: an underlapping region and an exposed region, wherein the underlapping region is adapted to be substantially covered by the exposed region of an adjacent module when installed on a building surface; and an outer surface and an under surface, wherein the under surface of the underlapping region is profiled to define a pathway for air flow between the module and the building surface.

In one embodiment, the outer surface of the exposed region comprises surface ornamentation. In one embodiment, the surface ornamentation resembles asphalt shingles, slate, wooden shakes, concrete tiles, or the like.

In one embodiment, the outer surface of the exposed region comprises a photovoltaic cell or device. In one embodiment, the module further comprises a solar radiation transmissible film which is overlaid upon the photovoltaic cell.

In one embodiment, the profile of the underside of the underlapping surface is patterned in a manner to (1) create turbulence in the airflow, (2) increase the surface area of the module in contact with the passing airflow compared to a module lacking such a surface pattern, or both (1) and (2). In one embodiment, the profile of the underside of the underlapping region comprises a plurality of projections that create a tortuous pathway above the actual or notional plane of the building surface. In one embodiment, the profile of the underside of the underlapping region comprises corrugated form of alternating parallel grooves and ridges.

In one embodiment, the module is moulded from one or more polymeric materials. In one embodiment, the one or more polymeric materials are selected from the group consisting of polycarbonate, foamed polycarbonate, thermoplastic polyurethane (TPU), thermoplastic olefin (TPO), polyvinyl chloride (PVC), aquilobutalstyrene (ABS), styrene-acrylonitrile resin (SAN), thermoplastic rubber, and any other amorphous or crystalline polymer or combination of polymers. In one embodiment, the one or more polymeric materials are flame retardant. In one embodiment, the one or more polymeric materials are weather, hail, ultraviolet, tear, mold and impact resistant. Metals, composites, wood, concrete, resins, glass, clay, aluminium and the like could also be used, even though polymers are preferred.

In one embodiment, the module comprises at least two layers of polymeric material, wherein the layers are of the same or different polymeric material. In one embodiment, at least one material has high UV resistance. In one embodiment, at least one material has high thermal conductivity. In one embodiment, the module further comprises a reinforcement layer.

In one embodiment, the module or the polymer layers can be coloured or comprise a blend of colours. In one embodiment, the polymer on the outer layer of the module can be manufactured to mimic traditional roofing products. In one embodiment, the polymer on the outer layer of the module can be coloured to contrast with the colour of the PV cell layer to define an aesthetic feature, e.g. shadows.

In one embodiment, the module comprises a first and a second polymeric material. In one embodiment, the first polymeric material has been foamed. In one embodiment, the first polymeric material is able to chemically bond with the second polymeric material. In one embodiment, the first polymeric material, the second polymeric material, or both further comprise thermally conductive inclusions. In one embodiment, the thermally conductive inclusions have been blended and/or bonded to a compatible polymer or ionomer prior to mixing with the first polymeric material. In one embodiment, the thermally conductive inclusions are aluminum particles. In one embodiment, the second polymeric material can self seal to a penetrative fastener. In one embodiment, the first material is foamed polycarbonate and the second material is thermoplastic polyurethane.

In one embodiment, the top and bottom sides of the underlapping region contain complementary locating elements. In one embodiment, the underlapping region is profiled to define one or more regions for fixing by a penetrative fastener. In one embodiment, the one or more regions for fixing by a penetrative fastener are adapted to receive a nail or screw gun head to accurately locate the fixing.

In one embodiment, the module has a convex precamber configured to apply a pre-load pressure to encourage the edges and bottom surface to contact firmly onto an adjacent underlapping panel when installed on a building. In one embodiment, the upper surface of the underlapping region, the lower surface of the exposed region, or both, comprise a strip of flexible polymeric material configured to prevent water from penetrating between two overlapping modules.

In one embodiment, the module has one or more concertina-shaped features to accommodate thermal expansion and contraction between fixing points.

In one embodiment, the upper surface of the underlapping region comprises channels configured to receive wires of a photovoltaic array. In one embodiment, the upper surface of the underlapping region comprises markings to show the correct position of wires and junctions for a photovoltaic array. In one embodiment, the upper surface of the underlapping region comprises pockets or channels configured to receive printed circuit boards (PCB), communication devices, junction boxes, wires, buses, components, cells, and/or diodes of a photovoltaic array.

In one embodiment, the module is manufactured by a continuous forming process. In one embodiment, the module is continuously formed into a horizontal strip capable of extending substantially across an entire section or width of the building surface to be covered. In one embodiment, the module is continuously formed into a vertical strip capable of extending substantially down an entire section or length of the building surface to be covered.

In an aspect the present invention relates to a PV unit utilising wireless power transfer for installation on a roofing, cladding, or siding assembly comprising a plurality of partially-overlapping modules that substantially covers a building surface, wherein each module comprises an underlapping region and an exposed region, wherein the underlapping region is adapted to be substantially covered by the exposed region of an adjacent module when installed on a building surface and the exposed region is adapted to be substantially exposed when installed on a building surface; an outer surface and an under surface, wherein the under surface of the underlapping region is profiled to define a pathway for air flow between the module and the building surface.

In one embodiment, one or more of the modules comprises a photovoltaic cell or device. In one embodiment, the photovoltaic cell or devices are electrically connected by continuous bus strips. In one embodiment, the continuous bus strips only require one terminating junction point to be connected on installation. In one embodiment, the air flow between the underlapping region and the building surface is induced by convection or a fan.

In one embodiment, the modules overlap down the fall of the building surface. In one embodiment, the modules overlap across a building surface. In one embodiment, each module is adapted to be fixably attached to the building surface by at least one fastening member or adhesive. In one embodiment, at least one fastening member is a nail, staple or screw. In one embodiment, the roofing, cladding, or siding assembly forms a weathertight seal over the building surface.

In an aspect the present invention relates to a PV unit utilising wireless power transfer for installation on a system for removing or recovering thermal energy from a building surface, the system comprising a building surface; a roofing, cladding, or siding assembly comprising a plurality of partially-overlapping modules that substantially covers the building surface, wherein each module comprises an underlapping region and an exposed region, wherein the underlapping region is adapted to be substantially covered by the exposed region of an adjacent module when installed on a building surface and the exposed region is adapted to be substantially exposed when installed on a building surface; an outer surface and an under surface, wherein the under surface of the underlapping region is profiled to define a pathway for air flow between the module and the building surface; and a fan adapted to induce the air flow.

In one embodiment, the system further comprises a heat exchanger. In one embodiment, the heat exchanger is part of an air conditioning system, water heating system, or air or media (e.g., sand, ground glass, or concrete) heating system.

In an aspect the present invention relates to a PV unit utilising wireless power transfer for installation on a system for generating electricity and recovering or removing thermal energy from a building surface, the system comprising a building surface; a roofing, cladding, or siding assembly comprising a plurality of partially-overlapping modules that substantially covers the building surface, wherein each module comprises an underlapping region and an exposed region, wherein the underlapping region is adapted to be substantially covered by the exposed region of an adjacent module when installed on a building surface; and an outer surface and an under surface, wherein the under surface of the underlapping region is profiled to define a pathway for air flow between the module and the building surface, and wherein the outer surface of the exposed region comprises one or more photovoltaic cells.

In one embodiment, the system further comprises a vent for exhausting the air flow. In one embodiment, the system further comprises a heat exchanger adapted to receive the air flow. In one embodiment, the air flow is induced by a fan. In one embodiment, the speed of the fan is proportional to the energy created by one or more PV cells. In one embodiment, the air flow is reversible in order to heat the roof to remove snow, ice, and/or moisture. In another embodiment, the air flow is able to move air from a warmer section of the roof to a cooler section of the roof. In one embodiment, the system is operable (a) to generate electricity from the one or more photovoltaic cells and (b) to duct an induced or uninduced air flow to be heated and outputted to the heat exchanger during times of solar absorption or heat transmission by the modules.

In an aspect the present invention provides a method for simultaneously generating electricity and recovering thermal energy from a building surface, the method comprising inducing an airflow to pass through an air passage between a building surface and an under surface of a plurality of partially-overlapping modules that substantially cover the building surface; and collecting electrical energy from one or more photovoltaic cells present on an exposed surface of the modules utilizing wireless power transfer; wherein each module comprises an underlapping region and an exposed region, wherein the underlapping region is adapted to be substantially covered by the exposed region of an adjacent module when installed on a building surface and the exposed region is adapted to be substantially exposed when installed on a building surface; and an outer surface and an under surface, wherein the under surface of the underlapping region is profiled to define a pathway for air flow between the module and the building surface.

In an aspect, the present invention provides a method of manufacture of a roofing, cladding, or siding module on which a PV unit utilising wireless power transfer can be installed, the method comprising: providing to a continuous forming machine a feed material able to assume and retain a form after being moulded between a first forming surface and a second forming surface; allowing the formation to take place as such surfaces are advanced in the same direction; wherein the output is a roofing, cladding, or siding module comprising: an underlapping region and an exposed region, wherein the underlapping region is adapted to be substantially covered by the exposed region of an adjacent module when installed on a building surface; and an outer surface and an under surface, wherein the under surface of the underlapping region is profiled to define a pathway for air flow between the module and the building surface. Pressing forming, stamping or the like could be utilised alternatively.

In one embodiment, the feed material comprises a layer of a first material beneath a layer of a second material. In one embodiment, the first material is extruded to a supporting surface of a continuous forming machine, and the second material is extruded to the top surface of the feed of first material. In one embodiment, the exposed region comprises both materials, and the underlapping region comprises, at least in part, only one of the materials. In one embodiment, the axis of advancement of the materials in the continuous forming machine is commensurate with the longitudinal axis of the module as it lies with the longitudinal axis across the fall of a roof to be clad thereby.

In one embodiment the entire roofing, cladding or siding module is made from a single material.

In one embodiment the panel and/or module design features can be achieved by thermoforming, pressing, stamping or other method of forming, either continuously or discontinuously wood, metal, concrete, resins, glass, clay, composites, aluminium or the like. Continuous forming is preferred but not essential.

In an aspect, the present invention provides a method of manufacture of a roofing, cladding or siding on module on which PV unit utilising wireless power transfer can be installed, the method comprising: providing a feed material in liquid or viscous form to a mould in a moulding position; allowing the material to be moulded as a segment in the moulding position; advancing the moulded segment to a position subsequent to, yet partially overlapping the moulding position; providing further material in liquid or viscous form to the moulding position; allowing the material to be moulded as a further segment in the moulding position along with, or so as to adhere to, the overlapping section of the previously moulded segment; wherein the output is a roofing, cladding, or siding module comprising: an underlapping region and an exposed region, wherein the underlapping region is adapted to be substantially covered by the exposed region of an adjacent module when installed on a building surface; and an outer surface and an under surface, wherein the under surface of the underlapping region is profiled to define a pathway for air flow between the module and the building surface. In an alternative, roofing, cladding or siding could be pressed segmentally or segmentally injection moulded or roll-formed (not segmented) or individually pressed.

In an aspect, the invention relates to a PV unit utilising wireless power transfer for installation a roofing, cladding, or siding module having (i) a region to underlap a like or other module and (ii) a region to overlap a like or other module; wherein the overlap region has on, or at least towards, its upper surface serially formed zones of three dimensional features, such zones being of polymeric material(s) provided as a continuum for that module's zones.

In some embodiments, the polymeric material is a layer over at least one underlying layer of polymeric material(s). One or other of the polymeric materials may include a thermally conductive inclusion. In one embodiment, each such zone of three dimensional features of an overlap region and a corresponding part of an underlap region is formed simultaneously. In one embodiment, the same polymeric material(s) provides each said zone and at least part of the underlap region.

In one embodiment, each region to underlap and each region to overlap are three dimensionally contoured. Such contouring can be through to the under surface to provide for compatibility in overlap indexing. In one embodiment, the overlap region on its upper surface is both dimensionally contoured for aesthetic purposes and provided with zones of features for solar related functionality purposes, e.g. features for association with photovoltaics. In one embodiment, such zones of three dimensional features are mutually juxtaposed or at least mutually close.

In an aspect, the invention relates to a PV unit utilising wireless power transfer for installation on a building integrated solar energy recovery system, the system comprising, including or using a roofing, cladding or siding of modules or the equivalent ("modules") partially overlapping their adjacent modules down and/or across a building surface yet to collect in sunlight either, or both, (a) heat solar energy as heat at least in part to pass to an underlying air flow, and/or (b) to generate electricity photovoltaically for outputting and consequential heat at least in part to pass to said underlying air flow. In one embodiment, the modules, as installed on the building surface, with profile features of each module, provide an underlying pathway for an airflow to be heated by solar energy absorption and/or transmission through said modules. In one embodiment, as part of the cladding array, photovoltaic devices or functionality included and/or carried by a region or regions of any one or more module are not overlapped by an adjacent module.

In an aspect, the invention relates to a PV unit utilising wireless power transfer for installation on a building integrated solar energy recovery system to either or simultaneously: (a) generate electricity from the photovoltaic array of shingles with a photovoltaic functionality; and/or (b) duct heated air (e.g. for heat transfer purposes) from an induced or uninduced air flow under one or more roofing, cladding or siding modules during times of solar absorption and/or heat transmission by the modules.

In an aspect, the invention relates to a on PV unit utilising wireless power transfer for installation on a roofing, cladding or siding component suitable or installed to pass solar energy received by at least some of its regions into an underlying airstream, and with a photovoltaic regional functionality with a photovoltaic receiving region to convert received solar energy into an electrical output. In one embodiment, when as part or as part of a series down or across an underlying building surface, is useable whereby each photovoltaic receiving region is fully exposed despite partial overlapping of one component to another to better shed water; and is useable whereby, despite attachment to the underlying building surface, there is a set out from the underlying building surface sufficient to allow a passage of an underlying airstream.

In some embodiments, at least part of the profile of each roofing component has been moulded (i) by a CFT (as herein defined); and/or (ii) to accommodate a photovoltaic functionality; and/or (iii) to accommodate interconnection functionalities of photovoltaic areas; and/or to define at least in part said configuration; and/or (iv) to be very much greater in dimension across the building surface to be covered than the dimension it will cover down said building surface; or (v) to be very much greater in dimension down the building surface to be covered than the dimension it will cover across said building surface.

In some embodiments, the dimension of the module in the direction that extends across the building surface is at least 3 times, or at least 4 times, or at least 5 times, or at least 10 times, or at least 15 times, or at least 20 times that of the dimension of the module that extends down the building surface. In some embodiments, the dimension of the module in the direction that extends down the building surface is at least 3 times, or at least 4 times, or at least 5 times, or at least 10 times, or at least 15 times, or at least 20 times that of the dimension of the module that extends across the building surface.

In a further aspect, the invention relates to a PV unit utilising wireless power transfer for installation on a roofing, cladding or siding module or equivalent ("module") comprising or including a moulding of a first material and a second material; wherein the first material defines a first region or first regions ("first region(s)") and a second or second regions ("second region(s)"), whether profiled or not; and wherein the second material defines an overlay or underlay of at least part of one of said first and second regions; and wherein a plurality of said modules lapping their neighbour down or across a building surface with a notional or actual planar surface to be overclad by such a series of modules to form a weathertight seal over said building surface.

In a further aspect, the invention relates to a PV unit utilising wireless power transfer for installation on a roofing, cladding or siding assembly comprising or including a structure to provide a support surface, and a plurality of modules to cover the underlying support surface, the modules relating to any neighbour(s) in an overlapping arrangement down the fall or pitch of the underlying surface, thereby to define the exterior fall or pitch of the roofing, cladding or siding assembly; wherein at least some of the modules include photovoltaic ("PV") devices exposed to sunlight able to generate an electrical output; and wherein the plurality of modules define a pathway above the support surface for an air flow, induced or otherwise, to be heated by heat exchange from at least some of the modules as a consequence of heating of the modules by received sunlight or heating of the modules as a consequence of the effect of received sunlight on the PV devices, or both.

In a further aspect, the invention relates to a PV unit utilising wireless power transfer for installation on a roofing, cladding or siding assembly as herein described to either or simultaneously: (a) to generate electrical output from said PV devices; and/or (b) heat an induced or other air flow by heat exchange from at least some of the modules as a consequence of heating of the modules by received sunlight or heating of the modules as a consequence of the effect of received sunlight on the PV devices, or both.

In a further aspect the invention relates to a PV unit utilising wireless power transfer for installation on a roofing, cladding or siding component, or substrate therefor, which comprises or includes the steps of: providing to at least one of the forming surfaces of a continuous or discontinuous forming machine a feed of material able to assume and retain a form after being moulded between that first mentioned forming surface and a second forming surface, and allowing that formation to take place as such surfaces are advanced in the same direction; wherein the output is of a form having a profiled region to step out part of that region from an underlying actual or notional planar surface, yet providing another region to, at least in part, overlap said profiled region of a like form.

In a further aspect, the invention relates to a PV unit utilising wireless power transfer for installation on a roofing, cladding or siding component, or substrate therefor, which comprises or includes the steps of: providing material in liquid or viscous form to mould in a moulding position; allowing said material to be moulded as a segment in said moulding position; advancing said moulded segment to a position subsequent to, yet partially overlapping said moulding position; providing further material in liquid or viscous form to the moulding position; allowing said material to be moulded as a further segment in the moulding position along with, or so as to adhere to, the overlapping section of the previously moulded segment; wherein the output is of a form having a profiled region to step out part of that region from an underlying actual or notional planar surface, yet providing another region to, at least in part, overlap said profiled region of a like form.

In a further aspect, the invention provides a method of manufacture of a roofing, cladding or siding component, or substrate therefor on which PV unit utilising wireless power transfer can be installed, which comprises or includes the steps of: (1) extruding or otherwise providing a feed of a first material to a supporting surface of a continuous forming machine, the feed having a width WI and thickness TI; (2) extruding or otherwise providing a feed of a second material to the top surface of the feed of first material, the feed having a width WII and thickness TII; (3) allowing the two materials to be formed; and wherein the output is of a form having a first profiled region to step out part of that region from an underlying actual or notional planar surface, yet providing a second region to, at least in part, overlap said profiled region of a like form; and wherein said second region is covered by both materials, and said profiled region is covered, at least in part, by only one of the materials. In one embodiment, the axis of advancement of the materials in the continuous forming machine is commensurate with the longitudinal axis of a roofing shingle that is to lie with said longitudinal axis across the fall of a roof to be clad thereby.

In a further aspect, the invention relates to a on PV unit utilising wireless power transfer for installation on a roofing, cladding or siding component, or substrate of a roofing, cladding or siding component including product having a first region and a second region, the component to be used as a covering across the fall of a building structure and to overlap at least in part with its first region, and to underlap at least in part with its second region, the first and second regions of a like component or substrate; wherein the component has been formed by a feed of materials into a continuous forming machine to profile at least one or either, or both, of the first and second regions or at least parts thereof; and wherein the advance direction of the continuous forming machine defines the elongate axis of the component that is to lie across the fall of the building surface.

In another aspect, the invention relates to a PV unit utilising wireless power transfer for installation on a roofing, cladding or siding module adapted to be fixed with its elongate axis across the fall of the building surface to be clad; the module having a first longitudinal region to underlie, in use, a like module or flashing, and a second longitudinal region, in use, to overlie a like module or to simply be exposed; wherein the first and second regions share in common a first material; and wherein the first and second regions share in common a second material, yet the second region has its upper surface defined by a second material while only part of the first region (i.e. that part of the first region proximate to the second region) has its upper surface defined by said second material; and wherein there has been such sharing of the first and second materials since a continuous forming process; and wherein one, some or all of the following apply: (i) at least the underside of the first region defines a profile of projections (e.g. mesa-like or otherwise) to stand the remainder of the first region off from an actual support or notional support plane; (ii) such projections define a tortuous pathway above the actual or notional plane; (iii) the topside of the first region, with depressions, provide a female version of the male underside; (iv) the second material is weather resistant; (v) the first material has been foamed; (vi) the first material includes particulate thermally conductive inclusion; (vii) the second material can self seal to a penetrative fastener; (viii) the first material is a polymeric material, the second material is a polymeric material, at least the upper surface of the second region has been profiled; (ix) the upper surface of the second region has been profiled to simulate conventional roofing products (e.g. tiles, slate, shingles shakes or the like); (x) the upper surface of the second region channels, pockets or the like to accommodate or accommodating the buses and/or cells of a photovoltaic array; (xi) the first and second materials have been coextruded or serially extruded into a continuous forming machine; and (xii) the extrusion has been into an advancing continuous forming machine where the elongate axis is aligned to the advancement.

In a further aspect, the invention relates to a PV unit utilising wireless power transfer for installation on a roofing shingle, tile or equivalent module ("shingle") substantially as herein described, with or without reference to the accompanying drawings.

In a further aspect, the invention relates to a PV unit utilising wireless power transfer for installation on a roof assembly substantially as herein described, with or without reference to the accompanying drawings.

In a further aspect, the invention relates to a PV unit utilising wireless power transfer for installation on a building integrated solar energy recovery system substantially as herein described, with or without reference to the accompanying drawings.

In a further aspect, the invention relates to a PV unit utilising wireless power transfer for installation on a roof clad by roofing components of any aspect of the present invention.

In a further aspect, the invention relates to a PV unit utilising wireless power transfer for installation on a building surface clad by cladding or siding components of any aspect of the present invention.

Cooling of the roof, PV cell and/or inverter using airflow channels can increase efficiency and/or life span.

One or more embodiments of the invention, advantageously provide one or more of:

A PV system, and PV units and/or related procedures, methods, subassemblies and the like which will at least avoid the challenge of such weathering or other environmental degradation, the connection of PV units into an electricity reticulation system, the provision of a PV system, and PV units and/or related procedures, methods, subassemblies and the like which have an improved means of electrical connection on installation the provision of a PV system, and PV units and/or related procedures, methods, subassemblies and the like which have a reduced balance of system cost through reduction of cables and sharing of componentry.

the provision of a PV system, and PV units and/or related procedures, methods, subassemblies and the like which have a finer level of control for enhanced system optimization for power output, safety, and monitoring.

the provision of a PV system, and PV units and/or related procedures, methods, subassemblies and the like which have reduced material wear due to thermal-stabilizing attributes embodied in the design.

the provision of a PV system, and PV units and/or related procedures, methods, subassemblies and the like which have extended-life components It is therefore a further or alternative object or advantage of the present invention to at least provide the public with a useful choice.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

Further aspects and advantages of the present invention will become apparent from the ensuing description which is given by way of example only.

As used herein the term "and/or" means "and" or "or", or both.

As used herein "(s)" following a noun means the plural and/or singular forms of the noun.

The term "comprising" as used in this specification means "consisting at least in part of". When interpreting statements in this specification which include that term, the features, prefaced by that term in each statement, all need to be present but other features can also be present. Related terms such as "comprise" and "comprised" are to be interpreted in the same manner.

As used herein the term "object" denotes a possible purpose or utility for the invention described but such a purpose or utility need not be construed as a mandatory feature of the invention.

The term "PV unit" includes photovoltaic or photoelectric wafers, sails, cells, arrays and modules (themselves generally termed "cells"), as single items and/or multiple groupings of such items, and assemblies and/or subassemblies comprising any or all of these items or groupings of items.

The term "wireless power transfer" (also termed "AC coupling") includes power transfer by inductive coupling, resonant inductive coupling, capacitive coupling and all other methods of wireless energy/power transfer.

The term "wireless power transfer" and "wireless energy transfer" can be used interchangeably in a general sense to denote transfer via some type of AC or other wireless coupling (such as inductive and/or capacitive coupling).

Relative terms, such as "lower" or "bottom", "upper" or "top," and "front" or "back" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, the term "formed surface" refers to a moulded segment of a polymeric material corresponding to an individual dye or mold of a continuous forming machine, or any other polymer, metal, composite, wood, concrete, resin, glass, clay, aluminium or the like that is pressed, formed, stamped, moulded or the like, either segmentally or continuously formed.

As used herein, the term "building surface" refers to a wall surface or a top surface, etc. of a building, e.g. an exterior wall, a roof, a ceiling, etc., unless otherwise specified. In the context of a roof, the building surface typically comprises a waterproof roofing membrane attached to the roof deck adjacent an eave of the roof for preventing water damage to the roof deck and an interior of a building from wind-blown rain or water buildup on the roof. The roof deck is typically made of an underlying material, such as plywood. The waterproof membrane may be any of a number of waterproof roofing membranes known in the art such as but not limited to bituminous waterproof membranes, modified bituminous roofing membranes, self-adhering roofing membranes, or single ply waterproofing roofing membranes (e.g. EPDM waterproof roofing membranes, PVC waterproof roofing membranes, TPO waterproof roofing membranes). One exemplary membrane sheet is Deck-Armor™ Roof Protection, manufactured by GAF Corp., Wayne, N.J.

As used herein, the term "roofing" means the provision of a protective covering on the roof surface of a building. Without limitation, such a protective covering might take the form of shingles, tiles, panels, shakes, planks, boards, modules, mouldings or sheets.

As used herein, the terms "cladding" and/or "siding" mean the provision of a protective covering on a side or other surface of a building. Without limitation, such a protective covering might take the form of shingles, tiles, panels, shakes, planks, boards, modules, mouldings or sheets.

As used herein, the terms "profiled" and/or "contoured" mean having a region, or regions which extend above or below a notional planar surface lying along the longitudinal axis of the product. This includes profiling or contouring of only one upper or lower surface, and/or profiling or contouring of an entire thickness of material such that the upper and lower surfaces have the same relative degree of extension above or below the notional planar surface.

As used herein, the term "thermally conductive particles" or "thermally conductive inclusions" refers to particles or inclusions of any conductive material. These include, but are not limited to, particles of the following materials: metals, metal hybrids, carbon, silica, glass, conductive polymers, salts, carbon nanotubes and compounds of these substances. In addition to assisting in heat transfer, the thermally conductive particles (such as paste) or inclusions may also act as a reinforcing material.

As used herein, the term "polymer" (and associated terms such as "polymeric") includes polymers, polymer blends, and polymers with or without additive inclusions.

The panel, cladding, siding described in the specification has an external surface that can be exposed to sunlight.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

The invention consists in the foregoing and also envisages constructions of which the following gives examples only.

The entire disclosures of all applications, patents and publications, cited above and below, if any, are hereby incorporated by reference.

BRIEF DESCRIPTION OF THE DRAWINGS

Preferred embodiments of the invention will be described by way of example only and with reference to the drawings, in which:

FIG. 31B shows a module surface (as seen in FIG. 31A) with a series of fine ribs integral to the moulding so as to increase the module's contact surface with the air stream and assist heat transfer.

Figure 71:
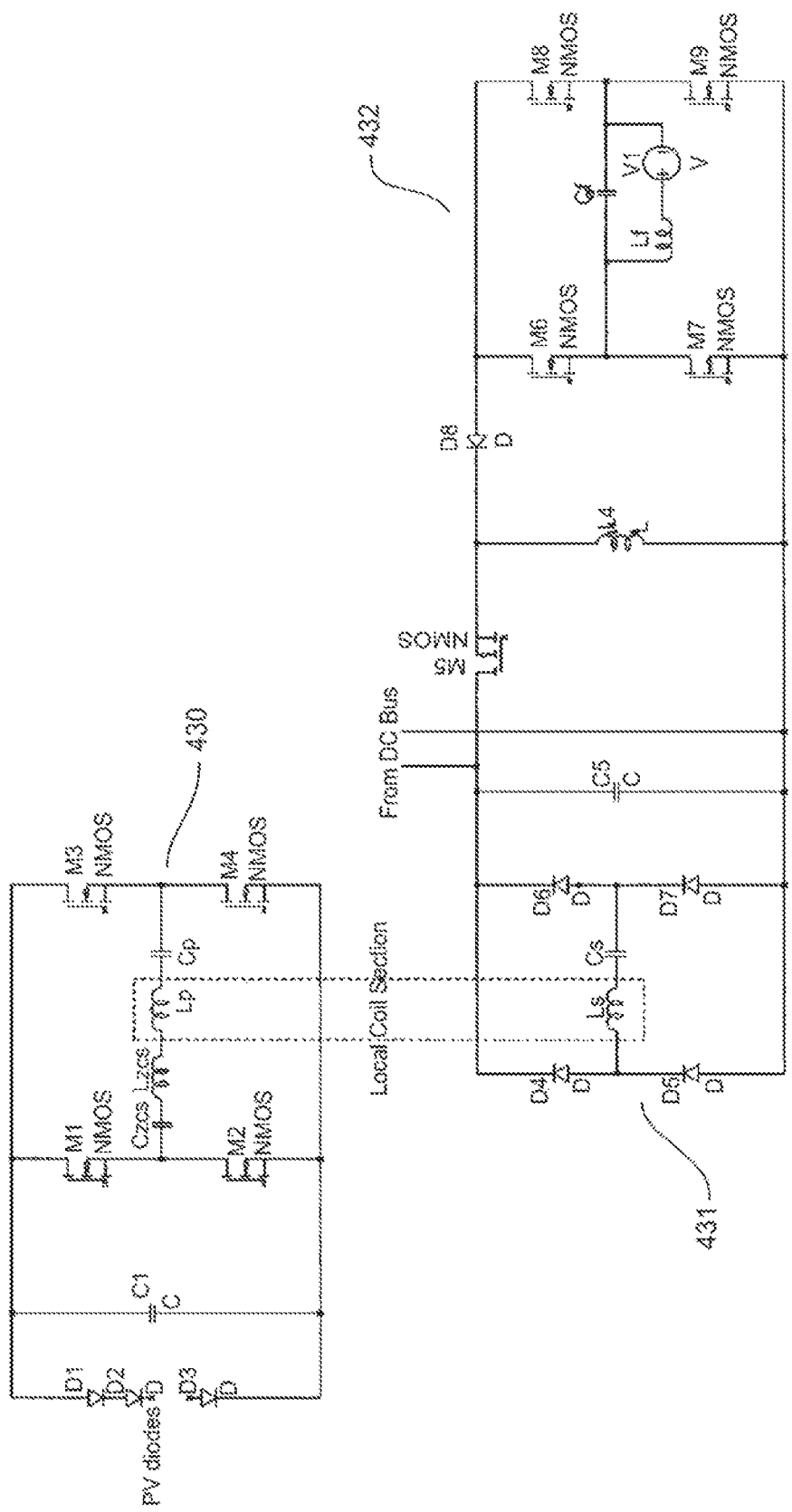

The FIG. 71 shows where the DC bus input is routed to in the circuit.

DETAILED DESCRIPTION OF THE PREFERRED EMBODIMENTS

Figure 1:
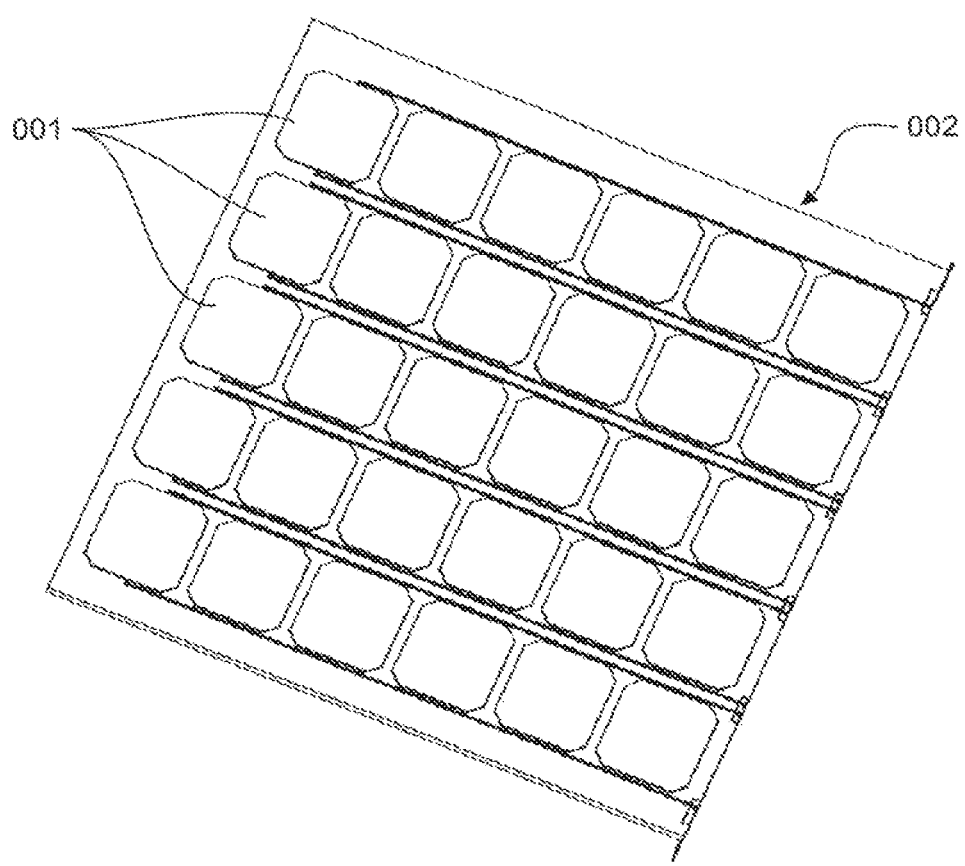
FIG. 1 shows a typical glass solar panel carrying photovoltaic cells and having a series of inductive power transfer zones down one side of the panel.
Figure 2:
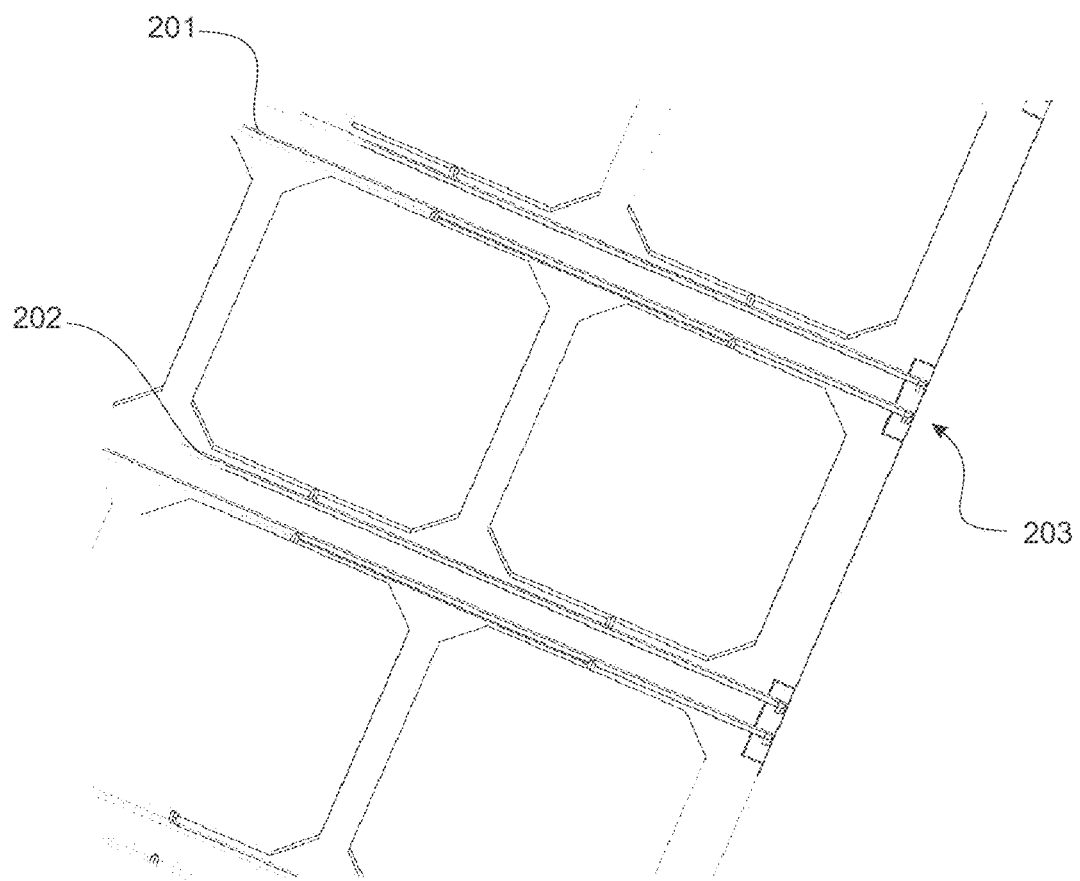
FIG. 2 is a close up view of the cells shown in FIG. 1.

A first embodiment of the invention is shown in FIG. 1 wherein an array of solar (PV) cells 001 are mounted on a typical glass solar panel 002 and wired in parallel to pairs of positive 201 and negative 202 cables running across the width of the panel (as can been seen more clearly in FIG. 2). Together they form a PV unit and generate electrical/power output (such as output voltage and/or current) at e.g. the right hand end of each cable there is a wireless power transfer (e.g. inductive and/or capacitive) transmission device (transmitter) 203 which may or may not be recessed or encapsulated into the glass. There may be a separate transmission device for each cable, or they may be shared as shown in FIG. 2. The transmitter can transmit power to a reciprocal receiver on a load and/or output conductor.

Figure 3:
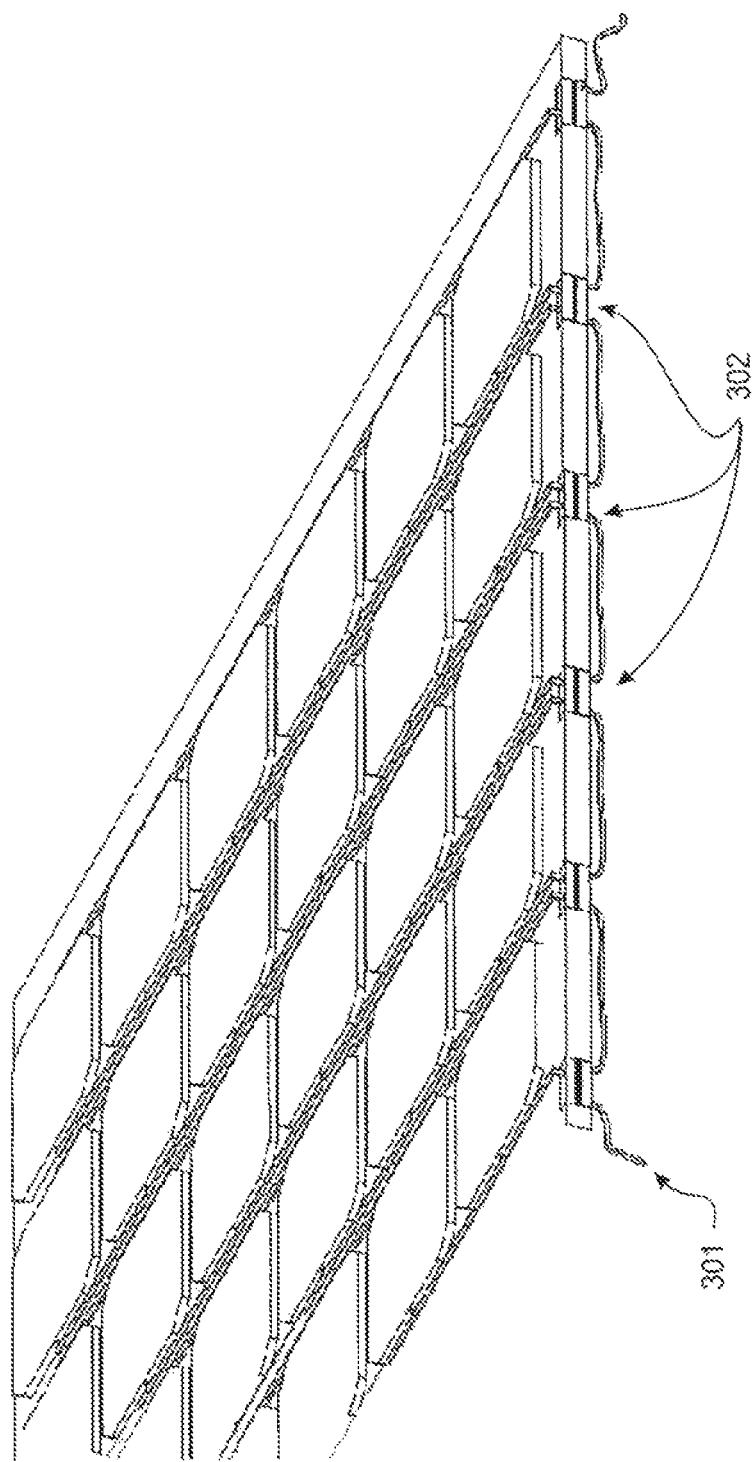
FIG. 3 is a view of the solar panel of FIGS. 1 and 2 showing the main power take off cable running down the underside of the panel.

For example, a main power take off cable/conductor (which can connect to a load) 301 runs on the underside of the panel in the vertical direction, and there are respective/ reciprocal wireless power transfer (e.g. inductive and/or capacitive) receiving devices or means (receiver) 302 spaced at intervals along this cable. This can be seen in FIG. 3. The transmitter 203 and receiver 302 work co-operatively to provide wireless power transfer. The takeoff cable can be installed prior to the solar panel and connected as required to other devices which will eventually draw power from the solar module/panel.

When the solar panel is installed (for example on a roof or other exterior building surface) all that is required is to align the transmission device(s) 401 with the receiving device(s) 402. Because there does not need to be direct physical contact between the transmission device and the receiving device, the transmission device 401 can be housed within a recess 403 integral to the form of the glass panel as shown in FIG. 5. Similarly there may be features or markers in the underside of the panel 404 to house the receivers on installation and to assist in locating them correctly.

Housing the transmitting and receiving components in recesses also protects them from weathering, abrasion and impact, and will help to reduce the instance of failure of the power generation system at the electrical connection points. It may be that the transmission device and associated components are completely concealed within the substrate for this purpose.

Figure 4:
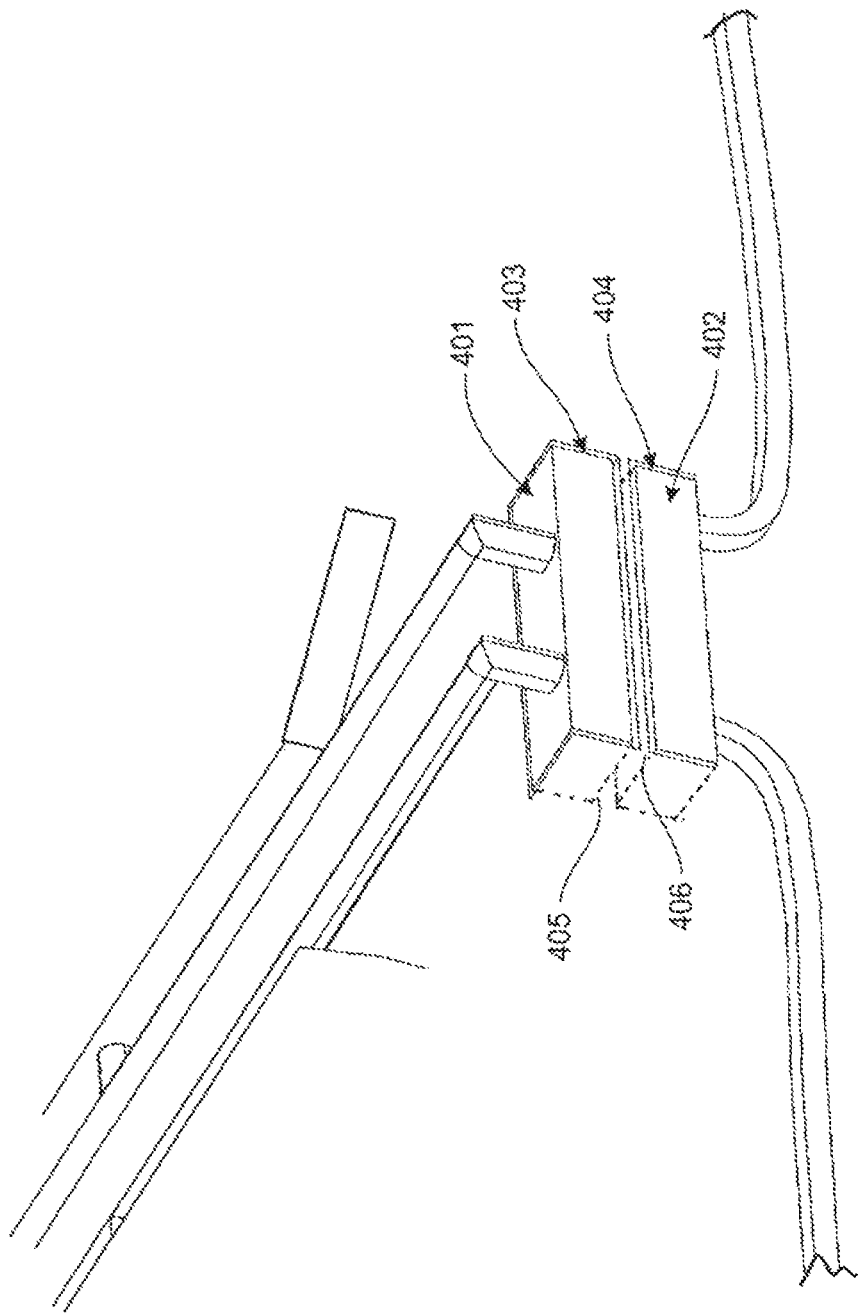
FIG. 4 shows a sectional view of some preferred components as arranged to achieve inductive power transfer of the energy produced by a PV cell.

The surfaces of the transmission device 405 and the receiving device 406 should be positioned in close proximity to one another, for example, as shown in FIG. 4. This means that no electrical connections need be made once the system components are in position, and also that a small degree of misalignment and/or non-contact at the electrical connection points can be tolerated.

The components of the transmission device itself may take a number of forms depending on the wireless power transfer method employed, as will the form of the receiving device; however in one embodiment both the transmitter and receiver are coils or pads which together form an inductive or capacitive coupling. In capacitive coupling, the transmitter and receiver together form a capacitor. Each, for example, may take the form of a respective capacitor plate.

Where the transmitter and receiver are pads or plates, microscopic and/or nanoscopic or other surface texturing can be applied to the pad surfaces (for example surfaces 405 and 406) to increase the surface area of the pad or plate, and therefore aid in the efficiency and/or rate of wireless power transfer. In one embodiment the surfaces may be patterned or profiled with a high ratio aspect pattern (for example, by a series of finely pointed peaks).

A device, possibly an intermittent switching device, may be required to convert the direct current output from the solar cells to alternating current prior to transmission through the coupling.

Figure 5A:
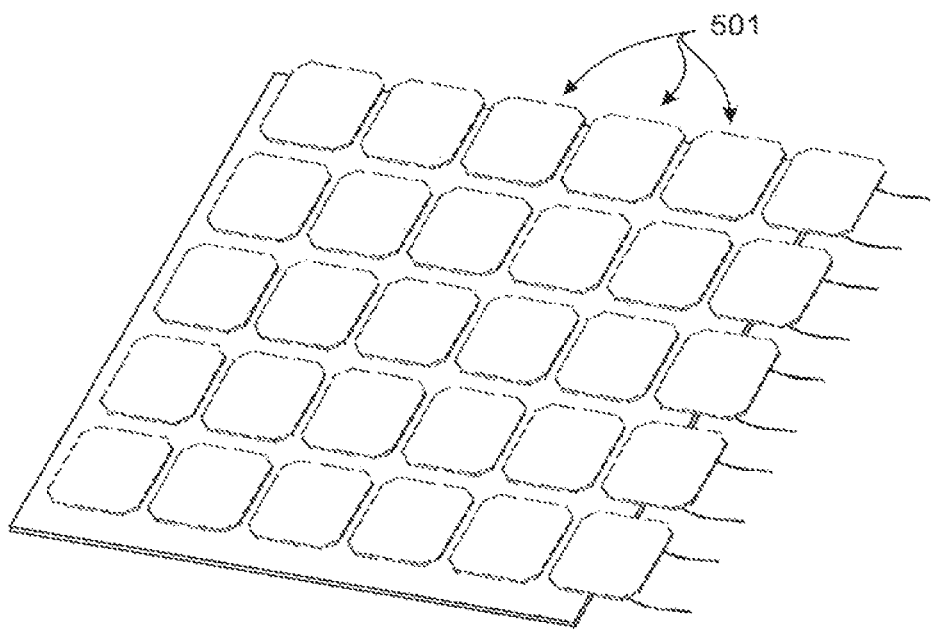
FIG. 5A shows a glass solar panel carrying photovoltaic cells, each of which is connected to a power generation and output system by two inductive power transfer zones.
Figure 5B:
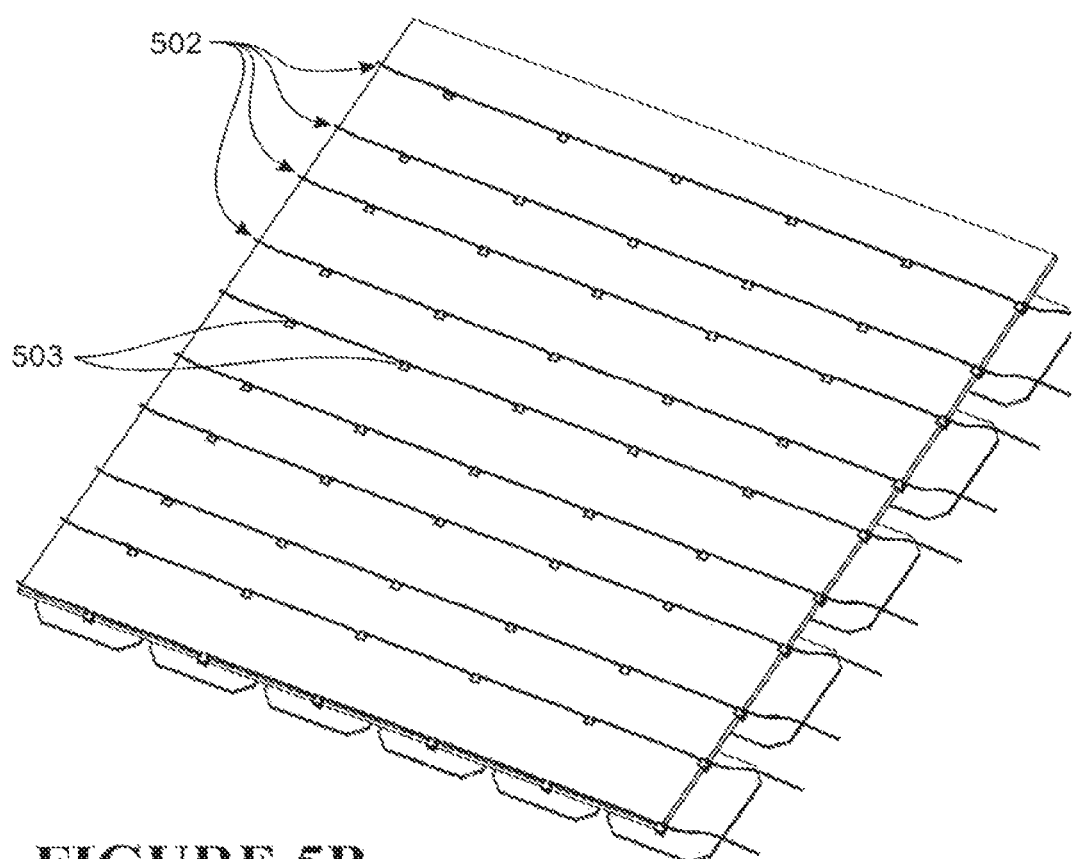
FIG. 5B shows the reverse side of the panel shown in FIG. 5A.

A second arrangement is as shown in FIGS. 5A and 5B, wherein there is an array of solar (PV) cells 501, each having its own wireless power transfer means. In this arrangement there are a networked series of power-takeoff cables 502 running across the solar array. There may be one or more wireless power transfer zones (e.g. inductive and/or capacitive) 503 on each cell depending on the wiring configuration. The connection density should be selected according to the useful power output requirements of the system.

Figure 6:
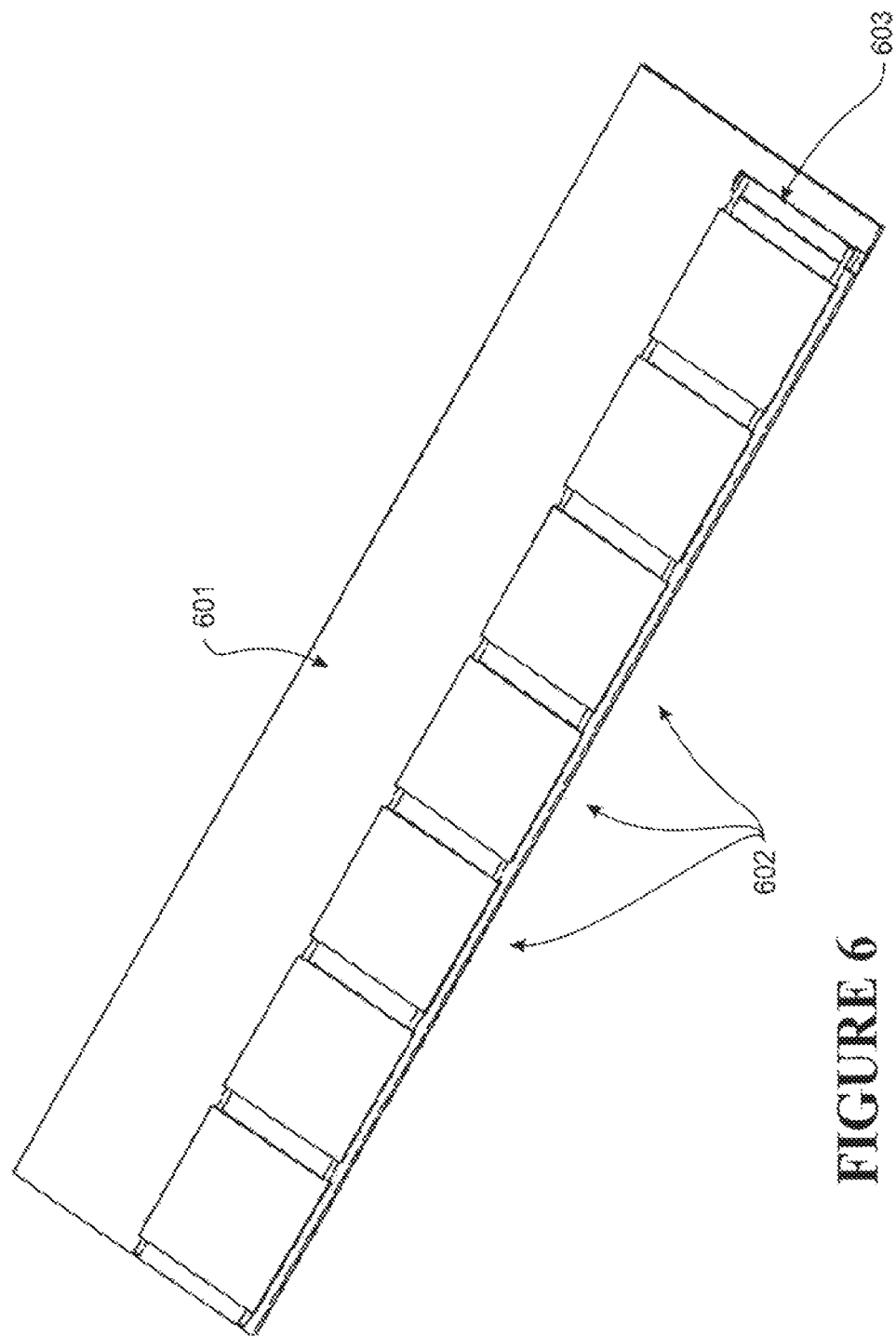
FIG. 6 shows a formed substrate carrying an array of PV cells, and having at one end a device for the inductive transfer of energy from the PV cells to a receiver able to receive the transmitted energy.

A further and preferred embodiment of a unit having a region able to be capacitively or inductively used to transfer output power from a PV device is as shown in FIG. 6. A formed substrate panel 601, of the sort which can be mounted on the roof top of a building, bears a plurality of photovoltaic cells 602 which are electrically connected to a single output terminal at one side of the panel. At the output terminal there is a device for inductive or capacitive power transfer 603 to a receiving conductor.

The substrate panel, or a series of such panels, can then be installed upon a roof or other surface exposed to solar energy, along with one or more wireless transfer power receiver(s). The receiver(s) are in turn connected to a power distribution network so that the electrical energy can be directed as required.

Figure 7:
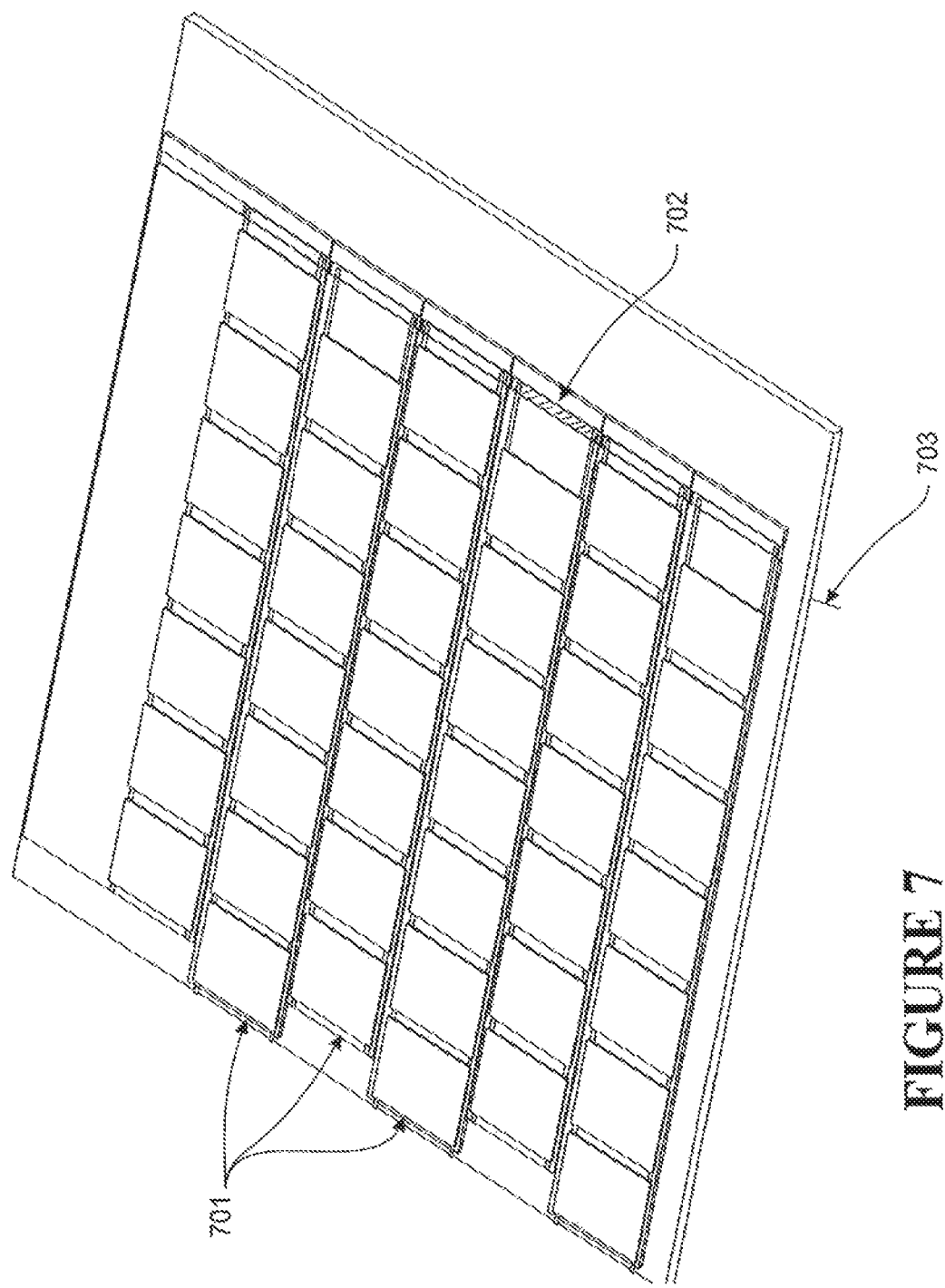
FIG. 7 shows a series of formed substrate panels, each carrying an array of PV cells and each having at one end a device for inductive power transfer, as assembled on a roof top, each inductively connected to a main reticulation bus running down the edge of the roof.

The preferred method of assembly for a power generation system incorporating the photovoltaic unit described is shown in FIG. 7, wherein a number of substrate panels 701 are fixed down the fall of a roof. Each panel has, at e.g. its right hand end, a device 702 for wireless power transfer of the energy collected by the solar cells mounted upon it to a single output 703.

Figure 8:
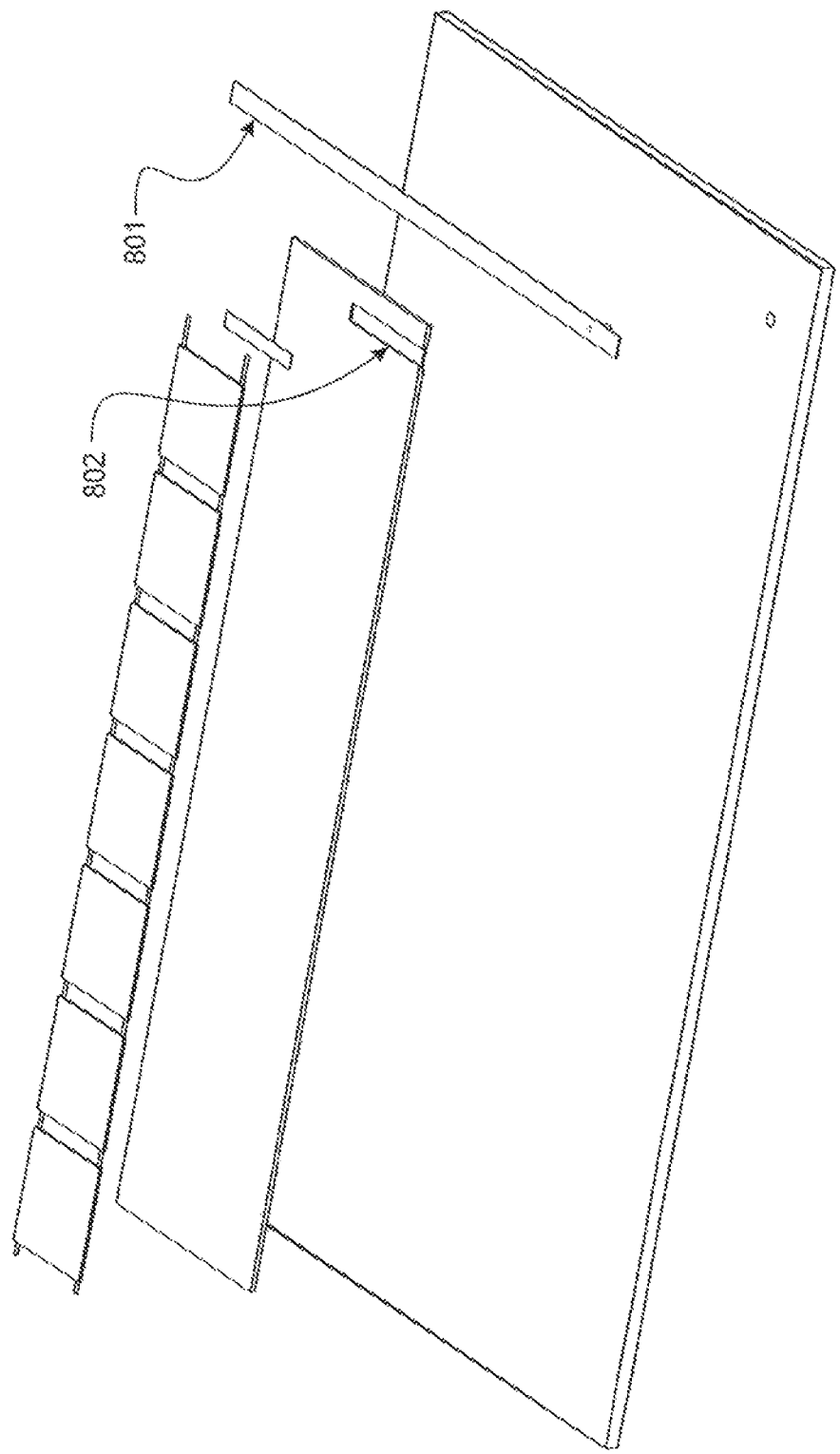
FIG. 8 is an exploded view of FIG. 7.

FIG. 8 is an exploded view of the assembly of FIG. 7, which shows that running down the e.g. right hand side of the fall of the roof, but underlying the panels, is a main electrical bus strip 801. The bus strip (by itself or by way of connected receiver devices) is able to receive the energy transmitted by the wireless power transfer devices on each of the substrate panels. The energy is then distributed, via the bus strip, as useful electrical output.

The positioning of the receivers (if any) along the bus strip can be calculated before the bus strip is installed on the roof. Subsequently the panels can be affixed onto the roof so that the corresponding transmission zones and receiving zones are aligned. The substrate panel moulding may also have features 802 to aid in the location of the transmitter respective to the receiver.

Figure 9:
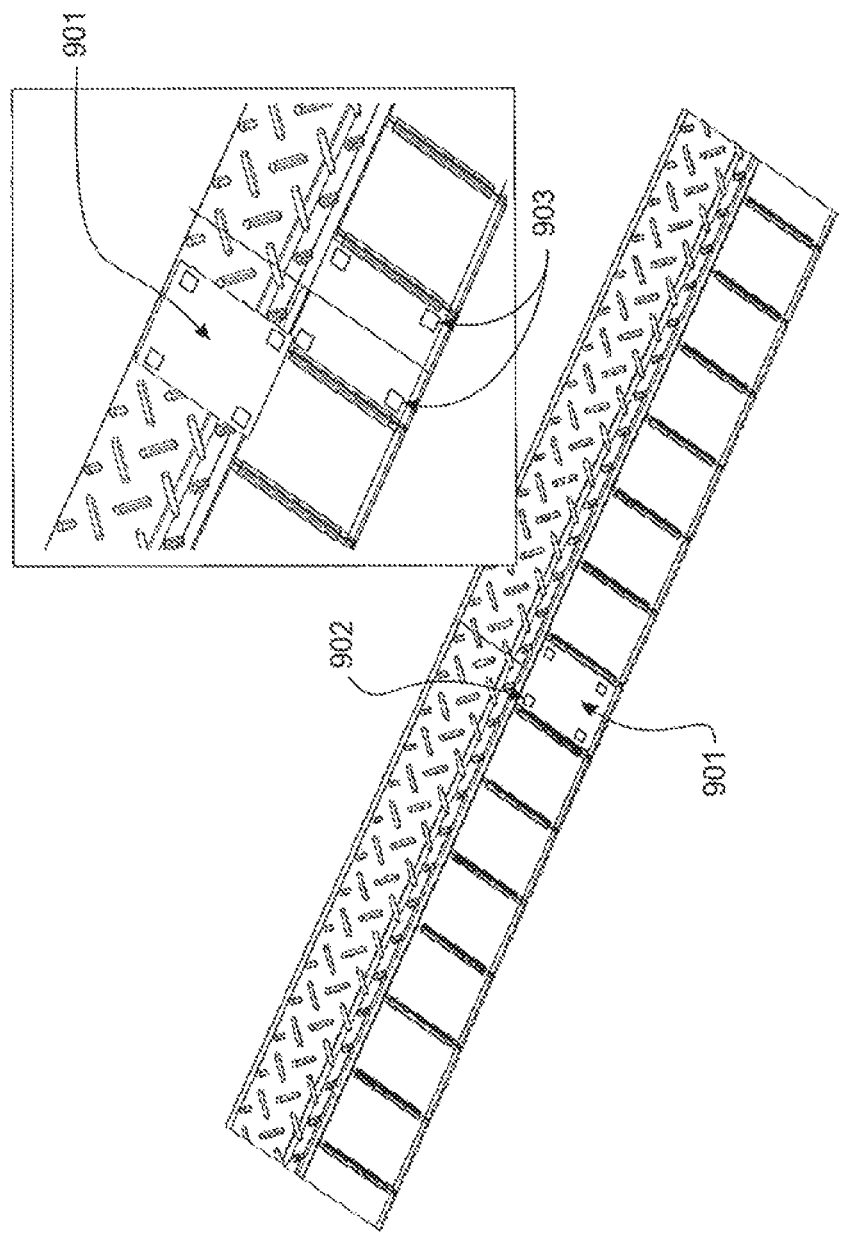
FIG. 9 shows one embodiment whereby two PV modules are electrically connected with an inductive connection.

As discussed, it is also particularly advantageous to be able to wirelessly (e.g. inductively and/or capacitively) make connections between adjacent PV units as they are installed on a roof or building surface. It is possible to do this by providing corresponding transmitting and receiving regions on each adjacent module and then installing the modules so that the transmitter and receiver regions are overlaid. The embodiment shown in FIG. 9 gives an example of how wireless joining of adjacent modules can be achieved by laying a connector cell 901 over top of the join between the modules that two or more power transfer regions 902 of the connector cell are in close proximity to one or more power transfer regions of the each of the modules. The connector cell may be a functional solar cell, or may just be a cell without PV functionality which merely serves as a conductor. Concealing the joint between the modules with the connector cell can be an aesthetic improvement compared to installing a series or array of modules with visible join lines between them. Individual PV cells of a PV unit can also be coupled by wireless power transfer to produce output. Cooling is also provided, as described below.

Figure 10:
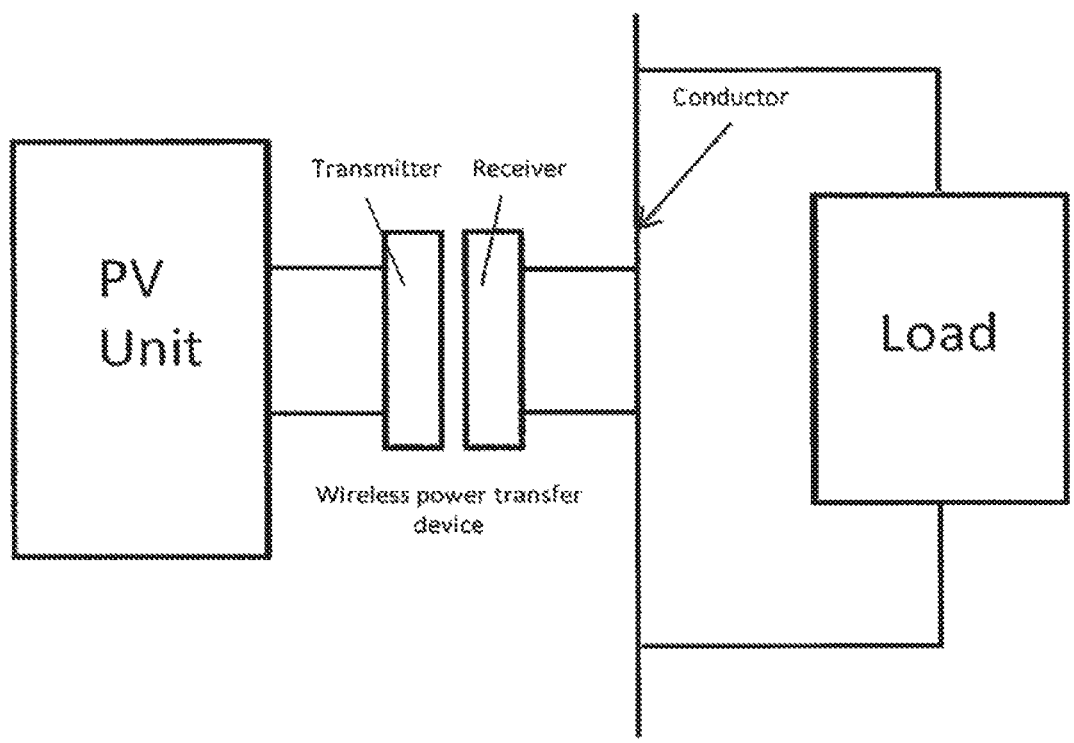
FIG. 10 shows in schematic form the electrical arrangement of a PV unit with wireless power transfer.

FIG. 10 shows in schematic form the invention. A PV unit is coupled to a wireless power transfer transmitter (e.g. inductor coil or capacitor plate) which is inductive and/or capacitively coupled to a reciprocal wireless power transfer receiver (e.g. conductor coil or capacitor plate) which itself is coupled to a load directly or via an output conductor.

In one embodiment, the PV system/unit described can be installed on a BIPV roofing system/product as described below.

In some embodiments, the roofing product comprises modules having a plurality of formed surfaces moulded from one or more polymeric materials (which may be in layers), wherein each of the formed surfaces comprises three dimensional surface features. As a cladding or roofing panel it could be metal pressed element (panels) for outside a building, whether a 3 dimensional (e.g. undulating) surface or not). The solar cell (PV) can be glued or laminated onto a surface of e.g. a pressed metal panel. The present technology also relates to a product having good thermal conductivity and a capacity for photovoltaic ("PV") and/or solar thermal energy generation, and related subassemblies, assemblies, uses and methods. The present technology has several advantages. For example, the roofing, cladding or siding product may reduce the amount of heat energy transferred to the interior of the building upon which it is mounted; and/or to provide a system which incorporates a roofing, cladding or siding product to that effect; and/or to provide a method by which mass production of such a product could be achieved; or at least provides the public with a useful choice.

In embodiments a Building Integrated Photovoltaic ("BIPV") and/or solar thermal roofing, cladding or siding product is provided which is reasonably light weight, easy to install, durable and resistant to environmental wear; or at least provides the public with a useful choice.

In other embodiments, a BIPV and/or solar thermal roofing, cladding or siding product is provided that does not require a fastener (nail, screw, bolt, etc.) to penetrate the exposed surfaces of the roof, thereby making the product less likely to leak compared to convention BIPV products; or at least provides the public with a useful choice.

In other embodiments, a BIPV and/or solar thermal roofing, cladding or siding product is provided capable of large surface area coverage, that can be mass produced in high volumes and with reasonable speed of production; and/or to provide a method by which mass production of such a product could be achieved; or at least provides the public with a useful choice.

In other embodiments, a BIPV and/or solar thermal roofing, cladding or siding product is provided which will allow heat energy to be transferred away from the photovoltaic cell to maximise its operational efficiency; and/or to provide a system which incorporates a BIPV roofing, cladding or siding product to that effect; and/or to provide a method by which mass production of such a product could be achieved; or at least provides the public with a useful choice.

In other embodiments, an airway path is provided to allow space for wires and other electrical components to run between the roof and the building structure with such wires and electrical components located above a waterproof membrane on the building substrate surface therefore ensuring that the waterproof membrane is not penetrated.

In yet other embodiments, a building integrated system is provided which allows solar, ambient and photovoltaically generated heat to be transferred away from a building surface and used elsewhere; and/or the components of such a system; and/or a method of manufacturing such components; or at least provides the public with a useful choice.

Various embodiments relate to a roofing, cladding or siding product to be secured to a building in a lapping arrangement. In one embodiment the product is formed as a module to be laid horizontally across a surface and lapped vertically down that surface, however, it is also possible to manufacture the product so as to allow it to be laid in vertical columns which would then lap across the surface. In particular, three illustrative embodiments of the product are described below. The first is a module which can be used to form a weatherproof covering over top of a building surface; the second is a module which can, in additional to forming a weatherproof covering, be used as part of a thermal energy recovery system; and the third is a module which can, in addition to forming a weatherproof covering, and optionally in addition to being useful as part of a thermal energy recovery system, bears an array of solar cells to generate electrical energy.

In one aspect, a roofing, cladding or siding product is provided which is reasonably light weight, easy to install, durable and resistant to environmental wear. In some embodiments, the roofing, cladding or siding product is capable of large surface area coverage, can be mass produced in high volumes and with reasonable speed of production; and/or provides a method by which such mass production of such a product can be achieved.

In one embodiment, the roofing, cladding or siding product is a module comprising a plurality of formed surfaces moulded from one or more polymeric materials (which may be in layers), wherein each of the formed surfaces comprises three dimensional surface features, and wherein the formed surfaces are joined without weld lines or injection moulding points. Each formed surface refers to a moulded segment along the length of the module that corresponds to an individual dye or mold of a continuous forming machine. See PCT/NZ2006/000300 (published as WO2007/058548). Use of the term "joined" in this context is not intended to require that each of the formed surfaces were ever separated, i.e., the formed surfaces may be integrally formed together in situ during the manufacturing process. In another embodiment, the module design features can be achieved by thermoforming, pressing, or other method of forming, either continuously or discontinuously wood, metal, concrete, resins, glass, clay, aluminium composites or the like.

Figure 11:
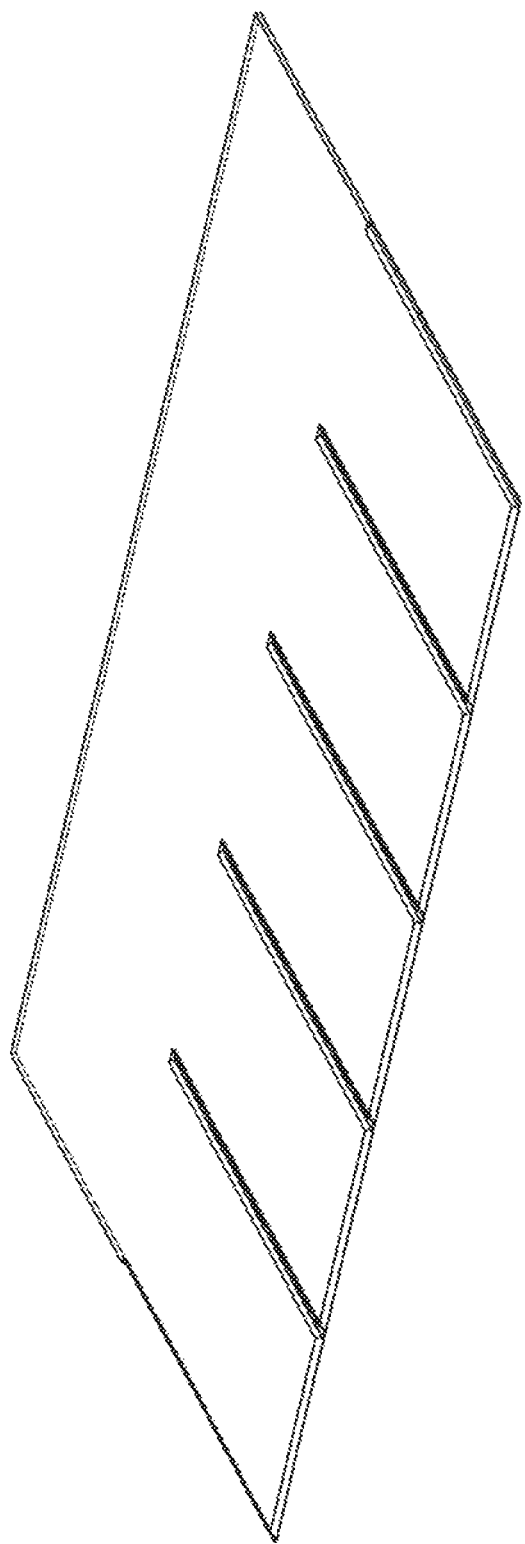
FIG. 11 shows an illustrative embodiment of a continuously formed roofing, cladding or siding module in its basic form.

In particular, the product can be manufactured in long strips (as seen in FIG. 11) by a continuous process which incorporates a continuous forming step, and therefore can be made in varying lengths as required depending on the required coverage area. Production is such that a single moulded module, capable of extending across the entire width or section of the roof or building to be protected, can be manufactured. For example, the modules may be very much greater in dimension across the building surface to be covered than the dimension it will cover down the building surface. In one embodiment, the dimension of the module in the direction that extends across the building surface is at least 3 times, or at least 4 times, or at least 5 times, or at least 10 times, or at least 15 times, or at least 20 times that of the dimension of the module that extends down the building surface. Alternatively, the modules may be very much greater in dimension down the building surface to be covered than the dimension it will cover across the building surface. In one embodiment, the dimension of the module in the direction that extends down the building surface is at least 3 times, or at least 4 times, or at least 5 times, or at least 10 times, or at least 15 times, or at least 20 times that of the dimension of the module that extends across the building surface.

Figure 12:
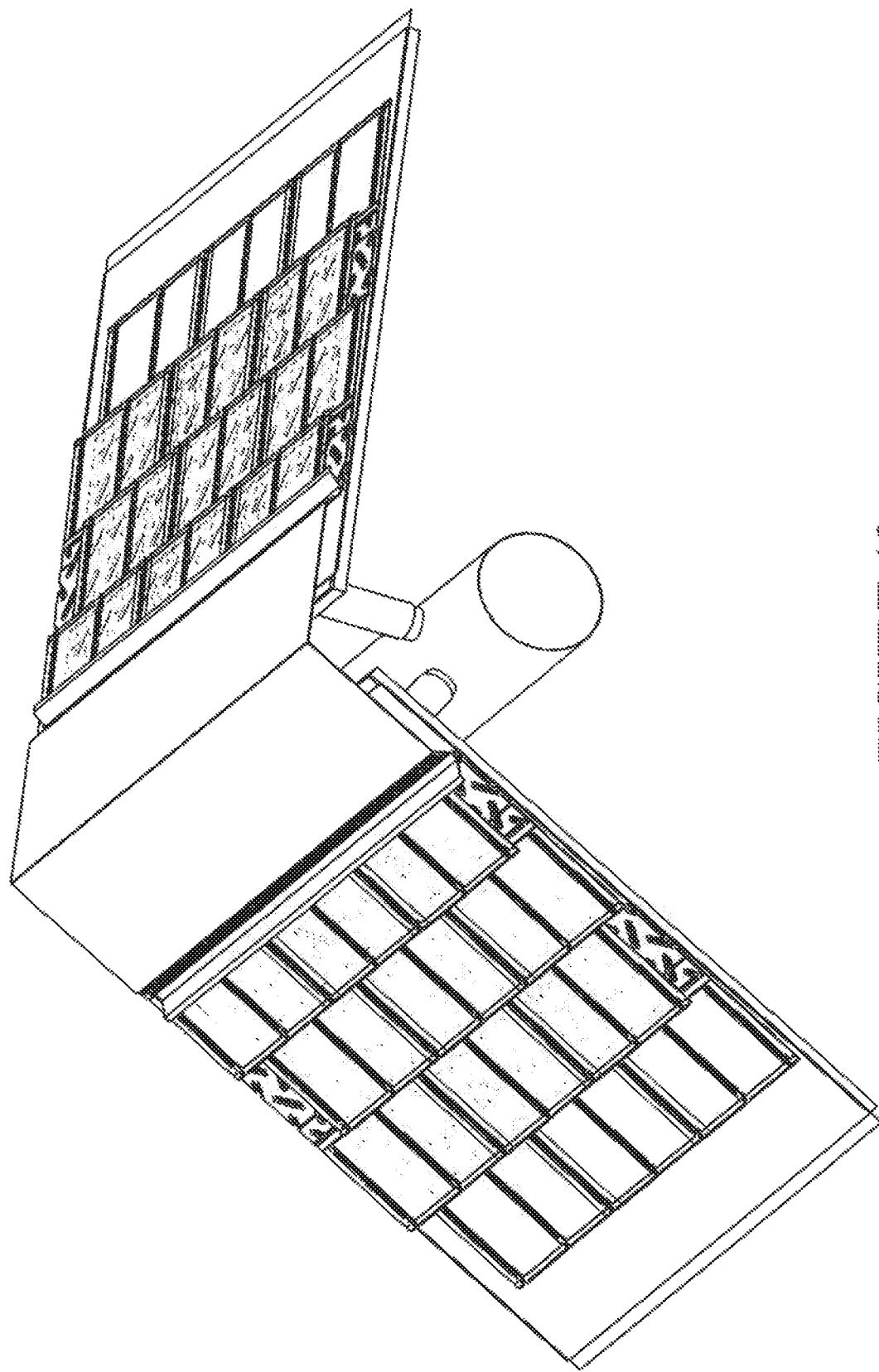
FIG. 12 shows an illustrative embodiment of a continuously formed roofing, cladding or siding module fixed in an overlapping arrangement upon a building surface.

In some embodiments, the modules are about 0.2-1 in length, 1-20 metres in length, about 3-10 metres in length, or about 4-8 metres in length, or 2-4 metres in length. Modules of 4-5 metres in length, and modules of 8 metres in length are suitable manufacturing sizes, but the manufacturing process allows custom lengths to be accommodated just as easily. A plurality of such modules can then be arranged in lapping rows down the surface of the structure, for example, as shown by the lapping roof shingles seen in FIG. 12.

Figure 13:
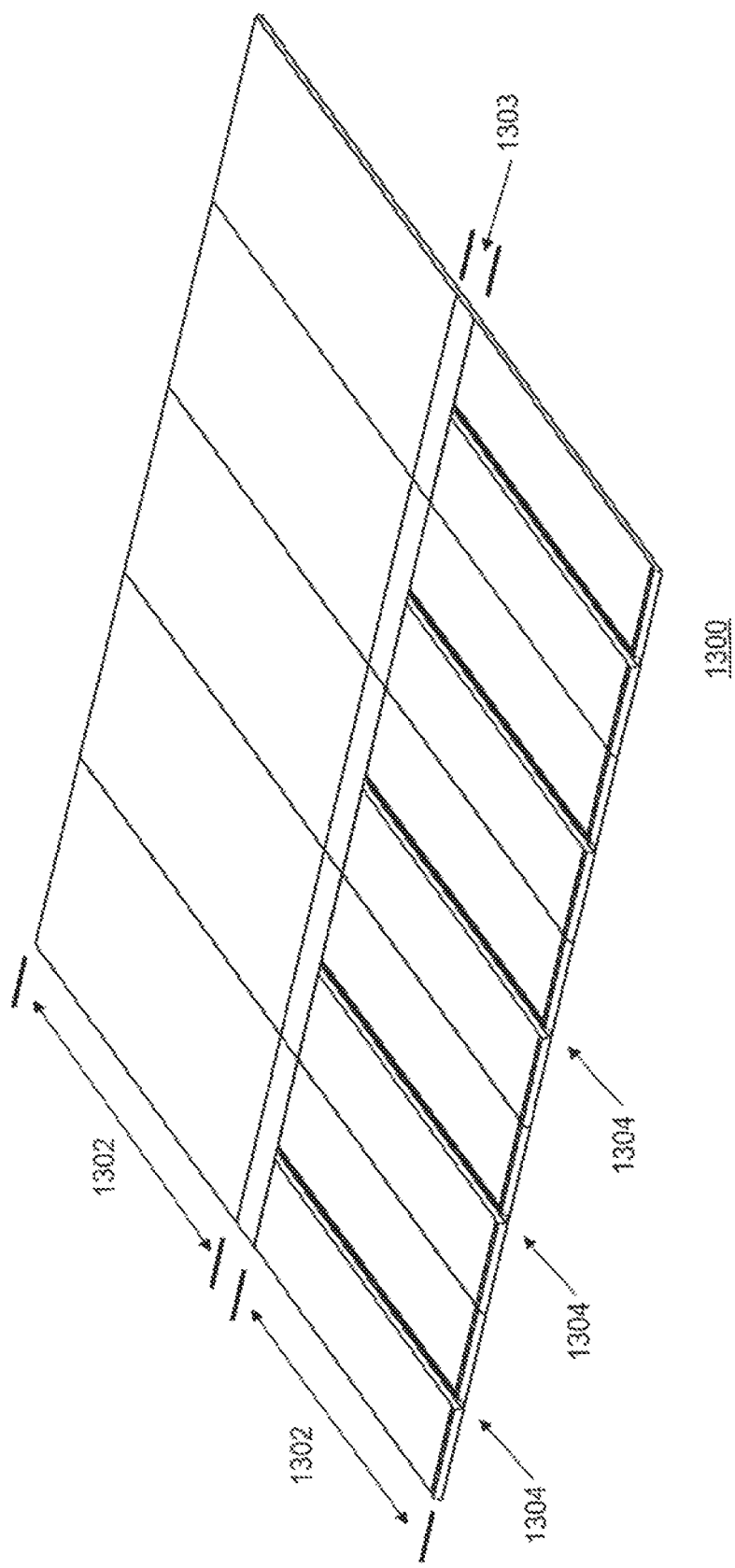
FIG. 13 shows the underlapping, exposed and fixing regions of an illustrative embodiment of the roofing module.

The features of an illustrative embodiment of the basic roofing product are as shown in FIG. 13. There is an underlapping region 1301, and an exposed region 1302 (i.e. to be exposed when a series of modules are positioned in a lapping arrangement). There may also be a fixing region 1303 where the module 1300 is to be attached to the building surface, and this may or may not be within the underlapping region 1301, but is suitably or optionally within the underlapping region 1301. The regions may exist in various proportions comparative to each other, and there may be profiling or contouring 1304 of any or all regions in a continuous or discontinuous pattern along the length of the module 1300. In one embodiment, the width of the underlapping region 1301 approximately equals the width of the overlapping region 1302. In other embodiments, the width of the underlapping region 1301 is about 95%, about 90%, about 80%, about 75%, about 60%, about 50%, about 40%, about 30%, about 25%, about 15%, or about 10% of the width of the overlapping region 1302. In some embodiments, the overlapping region 1302 is from about 5 cm to about 60 cm wide and the underlapping region 1301 is from about 5 cm to about 60 cm wide.

Figure 14:
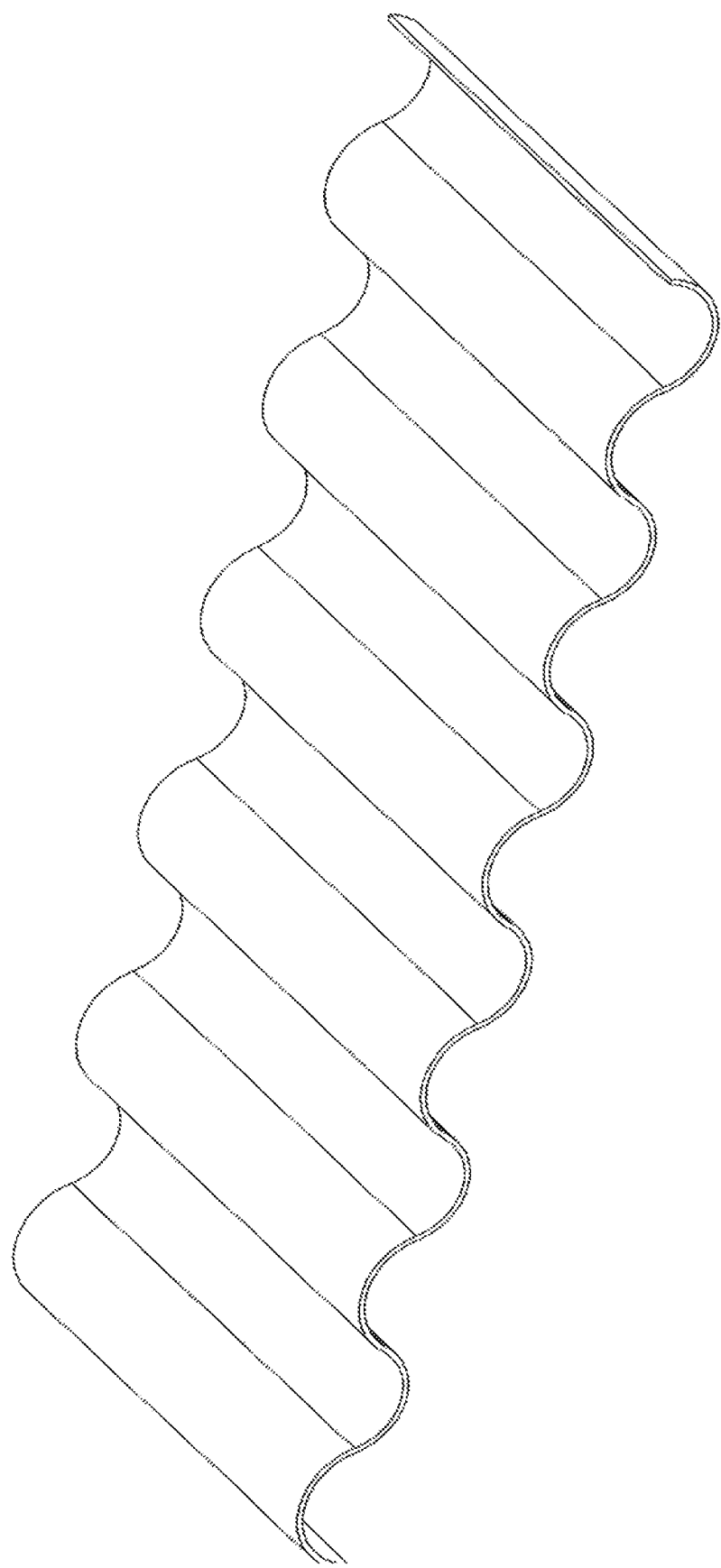
FIG. 14 shows an embodiment of the module having been formed to have a sinusoidal profile to simulate concrete tiling.
Figure 15:
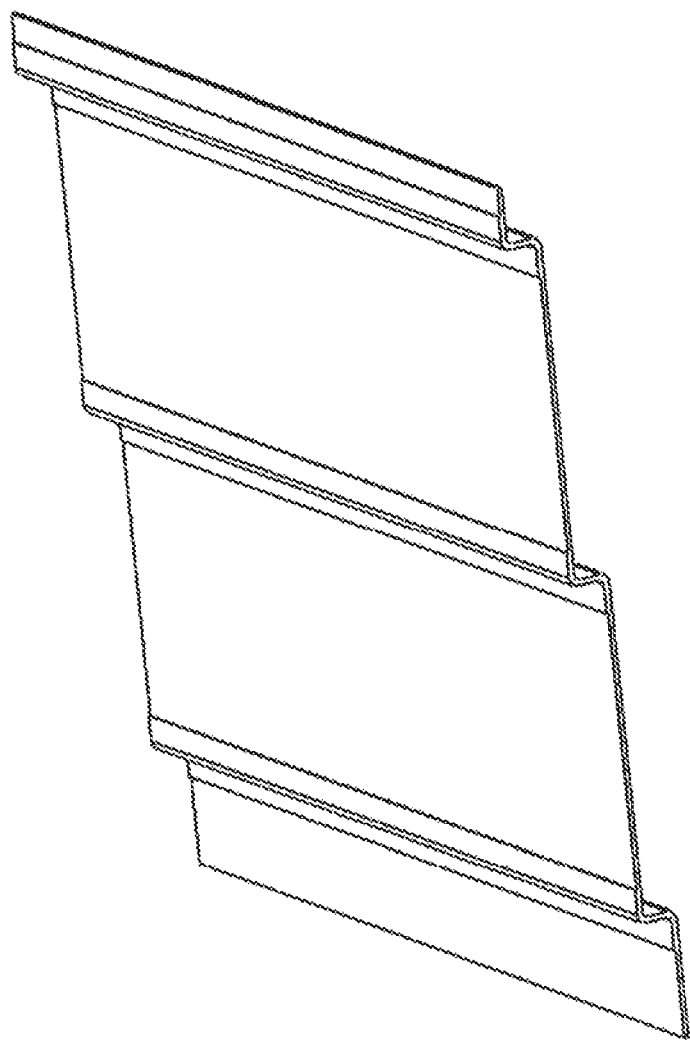
FIG. 15 shows an embodiment of the module having been formed to have a jagged profile to simulate weatherboarding.
Figure 16:
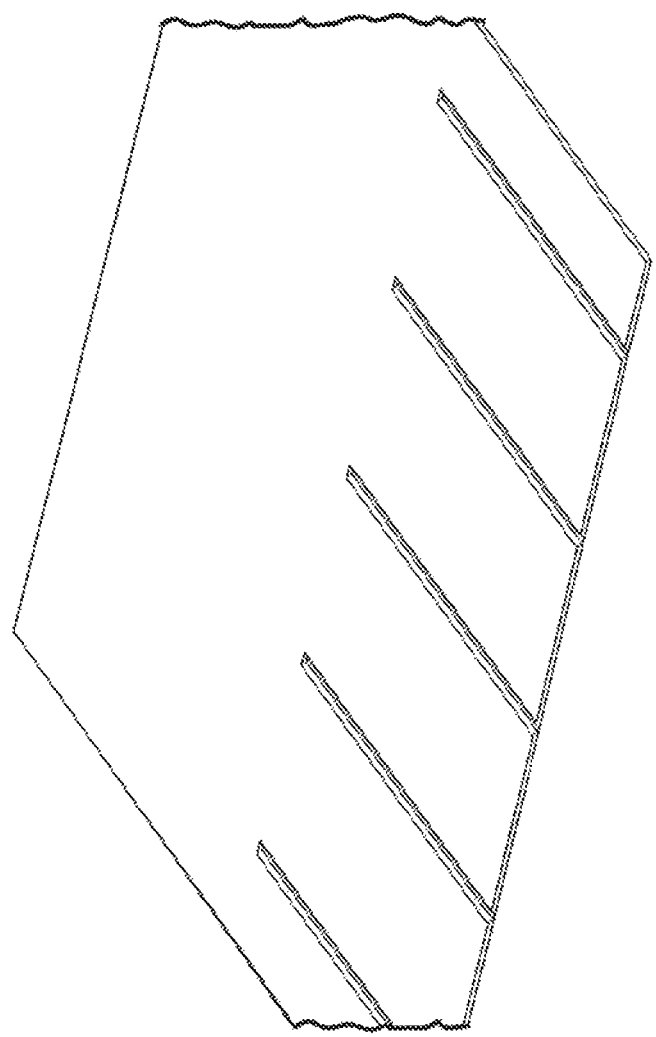
FIG. 16 shows an embodiment of the module having been formed to have relief contours on its upper surface to simulate asphalt shingle.

Variations in the profiling or contouring can be used to create different stylistic or ornamental effects. For example, the module may be moulded with a sinusoidal profile, as shown in FIG. 14, to simulate concrete tiling; an angular profile, as shown in FIG. 15, to simulate weatherboarding; with relief features on its upper surface, as shown in FIG. 16, to simulate asphalt shingles; or with a variable upper surface contour to simulate slate tiling or wooden shakes. The continuous forming process allows a variety of different 3D surfaces to be produced with the same equipment simply by swapping out the die faces on the forming machine as required. The surface can go up or down or sideways, it could overlap or underlap, or not overlap or underlap at all. Panels could be clipped together onto a racking system, the racking system (frame) having the wireless transfer between panels The colour and visual properties of material feeds can be changed fairly easily also just by inputting different materials and additives (particularly colouring additives) at the feeding stage. This means that it is possible to mass manufacture consecutive runs of different types of product (e.g. a product simulating concrete tiles, a product simulating slate tiles and a product simulating asphalt shingles) without significantly altering the equipment on the manufacturing line.

Figure 17:
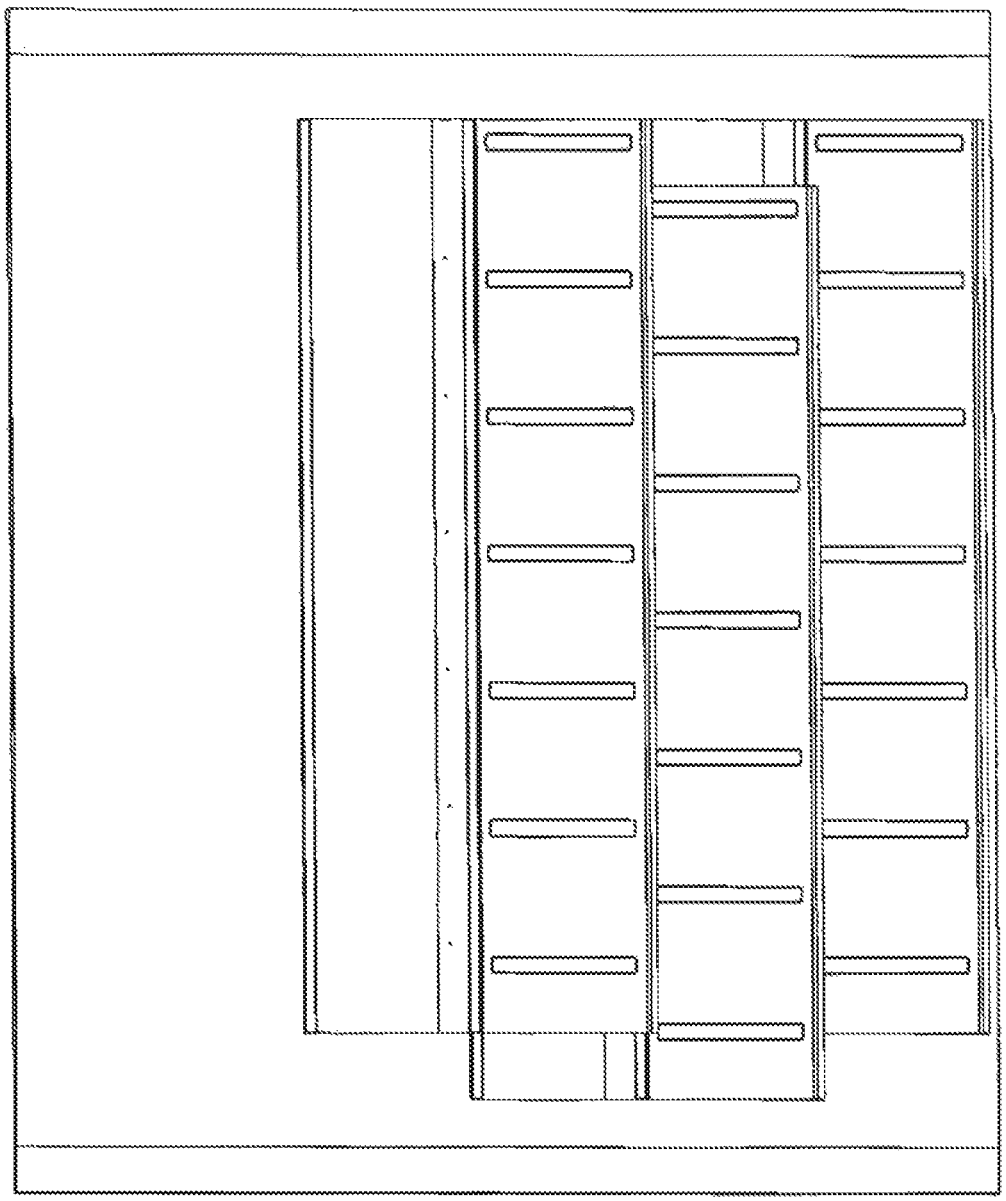
FIG. 17 shows a series of modules fixed in a lapping arrangement with offset vertical alignment for added visual appeal.

The modules may be installed in various vertical alignments as desired and/or as permitted by the surface contouring. The offset vertical alignment shown in FIG. 17 gives the effect of traditional "tiled" roofing, while other alignments will also produce interesting visual and/or stylistic effects.

Figure 18A:
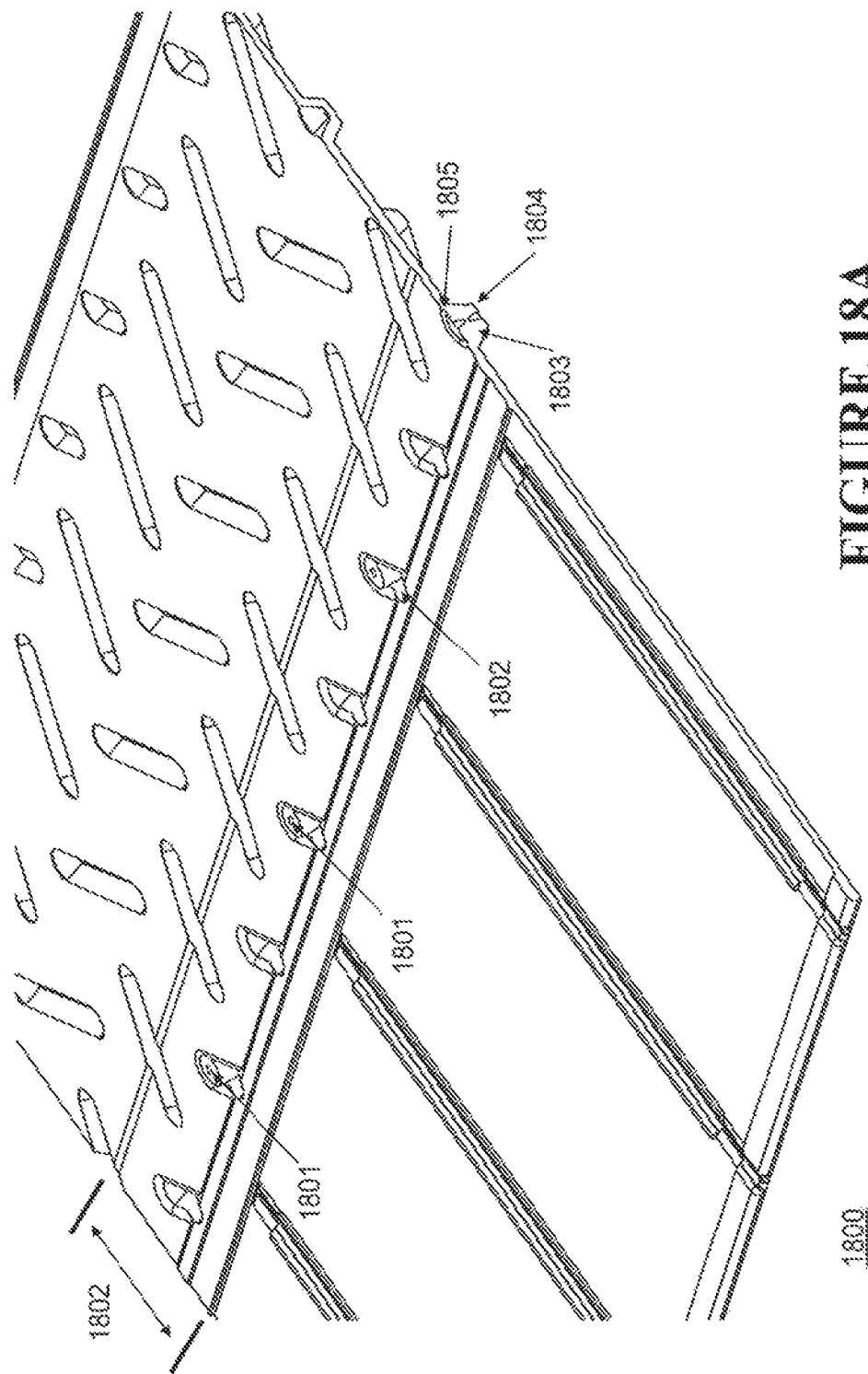
FIGS. 18A-18C show the detail of the fixing region of one embodiment of the module and the locators through which fasteners can be driven to secure the module to the building surface.

FIG. 18A shows a series of locator recesses 1801 within the fixing region 1802 of a moulded module 1800 for locating nail or screw type fasteners. There are bosses 1803 (i.e. thickened sections of material) at the bottom of each recess to provide a strong area for the fastener shank to pass through, and these also create a flat surface 1804 to butt with the building surface underneath the module. The sides of the recess 1805 slope outward so that a hammer or pneumatic nail or staple gun can be used to drive the fastener home without damaging the surrounding module material.

Figure 18B:
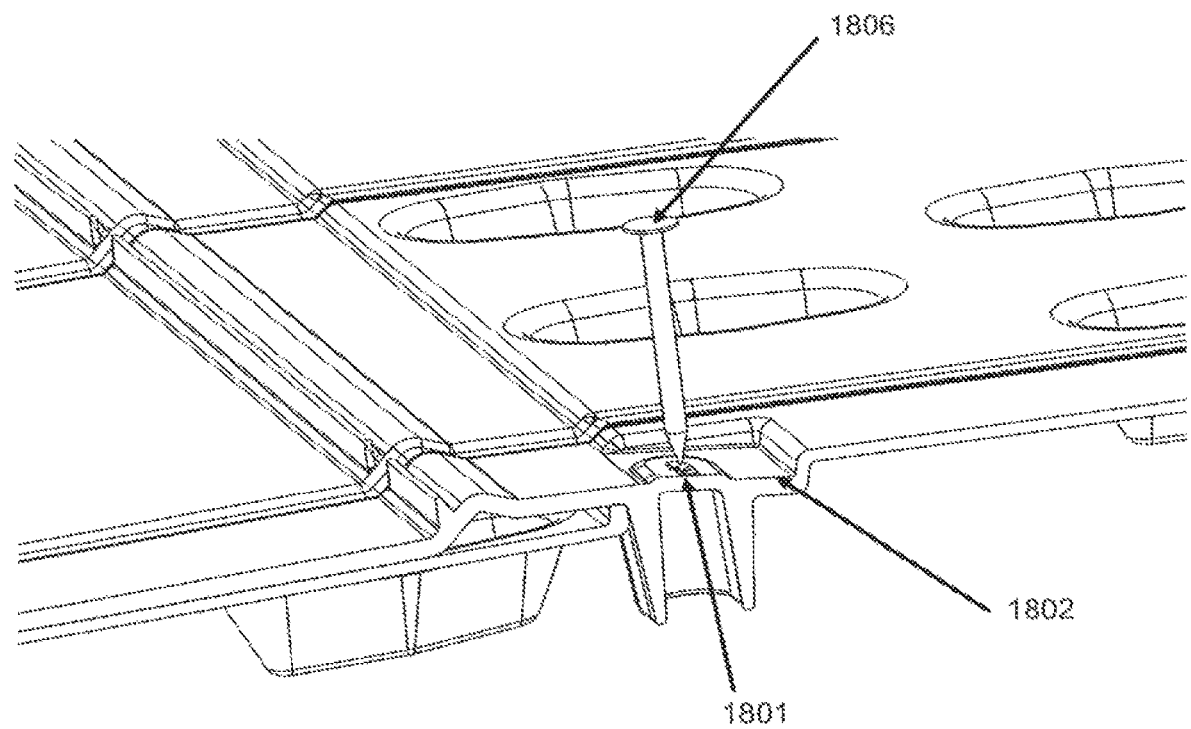
Figure 18C:
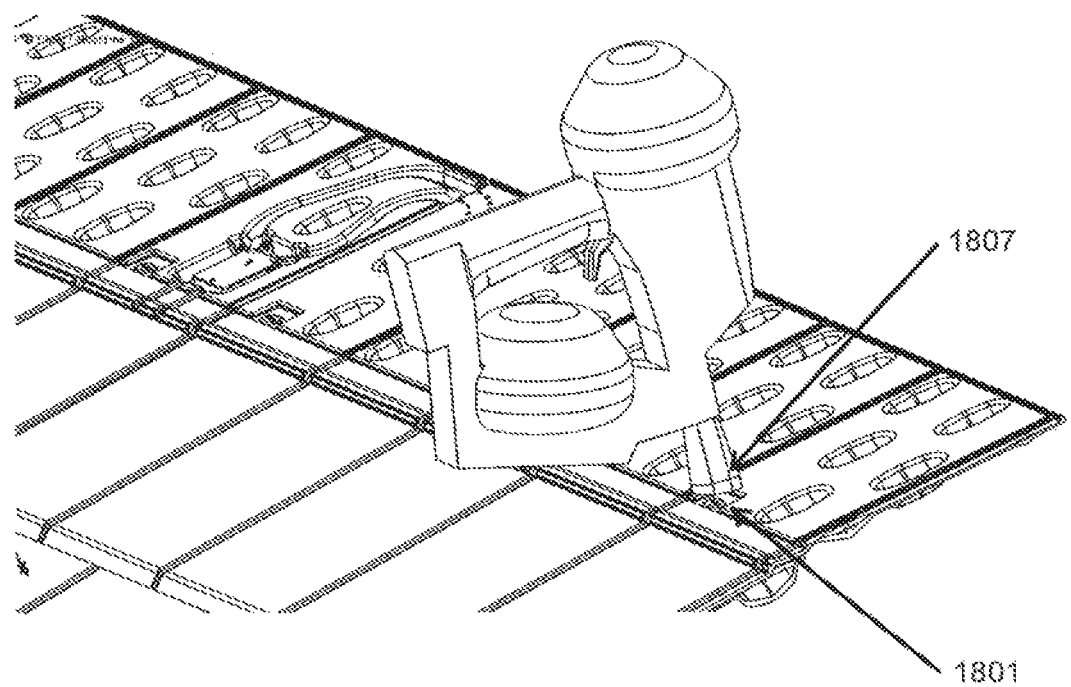

FIG. 18B shows there may be "starter" holes or locators 1801 within the fixing region 1802 for locating the fasteners 1806 (e.g., nails, staples, or screws) which attach the module to the building surface. These locators 1801 can be moulded features or extra surface markings. The purpose of such locators 1801 is to simplify installation by showing how many fasteners 1806 are required and how far apart they ought be spaced. Furthermore, as shown in FIG. 18C, the locators 1801 may include recesses that are adapted to fit conventional nail or screw gun heads 1807. This provides easy alignment and accurate location of the fastener for the installer. There may be a layer of reinforcement material covering the fixing region of the module to prevent the module material from tearing where it is penetrated by the fasteners, in which case the locators can serve to ensure that the fasteners are positioned within the reinforced zone.

Figure 19:
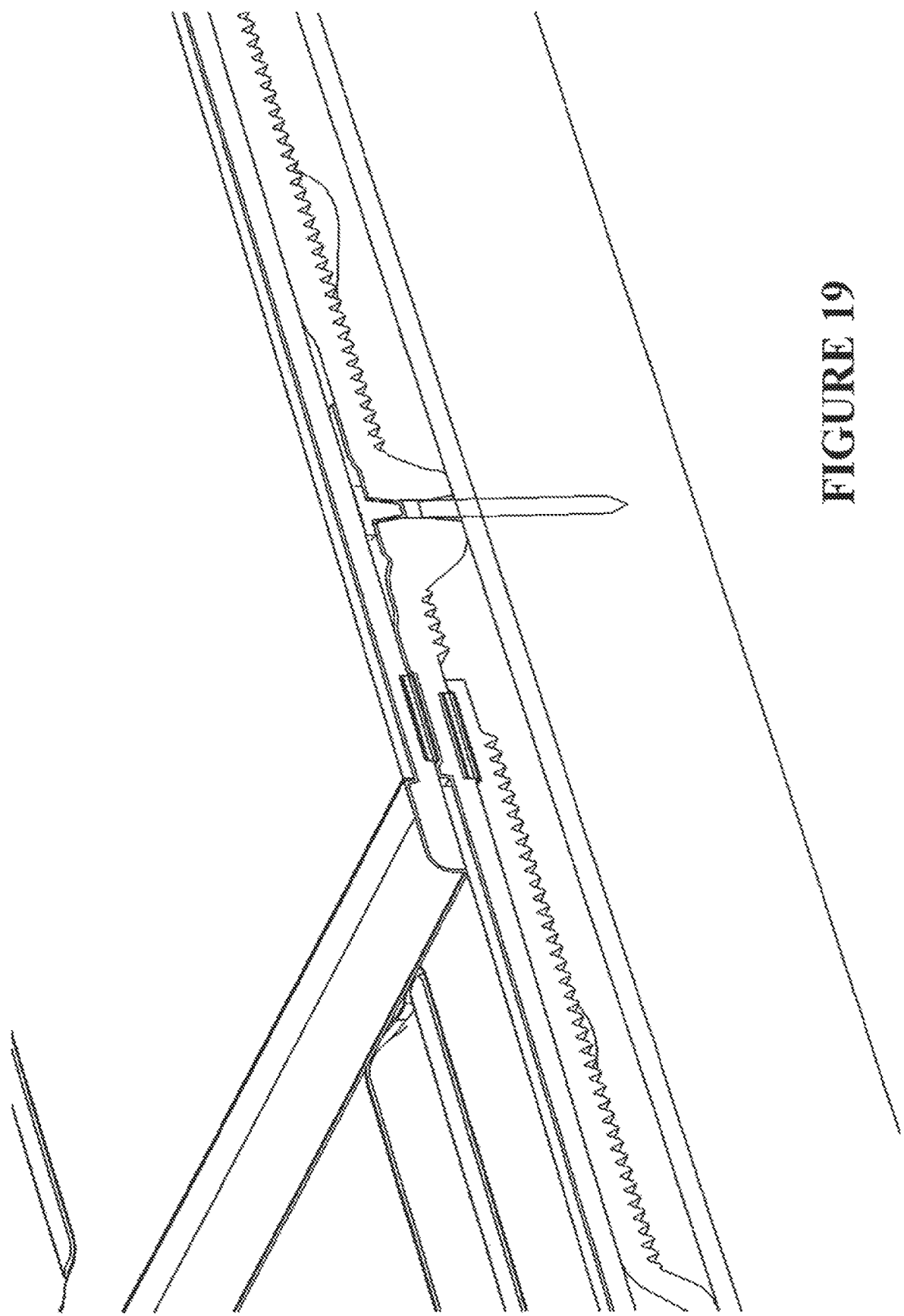
FIG. 19 shows a nail type fastener sitting within a locator recess sealed off by an overlapping module.

Once the module is fixed to the roof the head of the fastener should be flush with or sit below the top of the locator opening. As shown in FIG. 19, this allows the overlapping region of a subsequently affixed module to sit flat over top of the first module.

Figure 20:
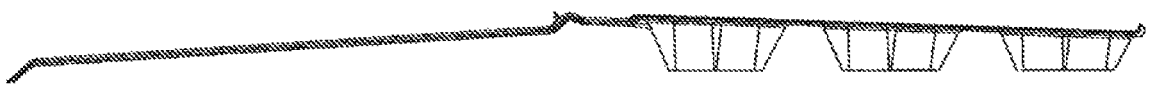
FIG. 20 shows an illustrative embodiment of the roofing module which has been moulded to have a precamber.
Figure 21A:
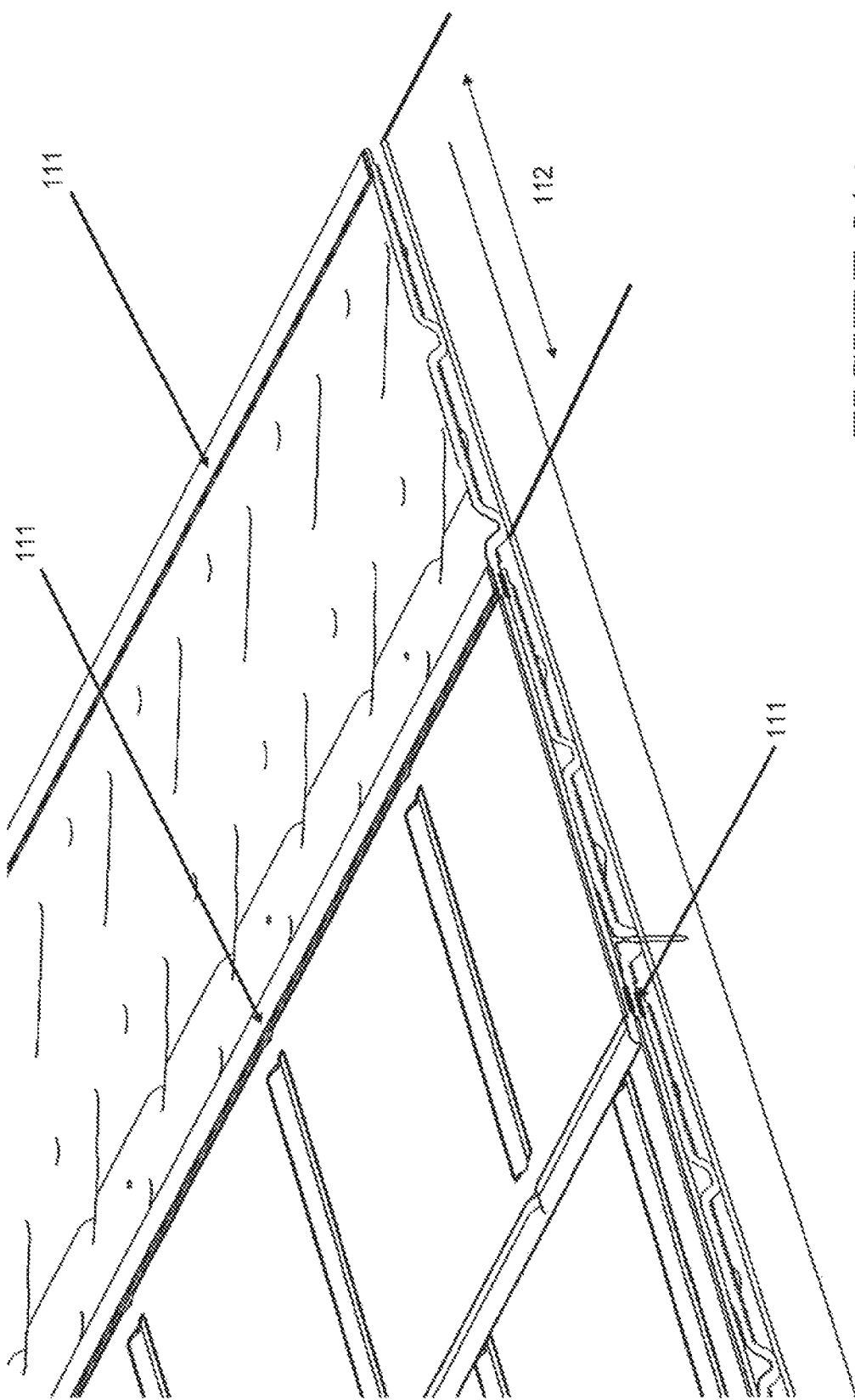
FIG. 21A shows an embodiment of the module which includes adhesive strips for securing the modules to create a weathertight seal.

The module may be formed with a convex precamber (as shown in FIG. 20) to apply a pre-load pressure to encourage the edges and bottom surface of the overlapping panel to contact firmly onto the underlapping panel when installed on a building. This also provides high thermal conductivity between the underlapping panel and the overlapping panel. Additionally, adhesive strips 111 (shown in FIG. 21A) running along the length of each module can be used to connect one module to the surface of the next, creating a waterproof seal and stopping grit and particulates from working their way under the roofing or cladding layer. There is also an advantage to securing those regions of the module which are farthest from the fixing region so that the exposed portions of the module cannot flap up in the wind and cause damage through fracture or bending stresses. This may be done with adhesive strips or by other means. If adhesive strips are used, it may be beneficial to have them covered by release strips 113 for transport and storage (as showing in FIG. 21B). The release strips would be removed during installation.

Figure 22:
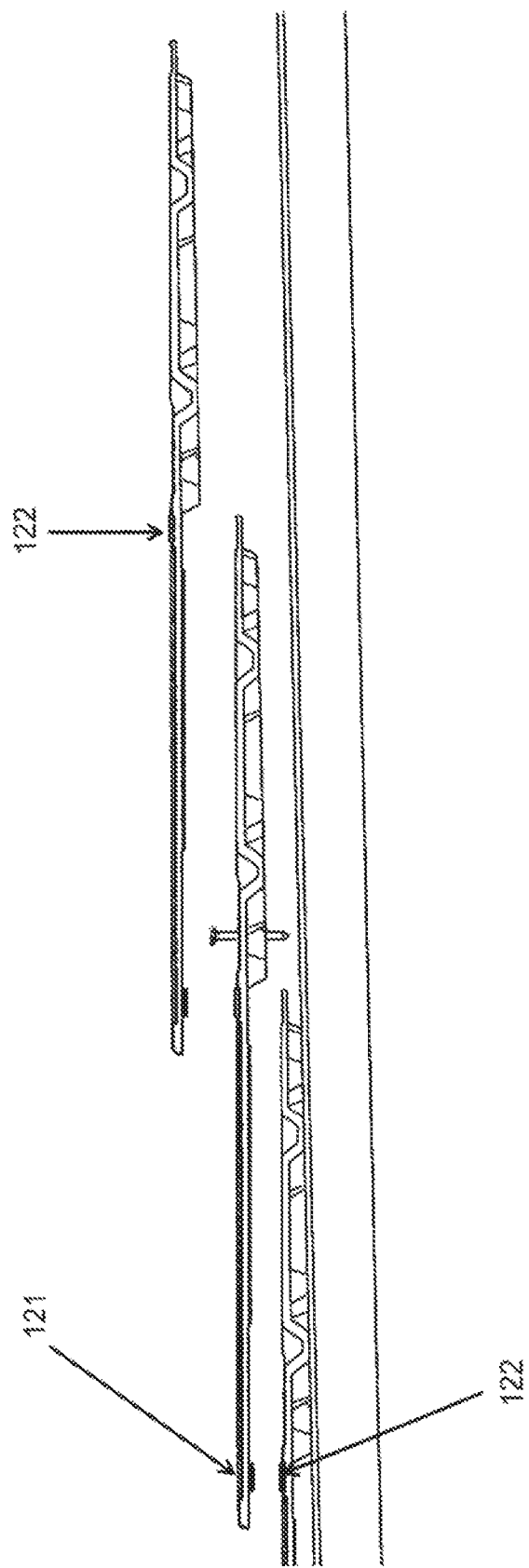
FIG. 22 shows an embodiment of the module where a first adhesive strip is affixed along the lower edge of the module on the back side of the moulded material layer, while a second is affixed to the top side just below the line of the fixing region.

The placement of the adhesive strip(s) on the module can vary. As shown in FIG. 22, in one embodiment, a first adhesive strip 121 is affixed along the lower edge of the module on the back side of the moulded material layer, while a second 122 is affixed to the top side just below the line of the fixing region. Thus a series of modules can be arranged as shown in FIG. 22, where the strip on the back side adheres to the strip on the front side.

Figure 23A:
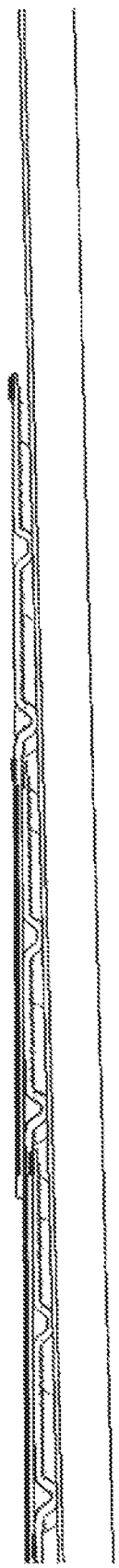
FIG. 23A shows an alternative embodiment wherein the adhesive strips are positioned so that both strips are on the front of the module; one at the rear edge and one just below the line of the fixing region.

Alternatively, as shown in FIG. 23A, the adhesive strips can be positioned so that both strips are on the front of the module; one at the rear edge 131 and one just below the line of the fixing region 132. In this case the adhesive will secure two points of the module and will adhere directly to the substrate layer of the overlapping module. A further alternative or addition is to apply an adhesive paste to the region 112 during installation.

Figure 23B:
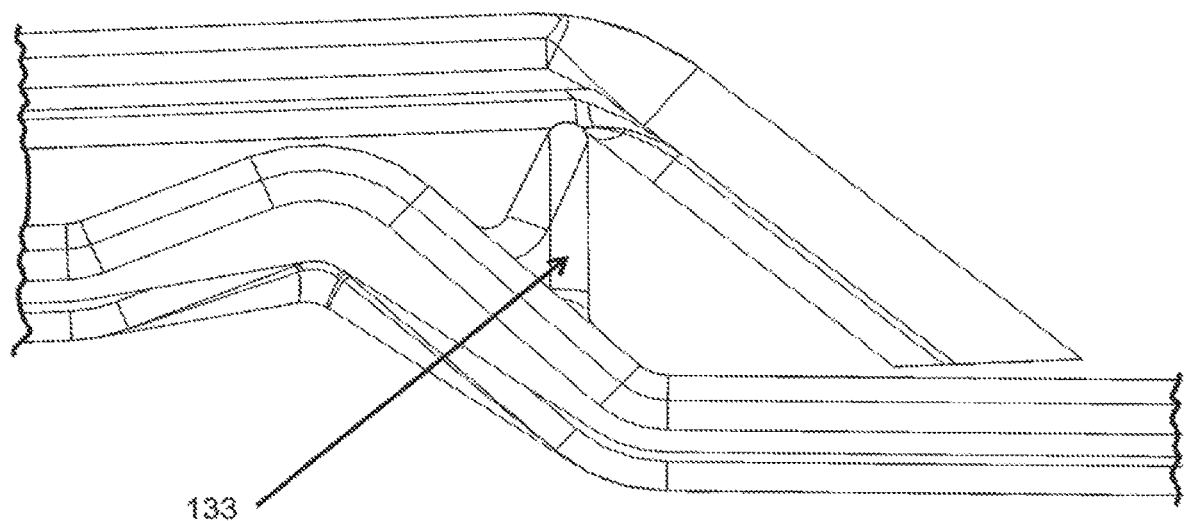
FIG. 23B shows an embodiment where a strip of material on the upper surface of the underlapping region serves as a weather-tight barrier.

As shown in FIG. 23B, the module may be pre-formed with a strip of material 133 on the upper surface of the underlapping region that serves as a weather-tight barrier when placed into contact with an adjacent module. This flexible strip of material 133 prevents the backflow of water or air in between the overlapping modules. A further alternative or addition is to place a similar strip of polymeric material on the lower surface of the exposed region, to prevent water from penetrating between the two overlapping modules.

Figure 24:
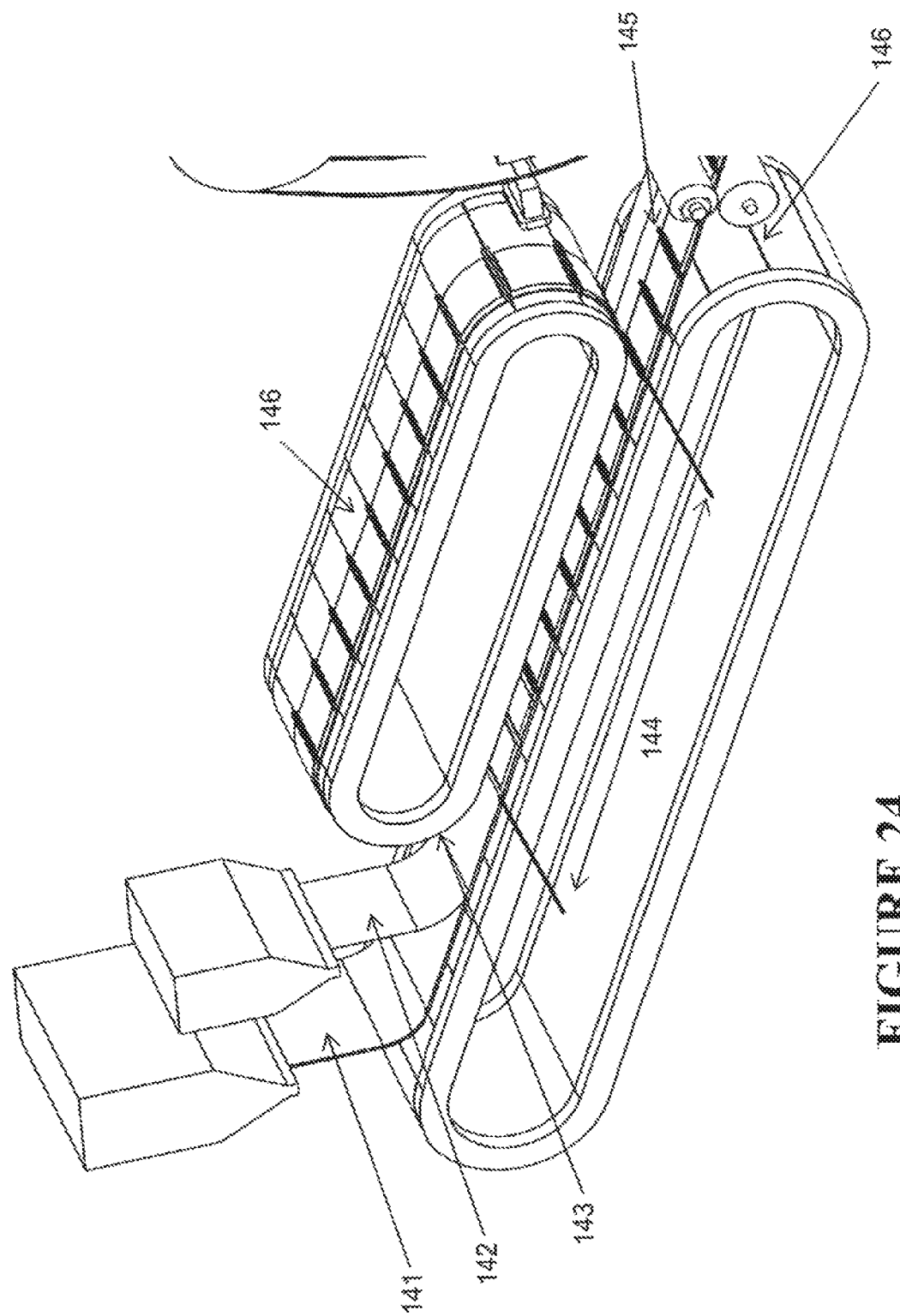
FIG. 24 shows diagrammatically a continuous forming apparatus contemplated as providing for the continuous forming of various modules described herein.

In one embodiment, a sequence of steps in the manufacture of the roofing and/or cladding product is to firstly prepare the module material for forming (which may involve bringing the material to a molten, semi-molten or pliable state), secondly, feeding the material to a pressure forming zone, and thirdly, forming and setting the material as it advances through the pressure forming zone. While there are various methods of mixing and presenting the materials prior to forming, a suitable method is to deposit an extruded feed layer of a first material 141 onto an advancing support surface of a continuous forming machine, and to subsequently introduce a further extruded feed layer of another material 142 overtop of this, as shown in FIG. 24. The first material and the second material or additional may be the same or different, and may be of the same or different form. Both materials then proceed as a layered feed 143 to the pressure forming zone 144, and are moulded into a single module panel 145. The product can be manufactured so that there are different features on the top of the moulded panel to those on the bottom by using different dies in the upper and lower rotating tracks 146 of the CFT machine. The modules can also be manufactured using a single material only.

Figure 25:
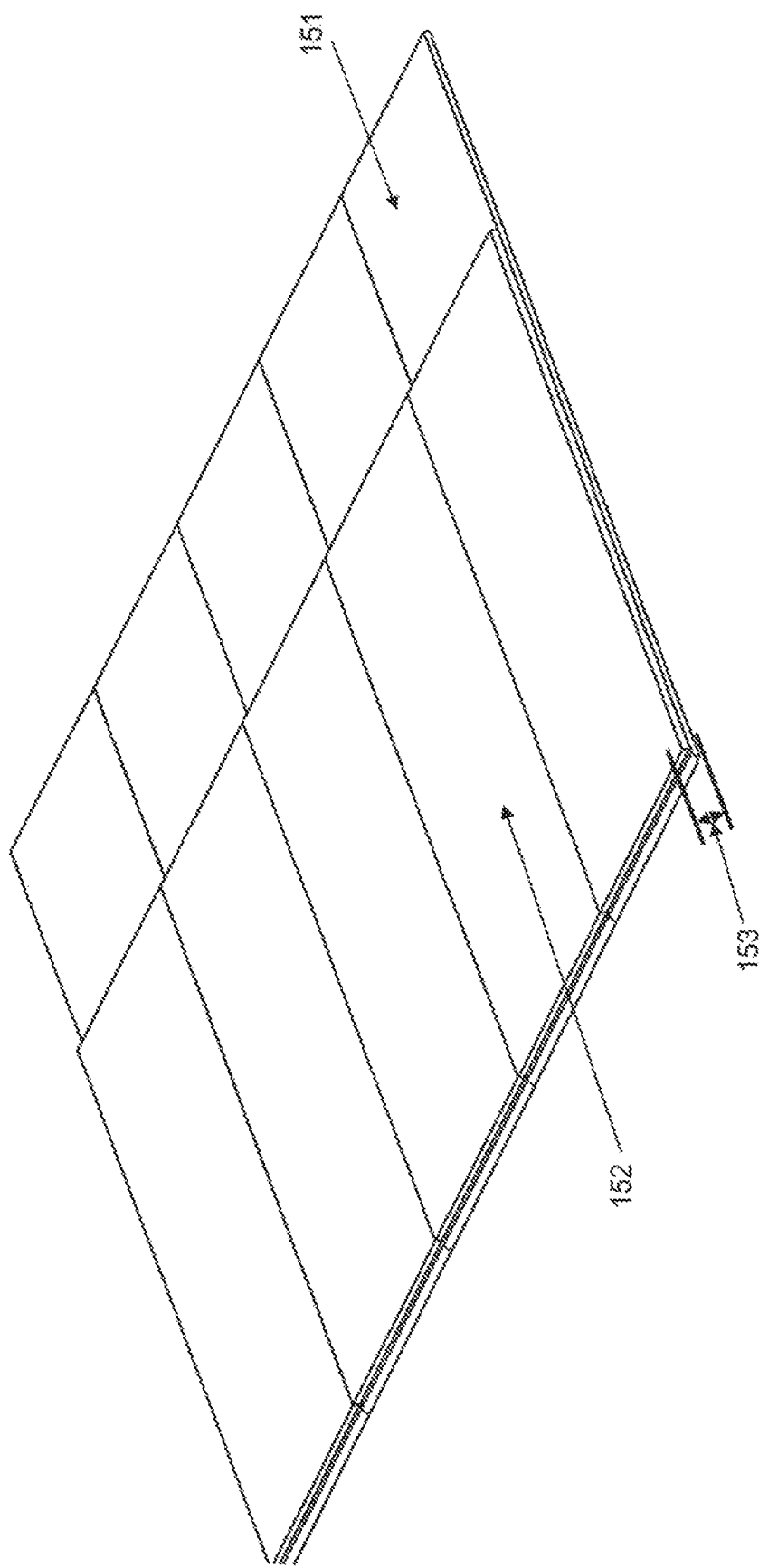
FIG. 25 shows a module wherein a second layer of material has been formed overtop of, but not entirely covering, a first layer of material.

Upon arrival at the pressure forming zone it may be that the second material feed entirely covers the first, however the feeds may be arranged so that only a portion of the first feed 151 is covered by the second 152 (as in FIG. 25). There may only be a thin strip of the second material or additional material on top of the first or second feed, and the positioning of the strip across the width of the first feed can vary. These variations can be achieved during manufacture by changing the positioning of the various extruders relative to each other and by altering the width of the feeds.

In some embodiments, the first material layer has a width WI and a thickness TI and the second material layer has a width W2 and a thickness T2. In one embodiment, WI is wider than WII. In one embodiment, WI and WII are of equal widths. In one embodiment, WII is wider than WI. In one embodiment, TI is thicker than TII. In one embodiment, TI and TII are of equal thickness. In one embodiment, TII is thicker than TI. In one embodiment, WI and WII are within the range of 5 centimetres to 3 metres. In one embodiment, TI and TII are within the range of 0.1 to 100 millimetres.

Additional material layers (whether extruded, roll fed, or otherwise presented) can also be added prior to or after the forming process. This allows for the continuous forming of a multi-layered product, each material layer having a particular set of properties which are advantageous to the product. In particular, it may be desirable to add one or more reinforcing layers to the product. Such layers may comprise a metal, cloth or fibreglass mesh, jute or other fabric, glass fibre, carbon fibre, aluminium sheet or a reinforcing polymer. These can be laid beneath, on top of, or in between the other material layers prior to the forming step, and may or may not undergo deformation during the forming step. The thickness of the module panel 153 produced will be determined in part by the materials selected and the number of layers fed in. In one embodiment the thickness of the panels may be within the range of about 0.5-55 mm.

The various layers of material may chemically bond together prior to or during the forming step, however their ability to do so will depend entirely on the materials selected. Where the materials selected are not prone to chemical bonding, it may be necessary to assist adhesion with a plasma or adhesive layer; or to feed in a supplementary material with a chemical affinity for both of the material layers. This can be applied in-line as an interposing layer or deposit atop the first substrate material feed prior to the introduction of the second. The various layers of material may also mechanically bond together due to the surface finishes or features between the layers.

A similar product can be achieved by the segmental injection moulding of the roofing and/or cladding modules, however such a process has a much slower output capacity. Large areas of product need to be produced for building applications and it is desirable to be able to produce these large surface area products in high production volumes to make the process economical. Moreover, such a process would result in a product containing weld lines and injection moulding points. Weld lines are formed when two or more molten polymer flows meet during the injection molding process. This can occur when a polymer flow splits to go around an interruption (e.g., a post that forms a hole) and then rejoins, or when polymer melt fronts meet, from multiple injection points. This can also occur when molten polymer meets a non molten polymer. Consequently, a visible weld line is observed and the adhesion/bond in this weld line at the interface is weaker than the balance of the polymer within the product. Injection moulding points are the area of a product where the heated material was fed into the mold cavity. It is also difficult to make a product comprising more than one layer of material using injection moulding, and injection moulding can produce colour differences or variations that affect the aesthetics of the final product. On the other hand, the continuous forming machine can produce approximately 5-60 m of product per minute, which makes it a preferable to use this production method over other processes which could be used to manufacture a 3D polymer product. The continuous forming machine also produces a product that lacks weld lines or injection moulding points, and optionally contains multiple layers of material.

A number of materials are suitable for use in the production of a roofing and/or cladding product by a continuous forming process; however it is most cost effective to produce the moulded panel from a foamed material (e.g. foamed polycarbonate). Not only does this reduce the amount of raw material required for production, but also results in a lightweight product. This can be advantageous in the retrofitting of roofing or cladding to an existing building. For example, where there is a building with an existing but degraded roof, re-roofing can occur by placing the new lightweight shingle directly over top of the existing shingle (usually asphalt shingle).

The foamed polycarbonate (or alternative substrate material) may be accompanied by one or more additional materials to enhance the properties of the product. A suitable material is Thermoplastic Polyurethane (TPU), which can be fed into the moulding process along with the polycarbonate as shown in FIG. 24. Foamed polycarbonate and similar materials are favoured in roofing products because they have fire retardant properties, but the addition of a TPU layer improves the performance of the product because the TPU has better durability, physical properties and resistance to environmental wear. In particular, TPU is puncture resistant, tear resistant, and UV resistant, and will retain the aesthetic appeal of the product for a longer period of time compared to polycarbonate alone.

Figure 26:
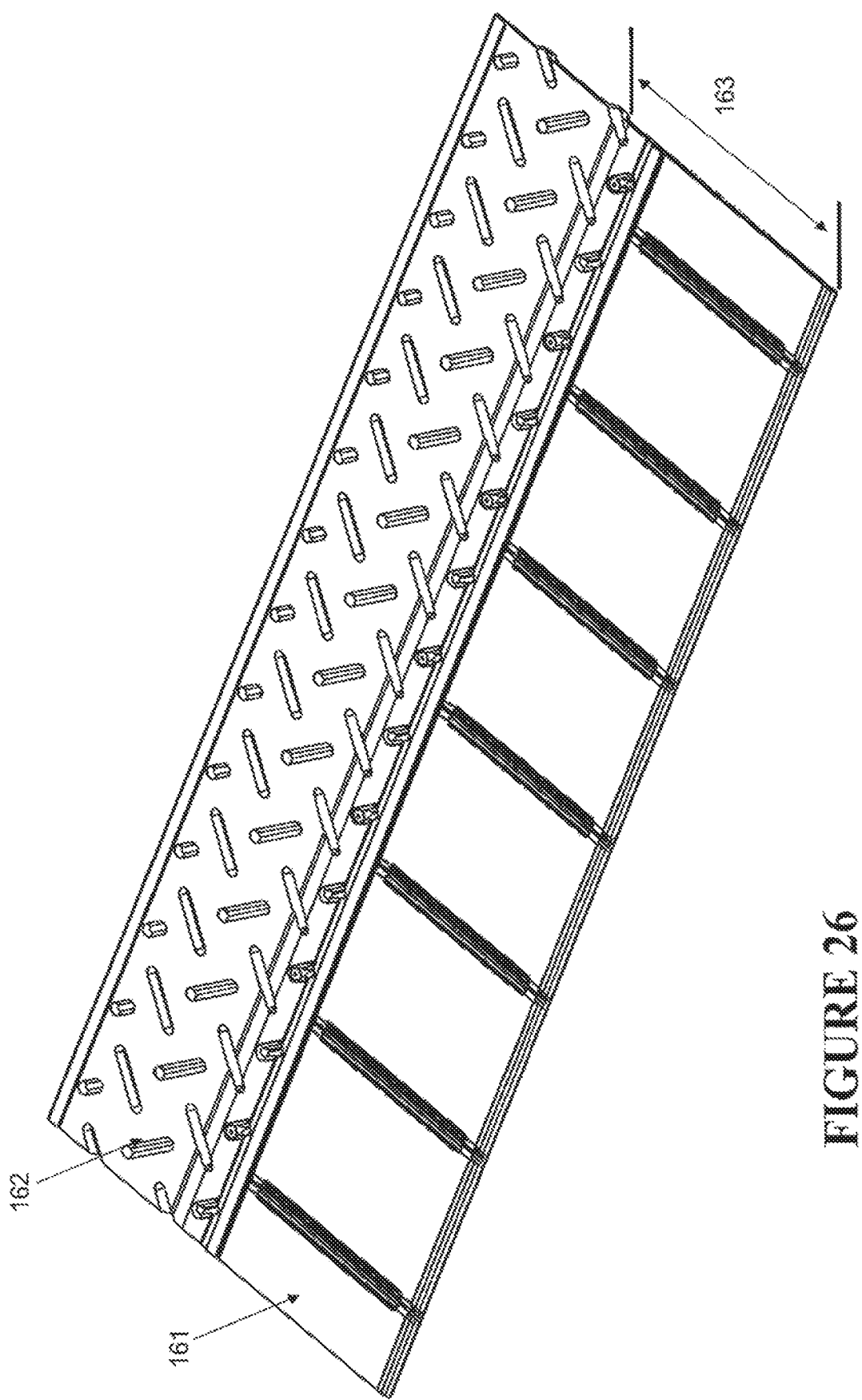
FIG. 26 shows an illustrative embodiment of a module wherein a thermoplastic polyurethane layer has been formed along with, and on top of, a foamed polycarbonate layer, to give product characteristics desirable for a roofing shingle.
Figure 27:
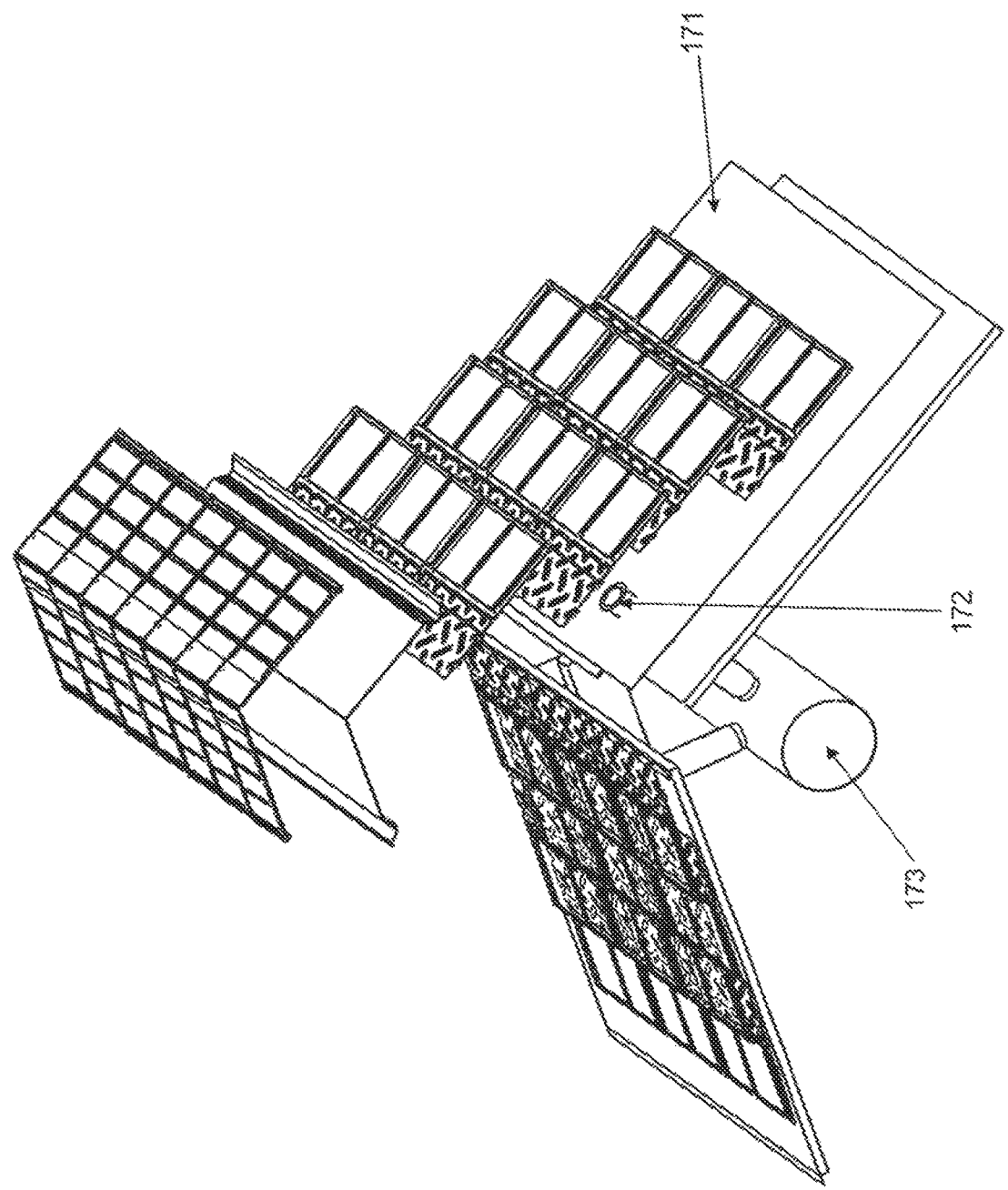
FIG. 27 is an exploded view of a roofing assembly to be used in the collection of thermal and/or solar energy.

The panel at its point of exit from the forming step is shown in FIG. 26. The TPU layer (or a layer of alternative material) 161 is moulded on top of the polycarbonate (or other foamed material) layer 162 to form the body of the shingle module. While it is desirable to use as much foamed material as possible to reduce materials, in some embodiments, the TPU layer may cover the region 163 which extends from the lower edge of the shingle up to a line above the fastener fixing region. This is so that the areas of the shingle exposed to the elements will have good durability, and all of the areas of the shingle penetrated by fasteners will have good tear resistance. An advantage to using TPU in this instance is that the TPU, once punctured, will tend to contract around the shank of the fastener to make a watertight seal.

Other materials which may be used include (but are not limited to) polycarbonate (PC), general purpose polystyrene (GPPS), polymethyl methacrylate (PMMA), polyethylene terephthalate (PET), polyester methacrylate (PEM), polypropylene (PP), high impact polystyrene (HIPS), acrylonitrile butadiene styrene (ABS), polyester (PES), polyamides (PA), polyvinyl chloride (PVC), polyurethanes (PU), polyvinylidene chloride (PVDC), polyethylene (PE), polytetrafluoroethylene (PTFE), polyetheretherketone (PEEK) (polyetherketone), polyetherimide (PEI), Polyimide (PI), polylactic acid (PLA), high impact polystyrene, acrylonitrile butadiene styrene (ABS), acrylics, amorphous polymers, high density polyethylene (HDPE), polyethylene terephthalate (PET), low density polyethylene (LDPE), linear low density polyethylene (LLDPE), medium density polyethylene (MDPE), cross linked polyethylene (PEX), Ethylene vinyl acetate (EVA), Ethylene vinyl alcohol (EVOH), thermoplastic elastomer (TPE), thermoplastic polyolefin (TPO), thermoplastic rubber (TPR), polypropylene (PP), Fluorinated ethylene propylene (FEP), Polybutylene terephthalate (PBT), Polyoxymethylene (POM), Polyphenylene oxide (PPO), Polypropylene homopolymer (PP-H) Polypropylene copolymer (PP-C), silicon polymers, styrene-acrylonitrile resin (SAN) and thermoplastic rubber. The materials may be a blend of any or all of these. The materials may also comprise additives to enhance properties such as resistance to fire, fracture, impact, ultraviolet light, and thermal or tensile stresses. Materials which could also be considered in manufacture are various polystyrenes, nylons, acrylics, polyethylene, thermoplastic ethylene, polypropylene and phenolic, and combinations of or containing these. No matter which materials are chosen, the materials must be compatible so that they do not delaminate. If the materials are not compatible, they may still be used; however, a tie or bond layer must be introduced between them. Examples of tie or bond layers include, but are not limited to, ethylene vinyl acetate (EVA), thermoplastic polyolefin (TPO), thermoplastic elastomer (TPE), silicon adhesives, epoxy adhesives, and acrylic adhesives. One of skill in the art is capable of choosing materials in the appropriate combinations to suit the purposes described herein.

In various embodiments, the roofing module is flame resistant, resistant to tearing (especially at puncture and attachment points), able to be easily and cleanly cut with everyday tools to aid installation, able to endure environmental and UV exposure for over 20 years, able to endure cyclic freezing and thawing without failure, resistant to delamination at temperatures of between −40 and 100 degrees Celsius, impact resistant to a reasonable extent, impenetrable by water even at fixing points, low density, resistant to penetration and abrasion, colourfast, resistant to microbial attack, compatible with adhesives and made of materials which are stable in high humidity and wet conditions and which retain their pliability at high and low temperatures and which do not delaminate. All of these factors come into play when choosing appropriate materials or material combinations for the manufacture of the product. It is also desirable that the material(s) used are non-toxic, or that at least the upper layers of the product are (if a layered product is produced). This avoids the prospect of toxic contamination in the event that water is to be collected from one or more building surfaces for subsequent use.

In some embodiments, the product may be produced from a recyclable material or several different recyclable materials. The combination of materials chosen in the manufacture of the product is suitably one that can be recycled without first having to dismantle the product into its constituent materials.

Figure 39A:
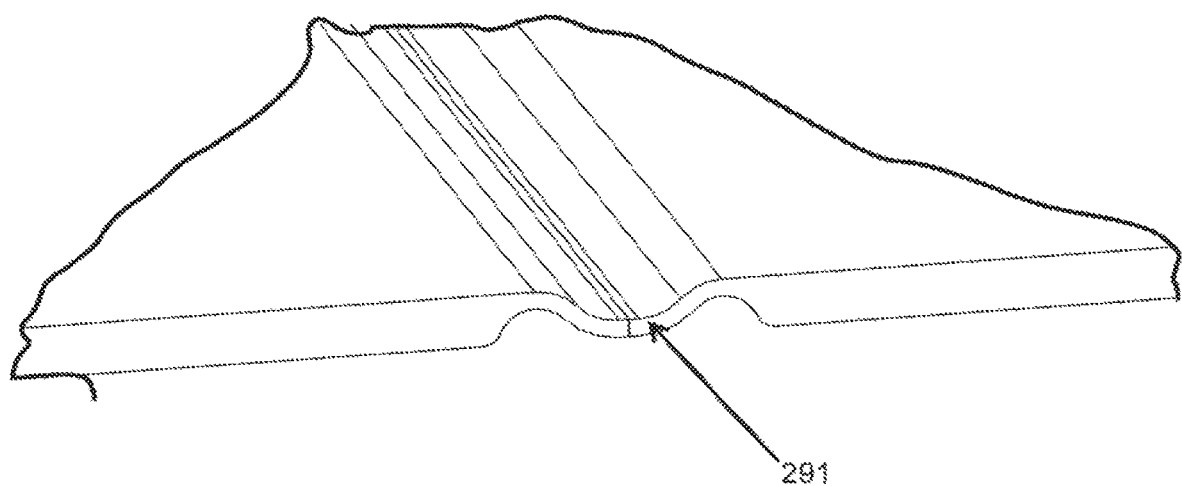
FIG. 39A shows the detail of a concertina feature designed to accommodate thermal expansion and contraction of the module.
Figure 39B:
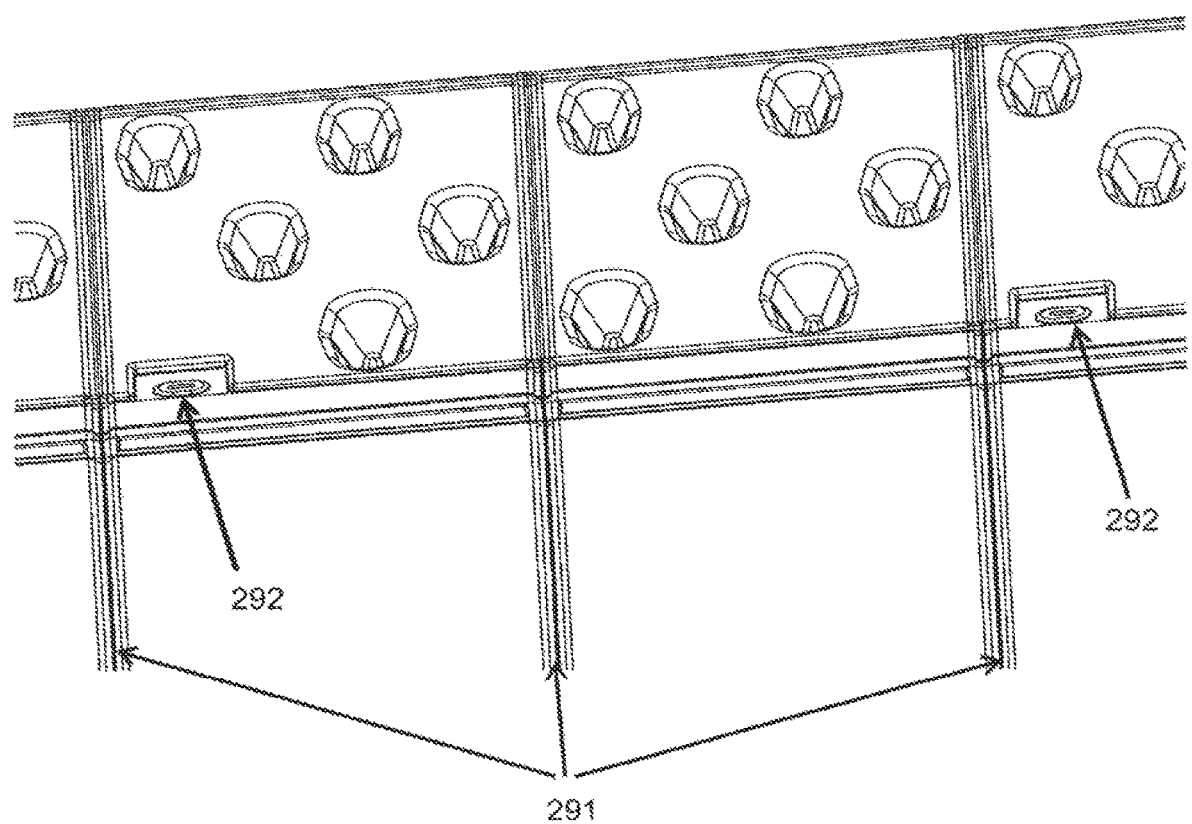
FIG. 39B shows the detail of the concertina feature placed between two fixing points.

It is also important to choose a material with a low co-efficient of thermal expansion to avoid warping along the length of the product. If the material undergoes too much movement once attached to the building surface it may fail at or between the attachment points. Failure can also be a problem if a layered product is produced with two or more materials having vastly different thermal expansion co-efficients. In one embodiment, as shown in FIGS. 39A-39B, thermal expansion and contraction can be accommodated by moulding each module to have one or more concertina-shaped features 291 that will expand or contract between two fixing points 292.

In various embodiments, the roofing or cladding module may incorporate additional properties or functionalities, including but not limited to: a photovoltaic functionality; and/or (iii) interconnection functionalities of photovoltaic areas, as described in further detail below.

An alternative embodiment of the roofing and/or cladding product is one that has all of the previously described features, along with several additional features that make the product suitable for use as part of a thermal energy recovery system. The thermal energy can be obtained from a building surface that has been exposed to sunlight for a period of time, although there are other less significant sources that may contribute. The thermal energy can then be exhausted or transferred to a passing fluid flow (air being the most practical option) between the product and the building surface, and subsequently used elsewhere in the system.

A notable feature of this embodiment is that the building underlay forms one boundary of the airway path. This embodiment is different from box, round or other geometric closed cross section shapes e.g. Corflute® roof or similar products, which are segmented into confined zones for airflow that can become blocked. The overall cost of materials is also reduced compared to box, round or other geometric closed cross section shaped roofing materials, which contain a backing material to define a self-contained pathway for airflow. By contrast, this embodiment regards the whole roof as one large surface of airflow, with the cavity for airflow bounded on one side by the modules and the roofing underlay on the other side.

Figure 28A:
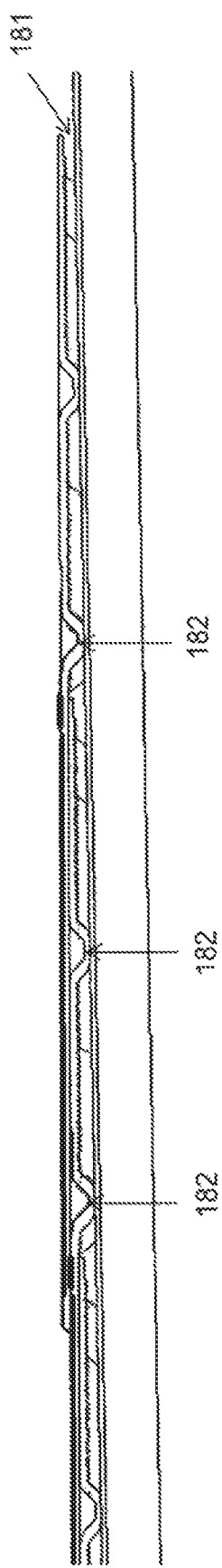
FIG. 28A is a side on view of the module assembly of FIG. 27.
Figure 28B:
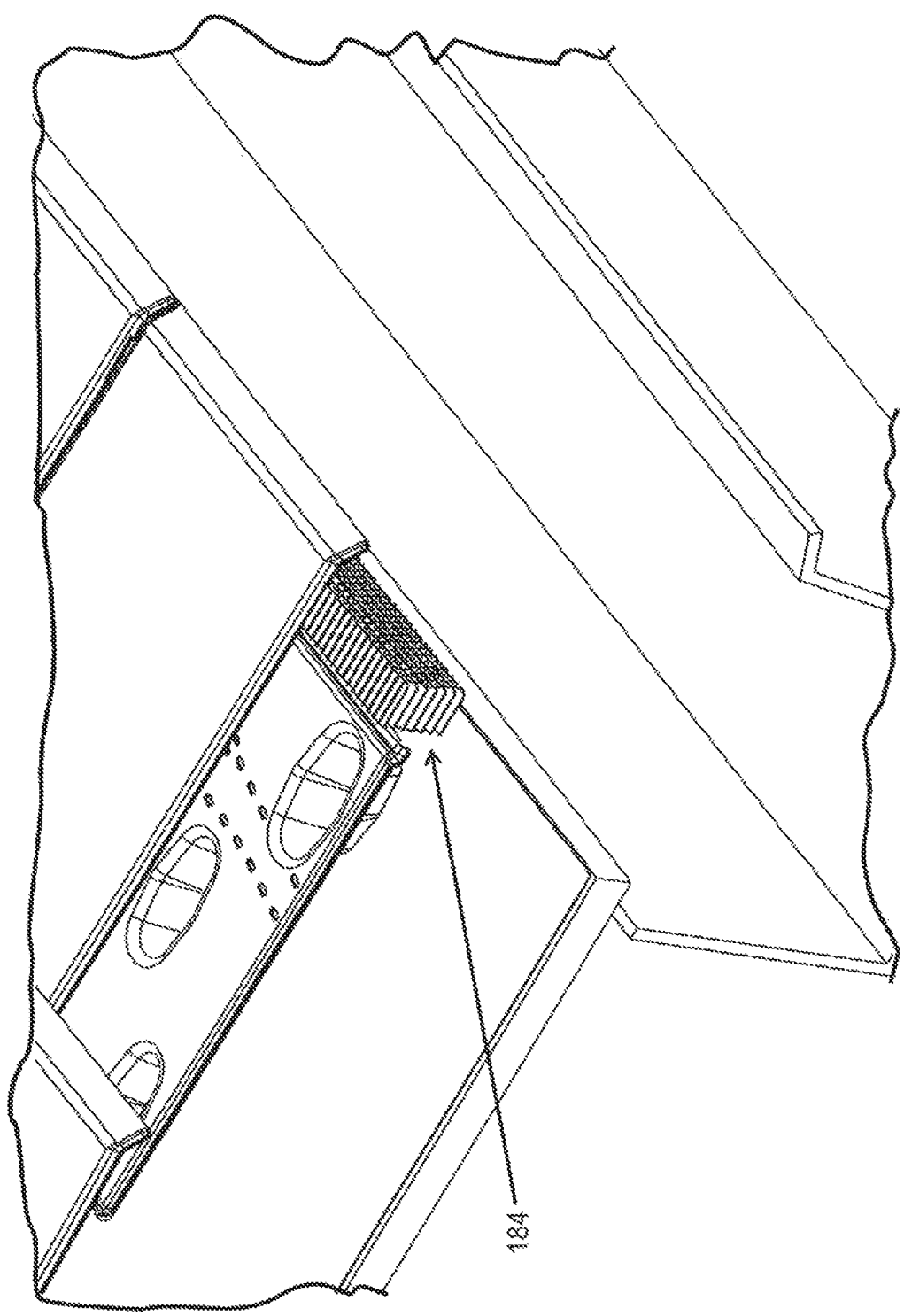
FIGS. 28B-28C shows a cross-section of the module and air filter at the edge of a building surface.
Figure 28C:
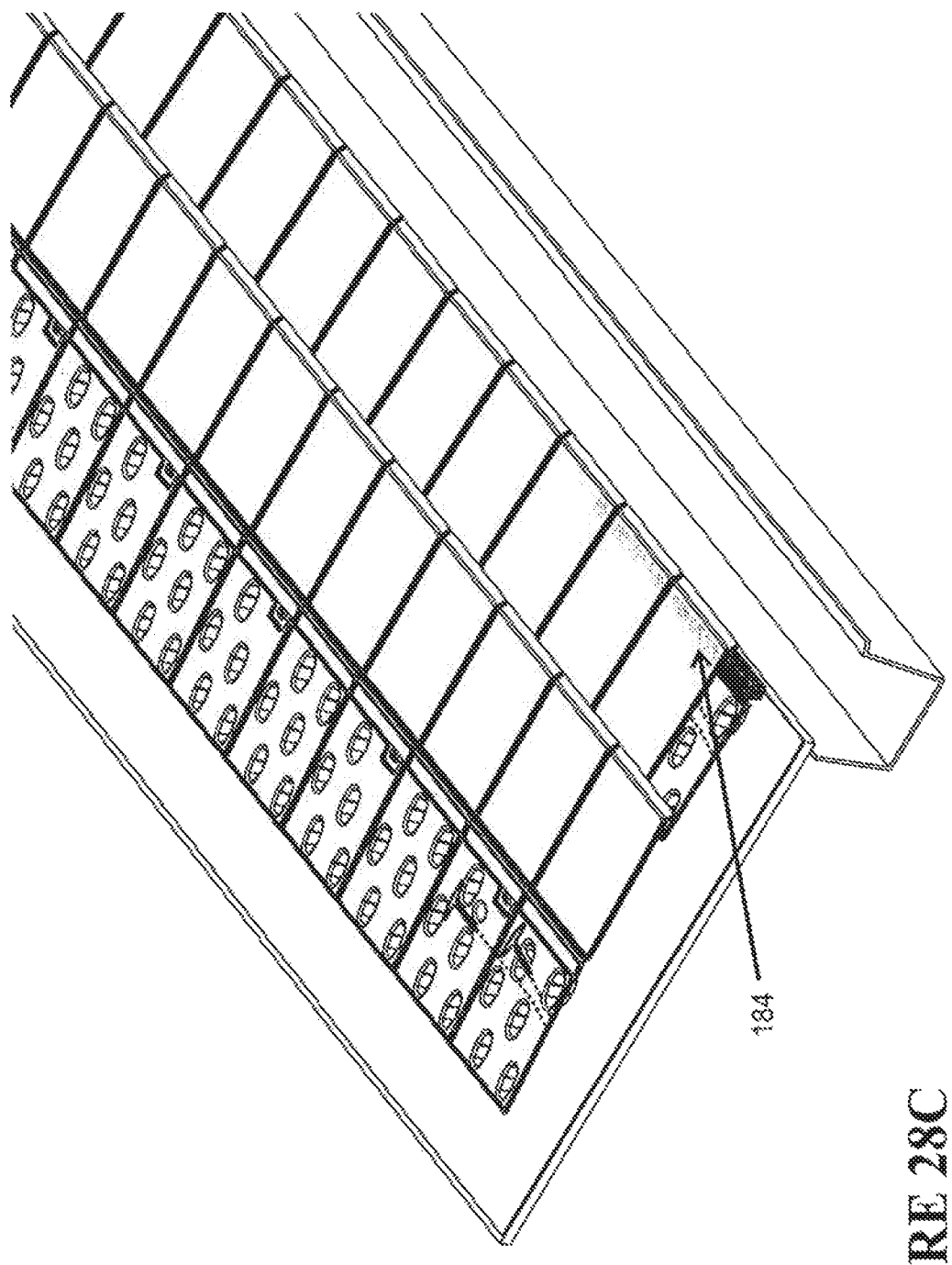

As an example of such a system, FIG. 17 shows a roof assembly involving a series of overlapping shingle modules. FIG. 18A shows an illustrative embodiment of two modules from side on. The roofing underlay, such as a plywood surface and/or a weatherproofing, insulating or highly reflective membrane 171, and the layer of roofing shingle will be slightly set off from the membrane so that there is a gap 181 to allow the passage of an air stream between the two layers. The gap can be maintained by features of shape integral to the shingle module moulding 182 or by additional spacer/standoff components. Thus, the roof assembly forms a single layer on top of the building underlay but the formed features 182 (i.e., the profiled "feet" on the underside of the underlapping region) make the stand-off for the air to pass through. FIGS. 28B and 28C illustrates a tile at the edge of the building surface and shows that a filter 184 can be placed between the tile and the building underlay to allow for the passage of air from the outside into the set off. It is most efficient to force the air in the direction which it would naturally travel as it gets hotter, i.e. from the bottom of the building surface to the top; however alternative embodiments where the air is drawn across the surface may also be conceived. The warm air can then be drawn through inlet spigots 172 near the upper edge of the surface into a central manifold duct 173. The warm air can be exhausted directly to the atmosphere or used elsewhere in the building.

Figure 29:
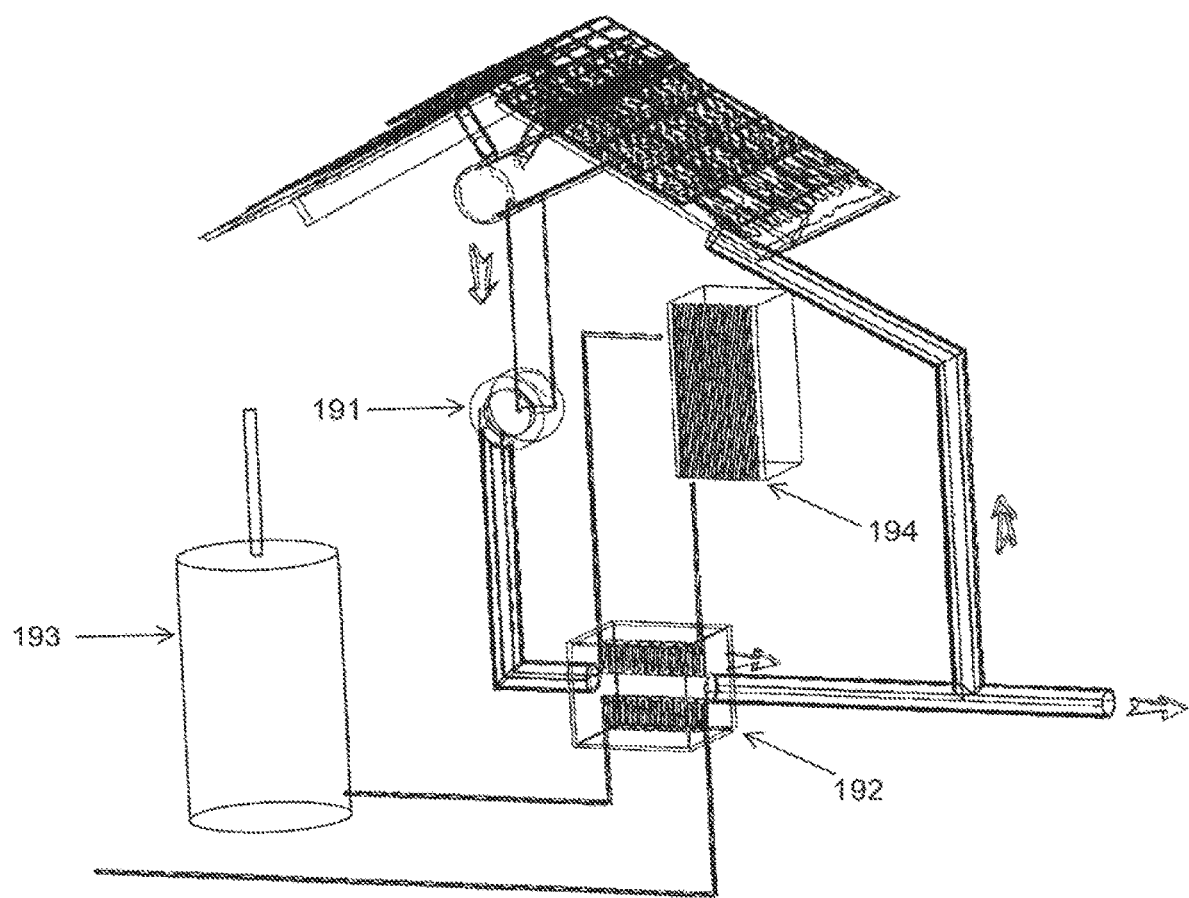
FIG. 29 is a diagram showing how heat recovered from the roofing system can be collected and used.

FIG. 29 shows how the energy from the warmed air can be used elsewhere in the building. A fan 191 can be used to create airflow to pull the air into the manifold duct. The warmed air can then be expelled from the fan and used as the working fluid of a heat exchanger 192 which can be employed as required, for example in water heating 193 or air conditioning 194. Alternatively the hot air can be directly used for heating applications. A flap valve (not shown) may be installed to release hot air from the manifold duct in the event that the fan fails. In some embodiments, the airflow is reversible, such that warm air can be directed from the heat exchanger to the roof in order to, for example, melt snow or ice on the roof, purge residual moisture, or clear dust, dirt, or debris from the system. Different manifolds may also be included to direct warm air from one part of the roof to another depending on the energy need. For example, air may be directed from a sun-exposed portion of the roof to a shaded, snow-covered portion in order to melt snow from that portion. Other variations would be readily apparent to one of skill in the art.

In some embodiments, the speed of the fan is proportional to the thermal energy received in a particular area of the roof. The fan speed can be controlled in a variety of ways, including temperature sensors or timers. In one embodiment, the fan speed is controlled by driving the electric motor using one or more dedicated PV cells on the surface of the roof Thus, the fan control will be directly related to how hot and/or intense the sun is on certain parts of the roof at different times of the day. For example, a building surface may be divided into sections in which separate fans control airflow in each section, e.g. a standard house might have four sections and each would have its own fan which would increase in speed as the intensity of the sun increases on that side of the roof and decrease in intensity as the sunlight intensity decreases. As such, the fans in the different sections will be increasing and decreasing in speed depending on whether the particular section is in full sun or is partially shaded.

In one embodiment, a thermal embodiment of the module can be moulded or profiled with a raised patterning 211 in the underlapping region to define a tortuous pathway above the actual or notional plane. This causes turbulence in the flow of the forced fluid and therefore increases the convective heat transfer from the module to the flowing fluid. As described in detail in the next section, when PV functionalities are included on the module, the feet also provide a passageway for the wiring for electrical connection, e.g. to the PV cells, and allow for the incorporation of electronics into the shingle. The feet may be designed to also provide strength so that if a person walks on the shingle it will not crush or fold under. The feet may also be designed to provide an even airflow across the entire airway space. The feet may also be designed to provide a minimal pressure drop between the air intake and the air outlet. The feet may also be designed to provide for the location and securing of cables and Tee fittings. The feet may also be designed to provide a pathway for the cables and Tee fittings that have minimal obstruction. The pathway for the cables may be vertical, horizontal or diagonal.

Figure 31A:
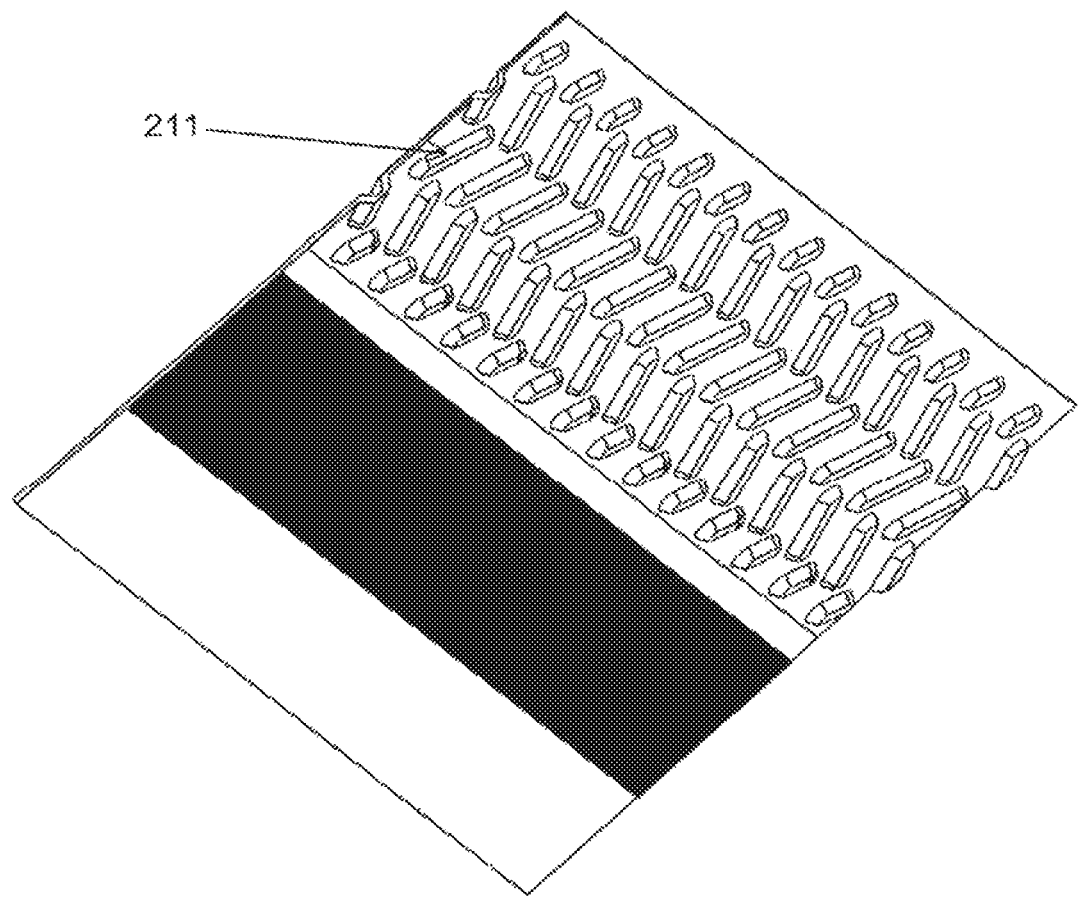
FIG. 31A shows the underside of a module with projection features included to encourage turbulent flow of the underpassing air stream.
Figure 31C:
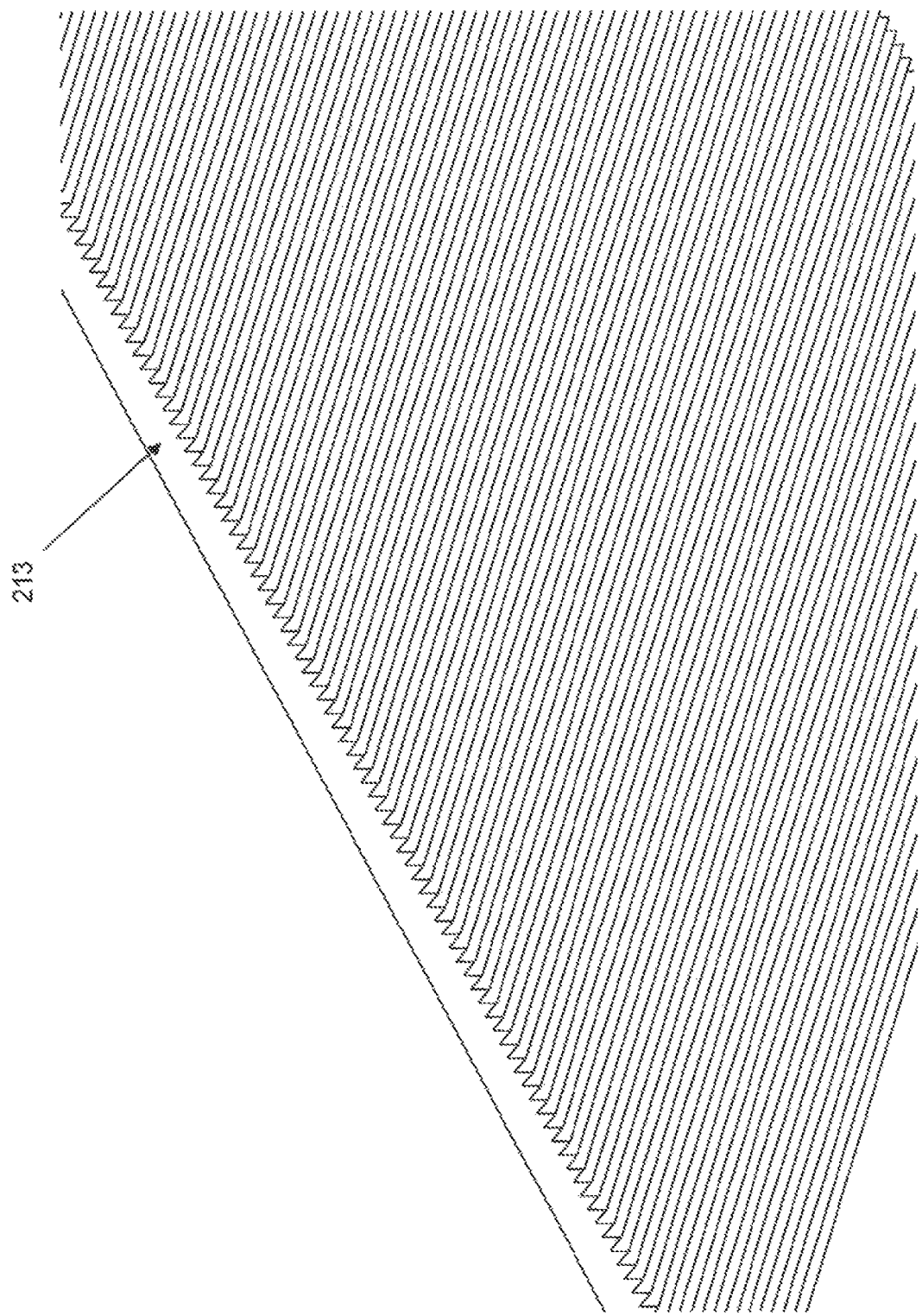
FIG. 31C is a close up view showing the profile of the ribs of FIG. 21B.

There are many different patterns which will achieve this, including the alternating pattern of mesa-like projections shown in FIG. 31. Again the proportion of the shingle which is patterned may vary in comparison to the size of the underlapping region. The projections on the underside of the module need not be the same across the entire width. In one embodiment, the projections decrease in height as one moves across the width of the tile such that there is a taper between the building surface and the underlapping region of the module. Therefore, when an overlapping module is placed on top, it is kept parallel to the building surface. For example, the projections may reduce in size from about 21 mm to about 16 mm as one moves towards the back of the tile to make it easier to fit the overlapping tile and keep the overlapping tile parallel to the building surface. The shape and layout of the projections may also vary.

In another embodiment, the patterning is in the form of a corrugation between the module and the building surface. For example, the module can be moulded into alternating parallel grooves and ridges.

Figure 30:
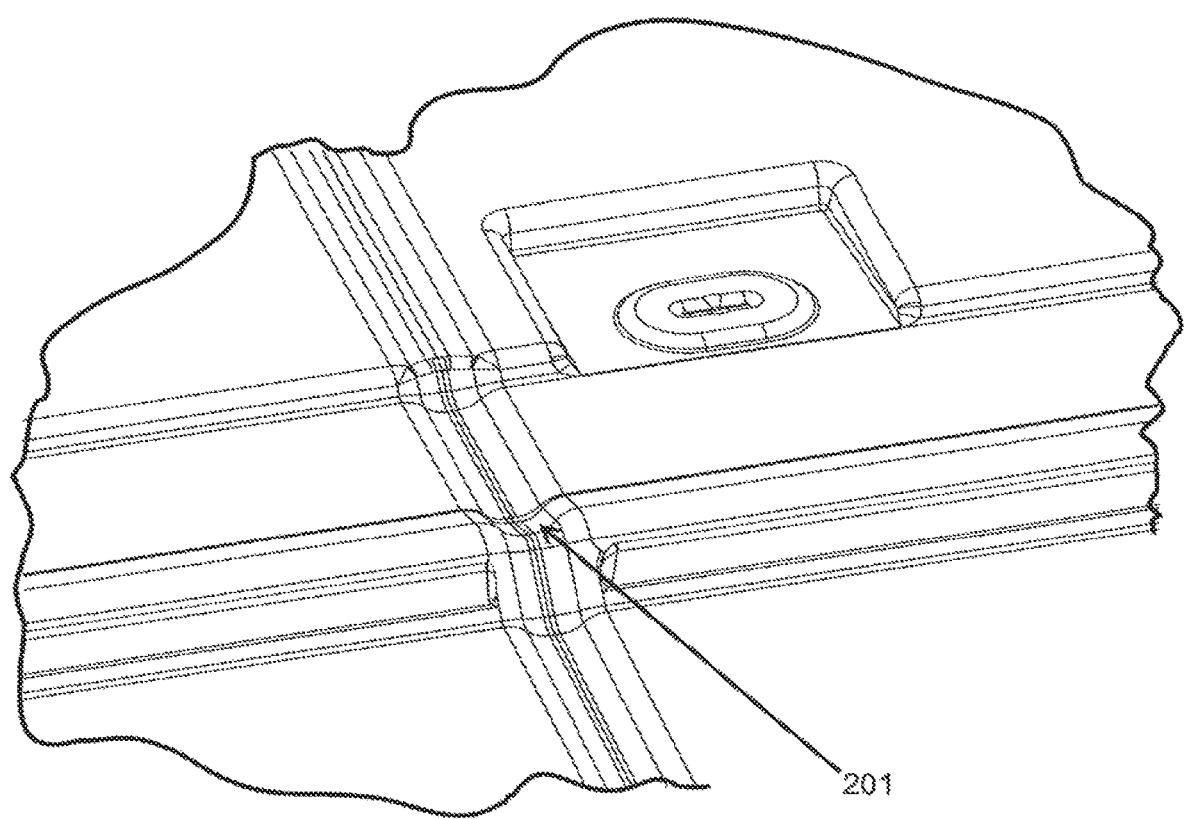
FIG. 30 shows a cross section of a profiled feature moulded as part of the underlapping region of a module.

FIG. 30 shows how the profiles may have chamfered sides 201 or other features of shape to prevent water from gravity pooling in the depressions when the underlying surface on which the product is installed is an angled surface (for example a roof). A series of fine ribs 212 moulded on the underside of the module, or roughened surface texture, could alternatively or additionally be used to create turbulence in the air flow. This will also create more surface area for conductive heat transfer from the module. In some embodiments, the geometry of the ribs or texturing can be chosen to assist in heat transfer. For example, if the texture is, in profile, a series of triangular peaks 213, this will allow more efficient heat transfer to the passing air flow than if the texture is, in profile, a series of square toothed projections.

Figure 32:
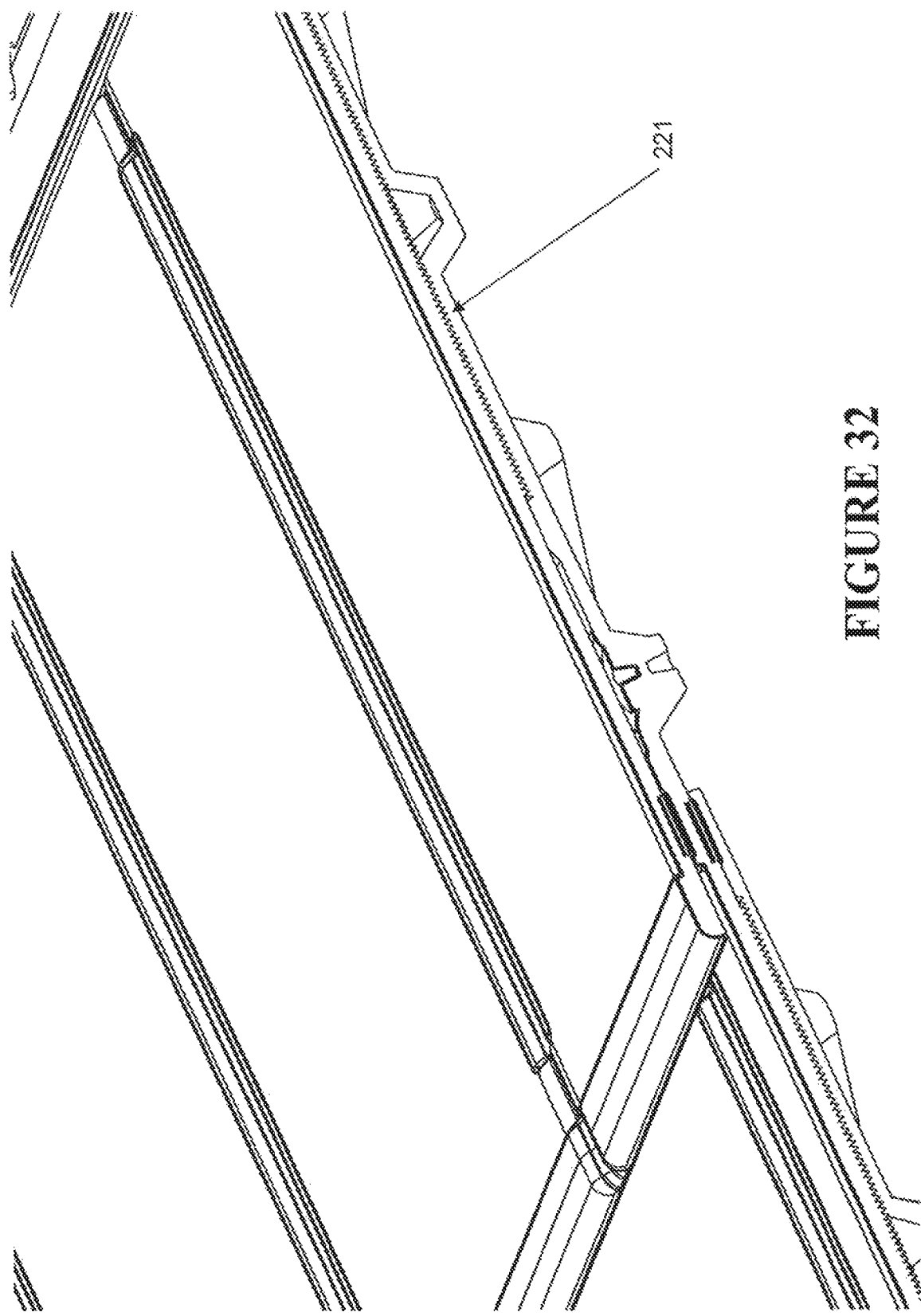
FIG. 32 shows two modules positioned in a lapping arrangement and having complementary surface textures on their respective contact surfaces.

As a further option, the surfaces which come into contact when lapping could have complementary texturing on them to assist their interengagement; for example, as shown in FIG. 32. A thermally conductive paste or adhesive may additionally or alternatively be applied between the contact surfaces to enhance this, or the adhesive strip feature may be thermally conductive or have a thermally conductive component. In one embodiment, the upper and lower surfaces of the under and overlapping modules respectively have a serrated profile 221 capable of interlocking when the modules are in position. The serrations can be shaped so that they "wedge" into each other and exert some degree of compressive force against one another. The surface textures might otherwise be splines, knurls, teeth or undulations of another type. The texturing brings the surfaces into better contact so that there is more surface area to facilitate heat transfer between the lapping modules, and could also be used to aid in locating the modules when they are installed on a building surface.

Although foamed materials reduce the cost and weight of the product, the air inside the foam acts as a heat insulator. This can be advantageous if you want to stop heat from the sun being transferred into the ceiling cavity of the building, but it is not ideal for heat transfer in an energy recovery system. Therefore the thermal embodiment of the roofing and/or cladding product may be adapted to increase its heat transfer capacity. In order to achieve a foamed material with high heat conductivity, thermally conductive particles (e.g. aluminium flakes) can be introduced into a polymer prior to the forming process. The particles help to create a heat pathway through the material and increase the overall thermal conductivity significantly. The particles may also provide structural reinforcement to the material. For example, where a module moulded from polycarbonate may have a thermal conductivity of 21 W/mK, the same module moulded from a loaded polycarbonate blend having 30% aluminium will have a thermal conductivity of 25 W/mK. A module moulded from 3% foamed polycarbonate may have an even lower thermal conductivity of 18 W/mK, but this can be improved to 24 W/mK with the addition of 30% aluminium. The module material can be loaded with the thermally conductive substance prior to the manufacture of the module.

In order to prevent the final product from being too brittle, a compatiblising polymer, such as an ionomer, can be blended with the metal particles changing them from a reactive contaminant to a reinforcement agent with elevated levels of thermal conductivity. It is desirable to have some degree of elasticity to the formed material for use in building product applications.

Figure 33:
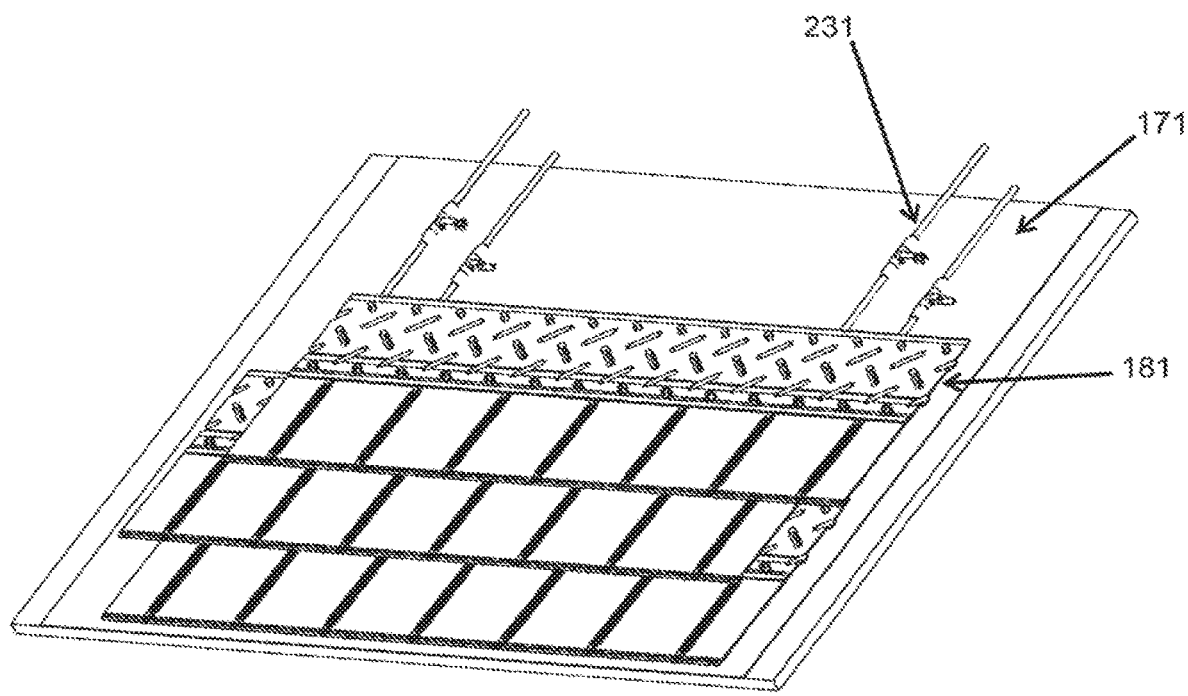
FIG. 33 shows an overlapping series of one embodiment of the module designed to carry a solar array for photovoltaic power generation.

Another embodiment of the roofing and/or cladding product of the current invention is that which is adapted for use in a system to generate electrical energy from solar power. Such products are generally referred to as building integrated photovoltaic products ("BIPV"). As shown in FIG. 33, a series or array of photovoltaic cells may be carried on the exposed region of the module so that they capture photons when installed on a building surface.

Figure 34:
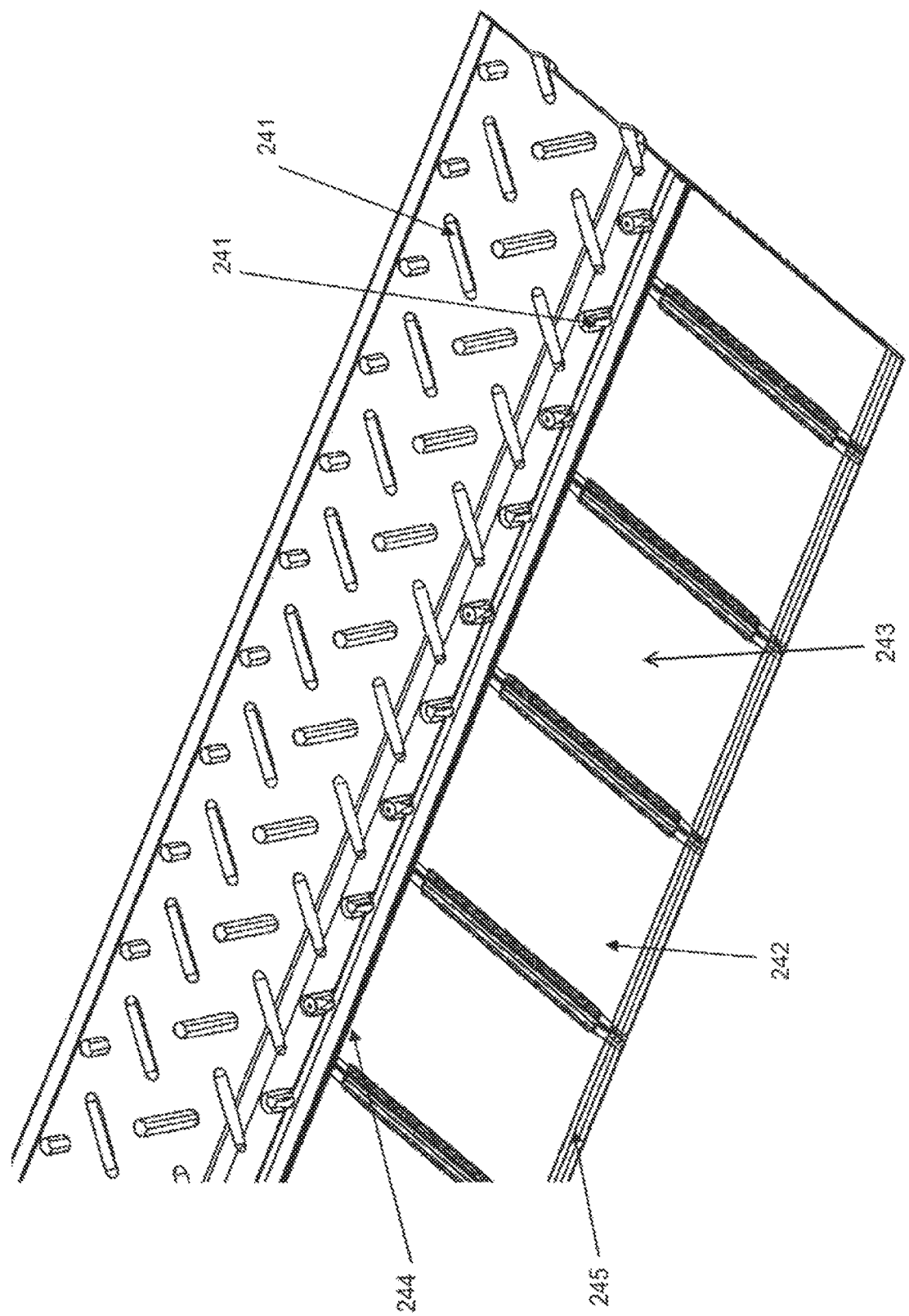
FIG. 34 is a detailed view of the module of FIG. 33.

FIG. 34 shows a more detailed view of an energy generating module, which may comprise one or more moulded material layers 241, a solar array layer of connected photovoltaic cells 242, and an optional transparent surface laminate layer 243. The energy generating module may also comprise bonding/encapsulation/tie layers to the front and/or back of the PV layer and may also contain layers to stop the corrosion of the PV layer e.g. polyethylene, EFTE, etc. On the solar array layer, typically or optionally each of the photovoltaic cells in the row are connected via two bus strips which extend the entire length of the module; one running across the upper edges of the cells 244 and one running across the lower edges 245. The advantage of this is that the bus strips contact all of the cells so that only a single electrical junction for each module need be connected to a main power take-off on installation. A further option is to have the bus strip material integrally moulded into the substrate panel during the forming process.

Figure 21B:
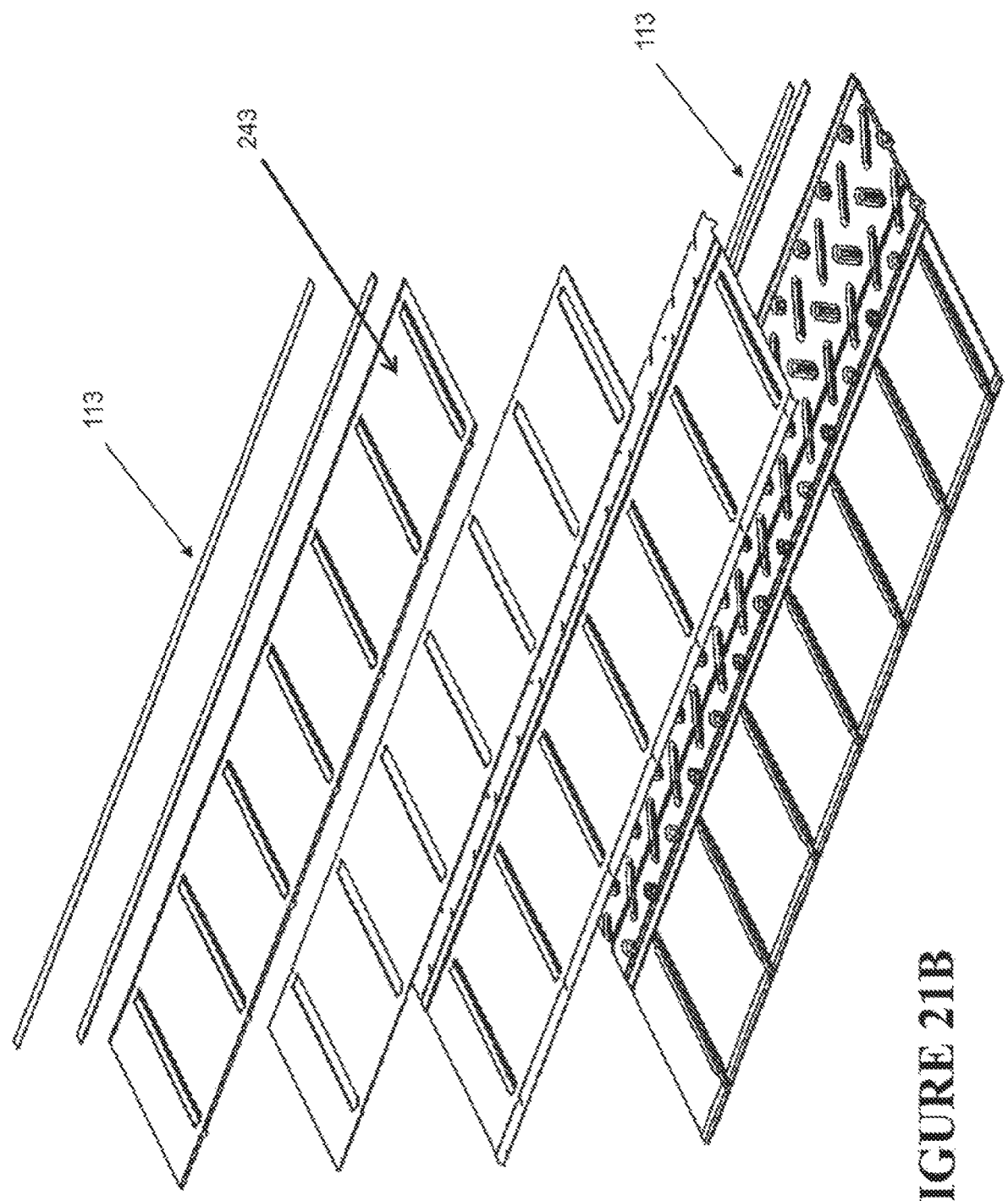
FIG. 21B shows an exploded view of the module of FIG. 21A.
Figure 35:
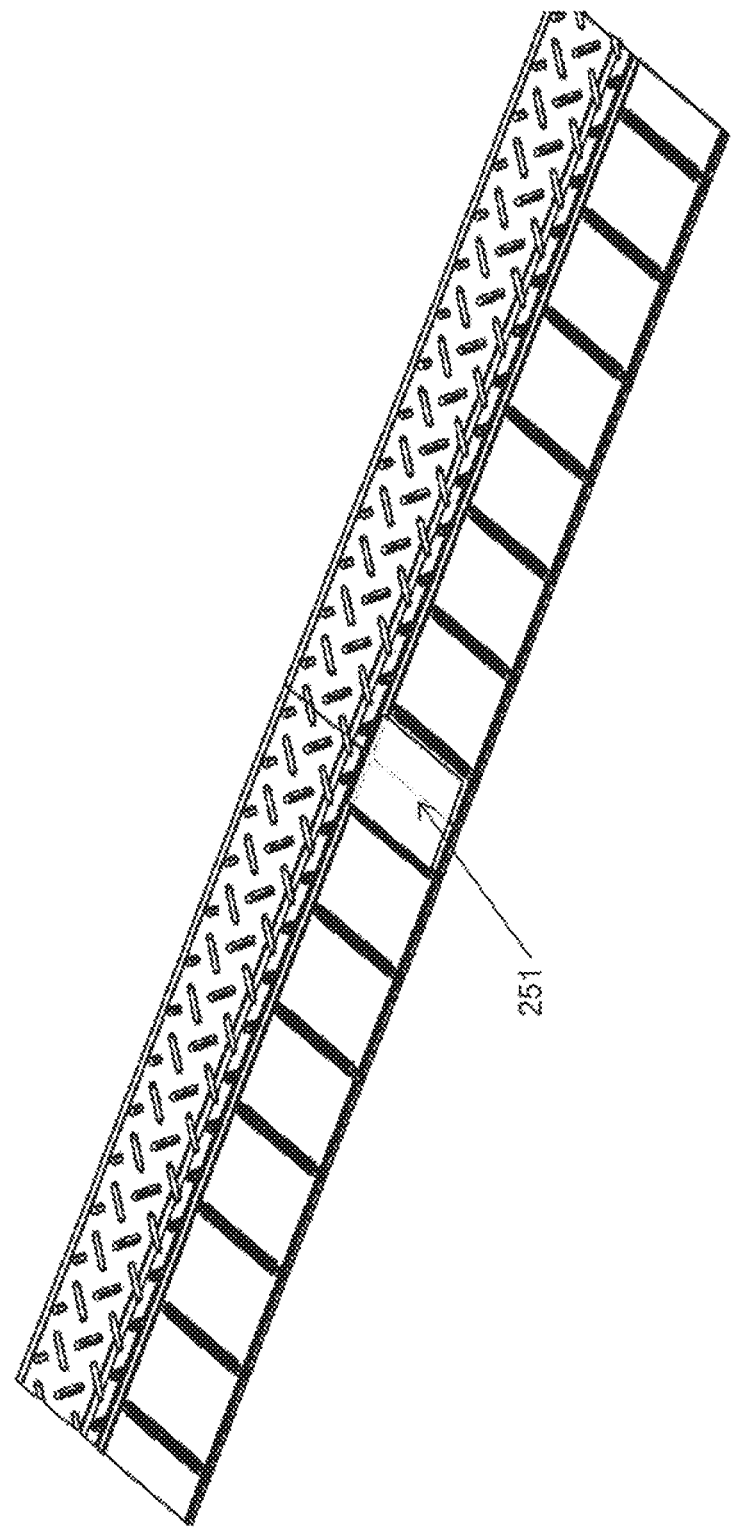
FIG. 35 shows a method of endwise joining two modules with an overlaid solar panel secured across the joining region.

FIG. 21B shows an exploded view of all of the layers of an illustrative BIPV product. The transparent laminate 243 is over a solar array layer of connected photovoltaic cells 242, which is over a moulded material layer 241. The release sheet 113 of an adhesive strip 121 are also shown. Optional adhesive, tie, or bonding layers (not shown) may be added to the surface of any of the layers.

Where it is necessary to join two modules across the width of a surface (i.e. the electrical join is not at the main power take-off junction, but between two modules), the method shown in FIG. 35 can be used. The modules may be positioned end on end and then an extra cell 251 can be placed over the discontinuity to create an electrical connection between the modules while also visually concealing the physical join line for improved aesthetics.

Figure 40:
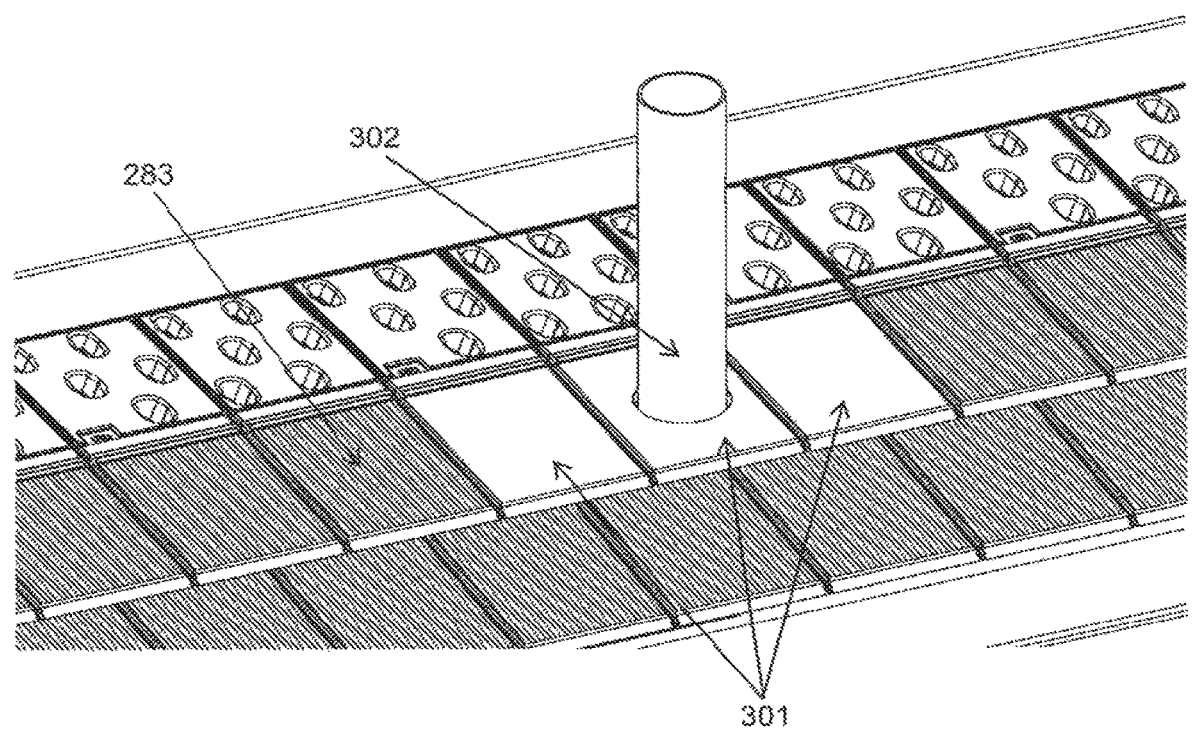
FIG. 40 shows a "dummy" module positioned in a lapping arrangement with a cutout for a pipe emerging from the building surface. BIPV modules are shown on either side of the "dummy module".

The BIPV system may incorporate one or more "dummy" cells at various locations across the surface of the roof. In a suitable embodiment, the dummy cells will look identical to the rest of the PV cells but will have no functionality. Because the dummy cell is not active, it can be cut to fit the shape/space required and can be penetrated safely if necessary. As shown in FIG. 40, two "dummy" modules 301 are positioned in a lapping arrangement with a cutout for a pipe 302 emerging from the building surface. BIPV modules 283 are shown on either side of the "dummy module. In addition, dummy cells may be positioned at the ends of the building surface or may be positioned at predetermined locations to provide for the installation of various building features (satellite receivers, antennas, pipes, etc.). One advantage of the dummy cells is that they age identically to the rest of the PV cells and therefore the entire roof surface maintains consistent aesthetic features over time. In some embodiments, the dummy cells may be scribed with markings that indicate that these cells can be safely penetrated, e.g., for the installation of hardware or for fire safety.

The modules may be suitably joined by an overlapping module (for weatherproofing) or an adhesive pad which extends across the join and contacts the underside surfaces of both modules. It may also be necessary to add a similar adhesive pad to the top side surfaces, or to smear the reverse side of the joining cell with an adhesive paste to secure the join.

Figure 36A:
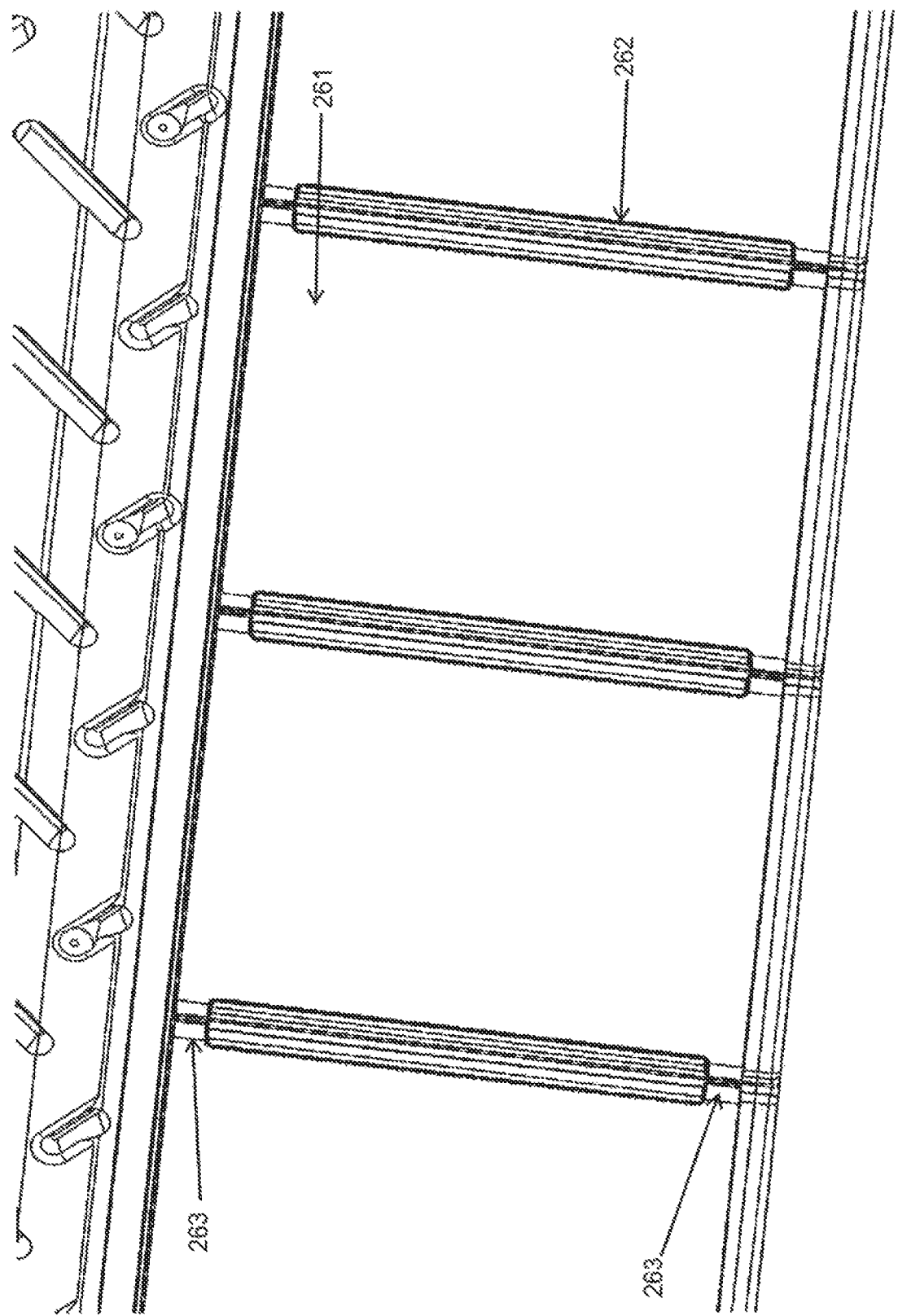
FIG. 36A shows the detail of the relief features on the surface of the building integrated photovoltaic embodiment of the module which are designed to locate a series of electrically connected photovoltaic cells.

While the PV cells could simply be placed on any top surface of a module, in some embodiments the module is formed with a number of relief features on its upper surface to locate and register the PV cells. These can be more clearly seen in FIG. 36A. There are recessed panels or pockets 261 in the cell bearing portion of the shingle modules which locate each individual cell, and these are separated by raised or recessed channels 262. The channels create the impression of "tiled" roofing, and generally add to the aesthetics of the product. Regions at the top and bottom of the channels 263 provide space for the bus strips to pass through between each pocket. It may be desirable that these regions are less raised or lowered than the other parts of the channel so that the bus strip does not have to be bent excessively when it is adhered to the contours of the module substrate.

The exposed portion of the solar cell carrying module may be profiled with two (or more) rows of pocketing so as to accommodate two (or more) rows of solar cells upon a single module. In such a case there will provision to locate a set of bus strips for each row, or the profiling may provide for the location of a shared bus strip(s) to be positioned between the rows.

Figure 36B:
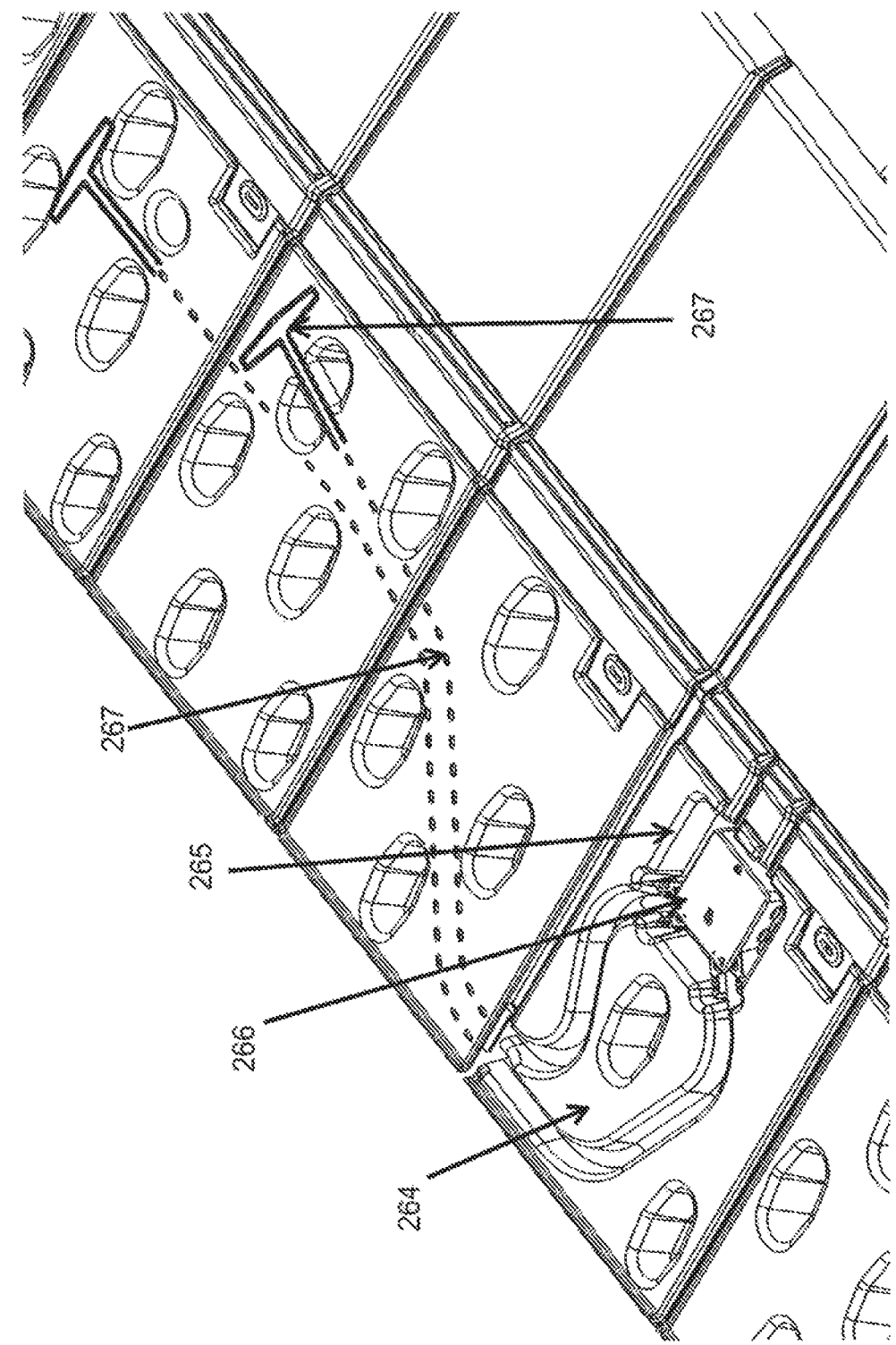
FIG. 36B shows the detail of the channels configured to receive cables or wires of the photovoltaic array cavities configured to receive junction boxes. This figure also shows surface marking to indicate the location position of the underlying electrical fittings and connections.

The modules may be molded to accommodate various components of the photovoltaic system. For example, as shown in FIG. 36B, the upper surface of the underlapping region may include channels 264 configured to receive cables or wires of the photovoltaic array. Moreover, the upper surface of the underlapping region may also include formed cavities 265 configured to receive junction boxes 266, printed circuit boards (PCB), communication devices, cables, wires, buses, components, cells, or diodes, and the like of the photovoltaic array. Thus, the modules may contain all of the hardware and software required to connect and regulate the PV cells. Because there are no penetrations between the two overlapping modules, the assembly can be completely waterproofed. Furthermore, the upper surface of the exposed region may contain scribings or markings, such as an impression or line corresponding to the molded cavities, thus informing an installer or repair person that various components are located in the space below. The upper surface of the underlapping region may also include formed markings 267 to indicate the correct location of wires and Tee connections for wires, that are located in the pathway for airflow 181 underneath the underside of the underlapping region.

With the modules installed as shown in FIG. 33 most of cell bearing portion of the module is exposed while the rest of the module, including the fixing region and fastening means is completely covered by neighbouring modules. This enables maximum power generation but still provides some degree of protection for the fastenings to reduce their rate of degradation and corrosion. The upper electrical bus strip is also protected by the front edge of the overlapping panel for both weather and aesthetic reasons. Furthermore, because there are no penetrations that traverse the entire thickness of the roofing material, this product overcomes the limitations of existing solar products, which penetrate the roof membrane with bolts, screws, or nails that must be caulked and can leak. Wires 231 can also run between the bottom of the module and the weatherproof underlay without penetrating the underlay (as shown in FIG. 33).

Figure 37:
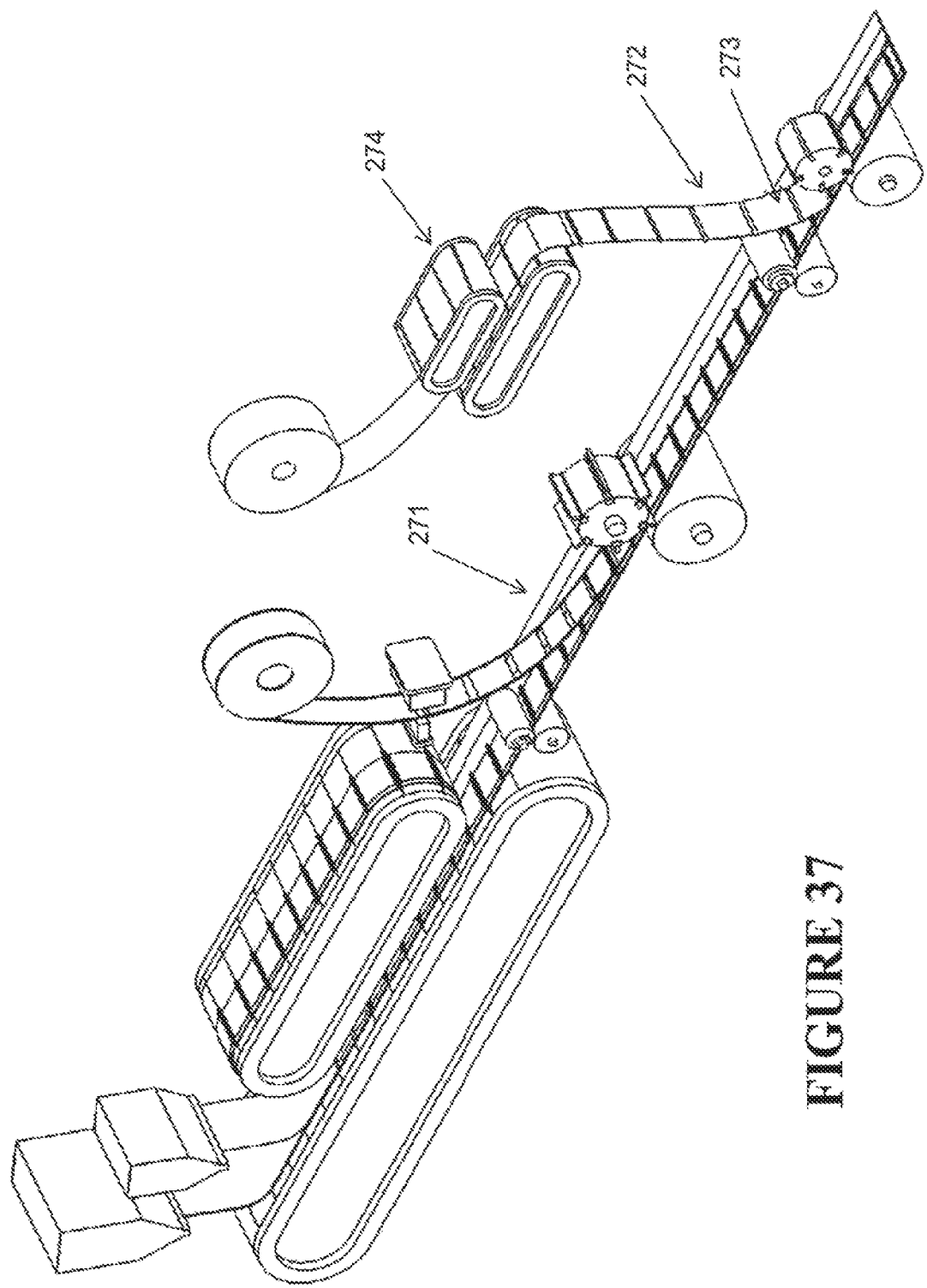
FIG. 37 shows diagrammatically a continuous forming apparatus contemplated as providing for the continuous forming of modules and lending itself to the online introduction downstream of a photovoltaic functionality system.

The process by which the solar version of the roofing product can be continuously manufactured is shown in FIG. 37. The first, second and third steps of preparing, presenting and forming the module are the same as those described previously, however the fourth step 271 is the application of the solar array and the optional fifth step 272 is the application of a laminate layer over the solar cells which may have bonding between layers or adhesive layers between them.

Once the module has been formed the PV cells can be deposited on top in such a way as to be located by the relief features on the upper surface. FIG. 37 shows the PV cells being fed onto the substrate from a continuous roll feed. In this case the upper and lower bus bars would need to be associated with the cells in a prior step to form the roll. Another option is to deposit the cells individually into the pocketed relief features of the substrate and to subsequently apply the bus bars (possibly separated by a spacing web) from a separate roll feed. Yet another option is to feed the bus bars onto the substrate and then overlay the solar cells.

An optional step is to apply a transparent laminate 273 to protect the cells. It is convenient to pre-form (also by continuous moulding 274) and apply the laminate in-line, as shown in FIG. 36, so that the addition of this layer can occur without any increase in the overall production cycle time. This can be laminated with some degree of electrostatic or adhesive binding to increase adhesion. While a variety of materials may be suitable as the laminate, a suitable material is fluoropolymer. Ethylene tetrafluoroethylene (ETFE) is an example of an appropriate fluoropolymer, but other polymers able to remain optically transparent may also be used. The fluoropolymer creates an essentially "self cleaning" top surface so that performance of the PV cells is not inhibited by deposits of dirt and debris. Fluoropolymer is also very stable in ultraviolet light and usually retains its light transmitting capacity for longer than glass, which is another commonly used material in PV applications. It is preferable to choose a material which would be able to maintain light transmission during long periods (approximately 10-25 years) of environmental exposure. The laminate is applied also over region 117 to cover parts of the panel which are not directly exposed to light but which will receive reflected light. This laminate also gives superior durability to the exposed outer area of the panel and may be used even without PV cells to provide greater long term durability.

Figure 38:
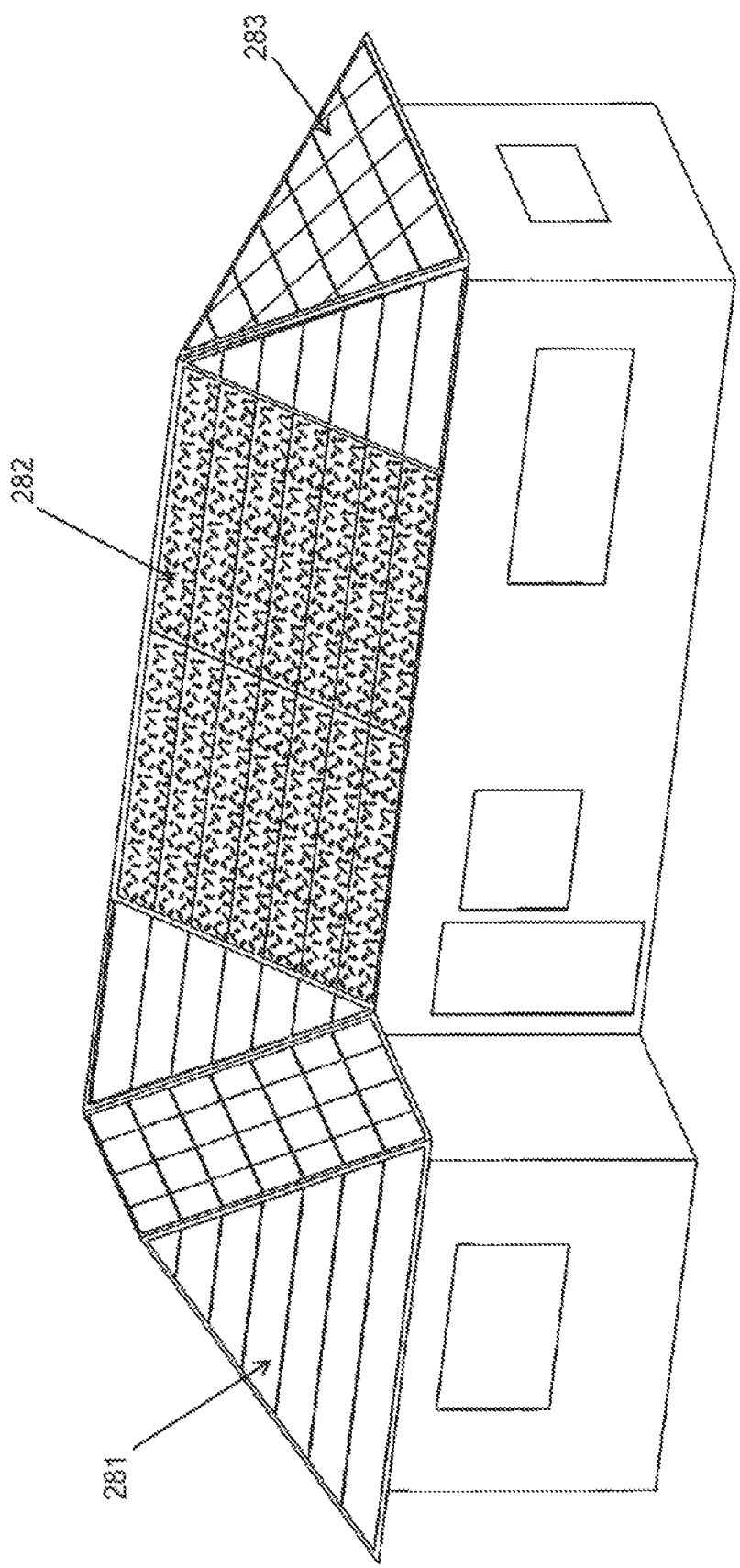
FIG. 38 shows a building on which various embodiments of the current invention have been installed.

In another aspect, the present invention provides a building integrated photovoltaic system which allows combined solar, ambient and solar-generated heat to be collected and directed away from a building surface and optionally used elsewhere. For instance, the photovoltaic cells of the energy generating module could heat up during operation. As well as potentially causing the interior of the building to heat up as a result, the cells will also perform less efficiently as they grow hotter. A further issue is that the material around the cells will tend to expand due to the heat and this can generate stresses and/or movement that may eventually lead to product failure. Therefore, there is an added advantage in combining the features of the BIPV product with those of the thermal product, and using the hybrid module as part of a system which generates electrical energy while also allowing heat energy to be transferred away from the solar cells, recovered, and put to use as desired. FIG. 38 shows a building on which the non-energy harvesting product 281, the thermal product 282 and the BIPV product 283 have all been installed at different regions of the same building according to energy and cooling requirements.

Exemplary embodiments of roofing are now described comprising interconnected roofing components carrying PV cells and inverter (power conversion) modules that electrically couple the PV cells together using wireless power transfer and provide DC to AC or AC to DC conversion for power transfer between PV cells and the AC grid.

Figure 41:
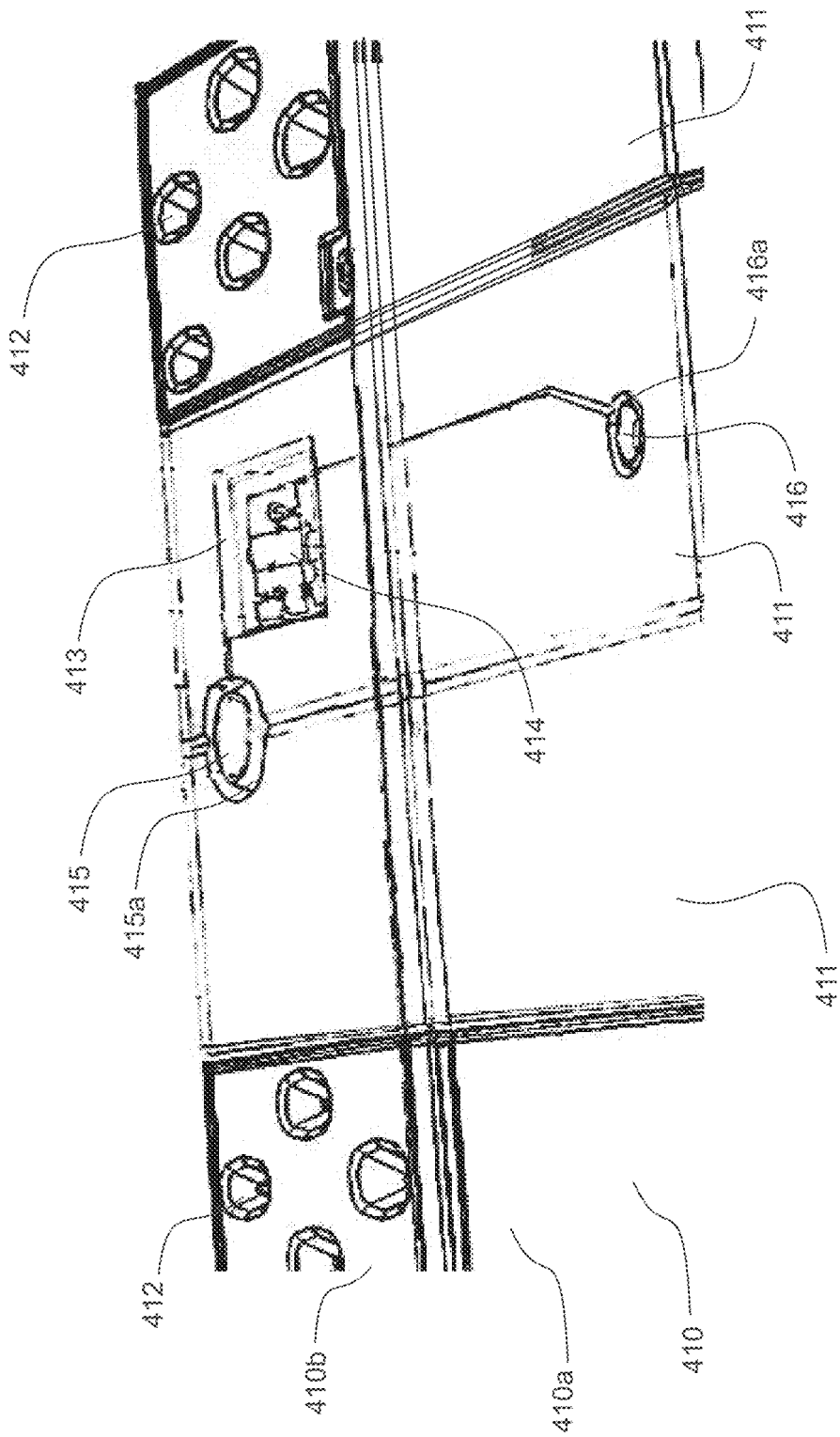
FIG. 41 shows a roofing shingle with formed features, local and remote coil recessed mouldings and a recess for a power conversion module.
Figure 42:
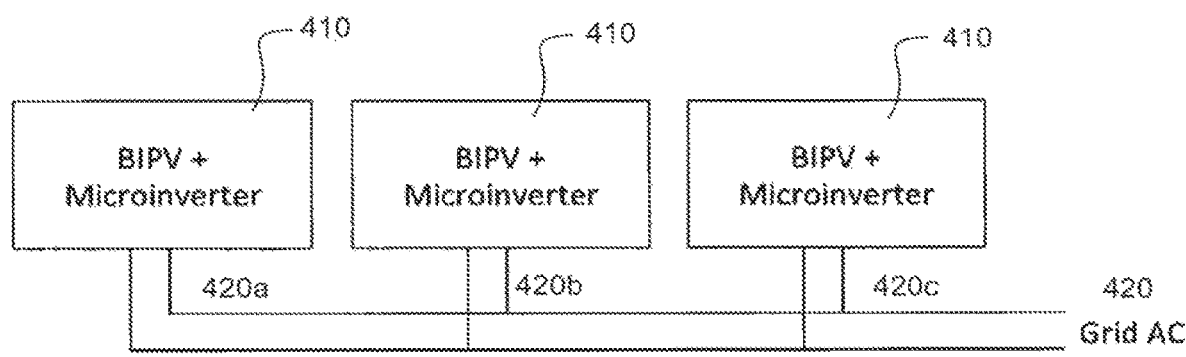
FIG. 42 shows a block diagram of a system with multiple shingles comprising power conversion module is coupled to an AC grid.

FIG. 41 shows a first embodiment comprising a (portion of) run of a roofing panel (shingle) 410 similar in nature to one described previously. Note, in FIG. 41, only a portion of the run is shown—the full run is longer—see e.g. FIG. 58 later. The shingle 410 comprises an overlapping portion 410a with regions e.g. 411 for carrying a plurality of PV cells (not shown, but installed and coupled with electrical connections in a manner as depicted and described previously), and underlapping portion 410b with formed features (e.g. feet or protrusions 12) on the underside of the shingle 410 to provide for airflow between shingles as described previously. The underlapping portion 410b also comprises a recess 413 or similar for housing a power conversion module 414. FIG. 42 shows in block diagram form how multiple shingles 410 such as that shown in FIG. 41, each with a power conversion module 414, are connected 420a, 420b, 420c to the AC grid via a bus 420 or similar to transfer the power from the PV cells on each shingle to the AC grid. Three shingles are shown in the FIG. 41 but it will be appreciated a large number of shingles could be coupled to the bus 420 as shown. The power conversion module 414 (such as a microinverter) housed within each shingle 410 converts the DC current of the PV diodes in the BIPV shingle into AC current that is ready for the power supply grid.

Figure 43:
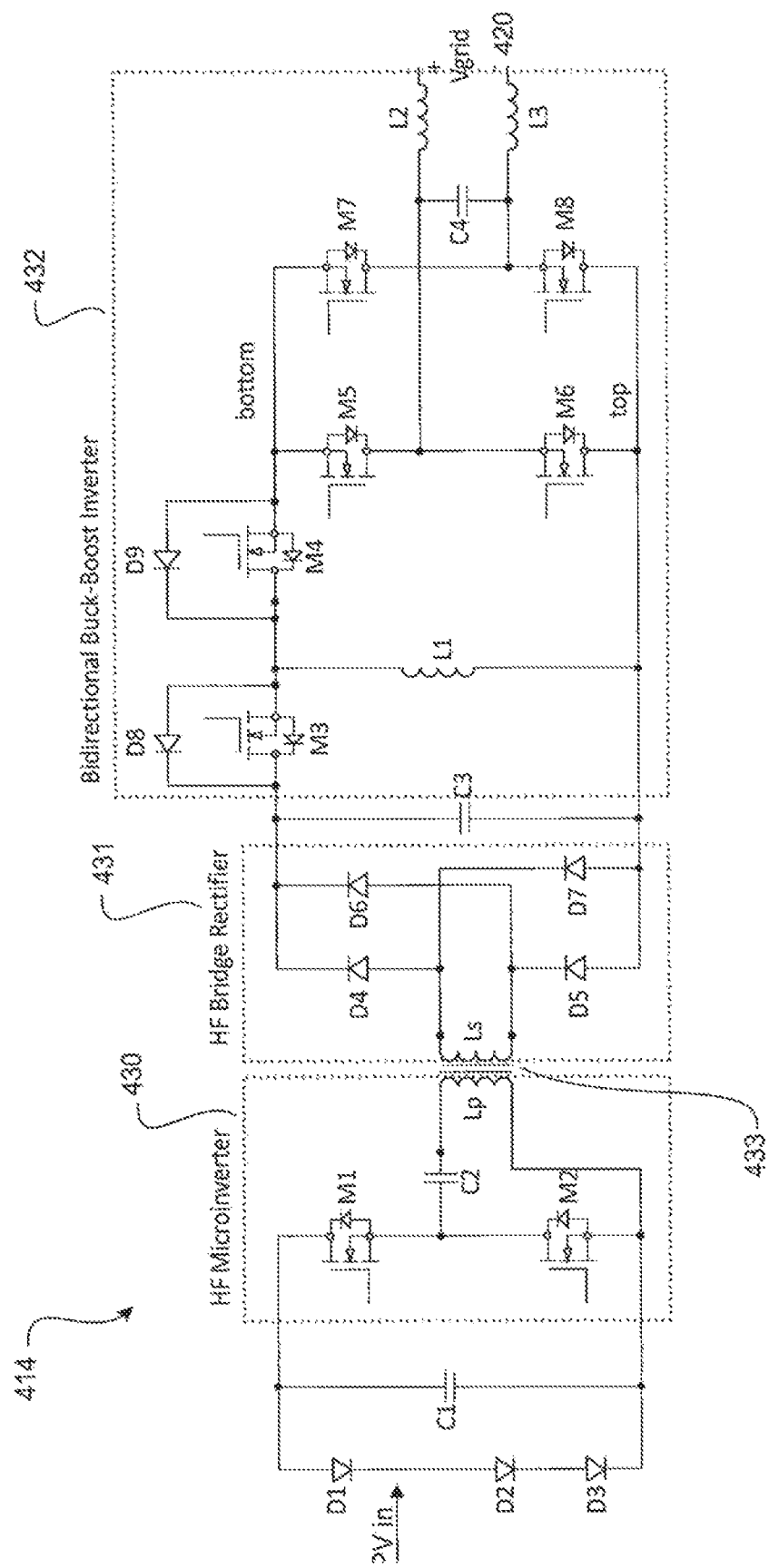
FIG. 43 shows a circuit diagram of a power conversion module used in the arrangement of FIG. 42.

FIG. 43 shows the circuit an example of a power conversion module 414 for each shingle 410 that is disposed in the moulded recess 413. The power conversion module comprises a high frequency microinverter 430, high frequency bridge rectifiers 431 and buck-boost inverter 432. The microinverter on each shingle 410 is powered either locally through the DC current from the PV cell diodes (D1 to D3) or off the AC current that is available on the power supply grid 420. Irrespective of how it is powered, each high frequency microinverter 430 is coupled to the output of the PV cells on the shingle 410 to receive the voltage/current from the PV cells. The DC current from the PV diodes D1-D3 in the shingle 410 is connected to the high frequency microinverter running at a higher frequency than the grid, for example in a range of 10 kHz-200 kHz. Two transistors (M1, M2) are switched such that an AC current is induced through capacitor C2 and inductor Lp at the centre of the inverter 410. Capacitor C2 and inductor Lp are designed such that zero-voltage switching is achieved in transistors M1 and M2 for lower switching losses and improved efficiency. Inductance Lp forms the primary coil in a transformer. This inductance can be implemented as a wire going out to a local coil section/recess moulding of the shingle (to be described below) and returning back to the integrated power conversion electronics area. The leakage inductance contributed by this wire going out to the coil section is used advantageously to form a resonant circuit with capacitor C2 and inductor Lp such that zero-voltage switching is achieved. Alternatively, this inductance is the primary coil of an integrated power transformer 433 in the circuit board of the power conversion module. Additional leakage inductance is introduced to integrated power transformer 433 by means of gapped magnetic cores or spaced windings to form a resonant circuit with capacitor C2 and inductor Lp such that zero-voltage switching is achieved. C2 connected in series with Lp and the leakage inductance of the transformer is designed to form a resonant frequency at the designed high frequency of the microinverter. Magnetic field induced by coil Lp is coupled into a parallel coil Ls located within a local coil section/recess moulding on the shingle 410 (to be described below) or alternatively, can be the secondary coil of an integrated power transformer 433 in the circuit board of the power conversion module.

The secondary coil Ls forms part of the high frequency rectifier 431 that converts the high frequency AC current into a DC current that flows into C3. This high frequency rectifier is also housed in the same integrated power conversion electronics module. High frequency microinverter 430 and high frequency bridge rectifier 431 form a DC to DC voltage converter that converts a voltage level from PV diodes D1-D3 to a voltage level across C3. The gain of this voltage converter is adjusted during operation of the microinverter by adjusting the frequency of the signal driving high frequency microinverter 430.

The final bidirectional buck-boost inverter 432 converts the DC voltage on capacitor C3 into an AC current that is synchronised with the phase of the AC signal of the power supply grid. The buck-boost topology enables both step-down and step-up capability which gives flexibility in generating an output AC voltage that is compatible with multiple power supply grid systems (110, 240, 208 VAC). This step-down and step-up capability also supports larger voltage ripples across capacitor C3 that is used advantageously to reduce the capacitance of capacitor C3 and minimize the volume and cost of this capacitor. The bidirectional capability of this inverter allows current delivery to the grid as well as current sourcing from the grid. This feature is used to ensure phase alignment with grid voltage. In another embodiment, this bidirectional capability is used to provide programmable phase correction capability where the phase of the AC current delivered to the grid is advanced or retarded with respect to the grid AC voltage to compensate for capacitive or inductive loads present at the installation. The buck-boost inverter 432 is operated either in discontinuous current mode, boundary current mode or continuous conduction mode, depending on output current requirements. The discontinuous and boundary mode operation modes require smaller inductance values for a similar power conversion capability compared with continuous current mode.

Both of these modes require the current in inductor L1 to return to 0 at the end of every switching cycle. This condition is monitored by measuring current through L1 using series current sense transformers or Hall effect current sensors. In another embodiment, magnetic fields induced through inductor L1 are coupled onto a secondary coil that is used to sense the current flowing through. In another embodiment, the buck-boost inverter is operated purely in discontinuous mode and therefore no current sensing through inductor L1 is necessary.

During current delivery mode, the buck-boost inverter alternates between two phases of operation. In the first phase, transistor M3 is turned on and transistor M4 is turned off. This causes energy storage as magnetic fields in inductor L1 as well as an increase in the current flowing through inductor L1. In the second phase, transistor M3 is turned off while transistor M4 is turned on. Energy stored in inductor L1 is delivered to the grid, resulting in a gradual decline in the current flowing through inductor L1. Transistor M4 is turned off by the control circuit when the current in inductor L1 returns to 0. In another embodiment, transistor M4 is kept off during the second phase. Current is delivered to the grid through the body junction diode present in transistor M4. This diode automatically stops conducting when the current flowing through inductor L1 returns to 0. Diode D9 is optional and might be necessary to reduce reverse recovery losses through the parasitic body junction diode in transistor M4.

During current sourcing mode, the buck-boost inverter alternates between two phases of operation. In the first phase, transistor M4 is turned on and transistor M3 is turned off. Current flows from the grid into inductor L1 and is stored as magnetic fields. The current flowing through inductor L1 also gradually increases. In the second phase, transistor M4 is turned off while transistor M3 is turned on. Energy stored in inductor L1 is delivered to capacitor C3, resulting in a gradual decline in the current flowing through inductor L1. Transistor M3 is turned off by the control circuit when the current in inductor L1 returns to 0. In another embodiment, transistor M3 is kept off during the second phase. Current is delivered to the grid through the body junction diode present in transistor M3. This diode automatically stops conducting when the current flowing through inductor L1 returns to 0. Diode D8 is optional and might be necessary to reduce reverse recovery losses through the parasitic body junction diode in transistor M3.

Transistors M5, M6, M7, and M8 form a voltage commutator. These transistors are switched, based on the phase of the AC voltage on Vgrid, such that the voltage at node top is always greater than the voltage at node bottom.

Inductors L2, L3 and capacitor C4 form a reconstruction filter that filters out the high frequency switching in the buck-boost inverter and produces a 50 or 60 Hz AC current with minimal harmonic distortion. The output Vgrid is coupled to the AC bus 420 and grid via suitable electrical connections.

The transformer formed from inductors Lp/Ls provides galvanic isolation between the high frequency microinverter 430 and the high frequency bridge rectifier 431/Buck Boost inverter 432 that is coupled to the AC grid. The inductive coupling of coils produces a transformer enabling galvanic isolation of power controls from the utility grid, load or battery. The transformer also provides energy storage to buffer fluctuations due to the AC waveform. Referring back to FIG. 41, the underlapping region 410b of each shingle 410 comprises a local coil moulded recess 415 for carrying the inductors that form the transformer 433 (e.g. Lp/Ls in circuit 430, 431 FIG. 43).

Figure 44:
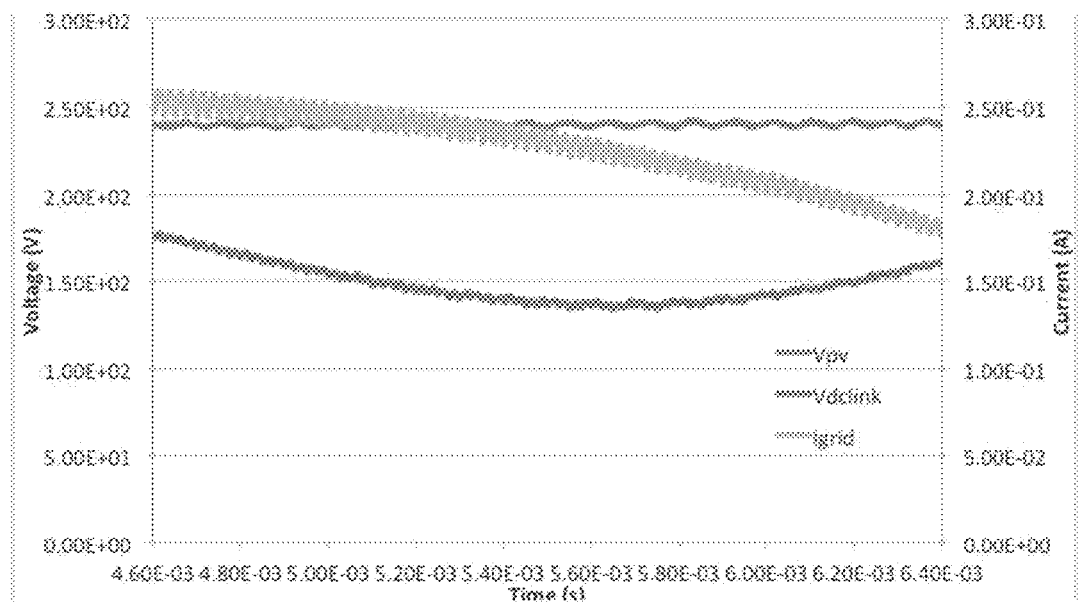
FIG. 44 is a graph of currents and voltages in the power conversion module.

FIG. 44 plots the voltages and current observed at some nodes in the corresponding schematic in FIG. 43. The high frequency microinverter has an internal feedback loop that ensures the output voltage of the PV diode is at the maximum power transfer voltage. On the other side of the microinverter, an AC current (green waveform) is being fed into the power supply grid that matches the phase of the AC voltage on the grid. The fluctuation in AC current or energy being fed into the grid as the grid voltage cycles through the AC waveform results in a voltage on C3 that fluctuates over the AC cycle (red waveform). C3 therefore forms an intermediary energy reservoir for the DC to AC conversion between PV diode and power supply grid.

Figure 45:
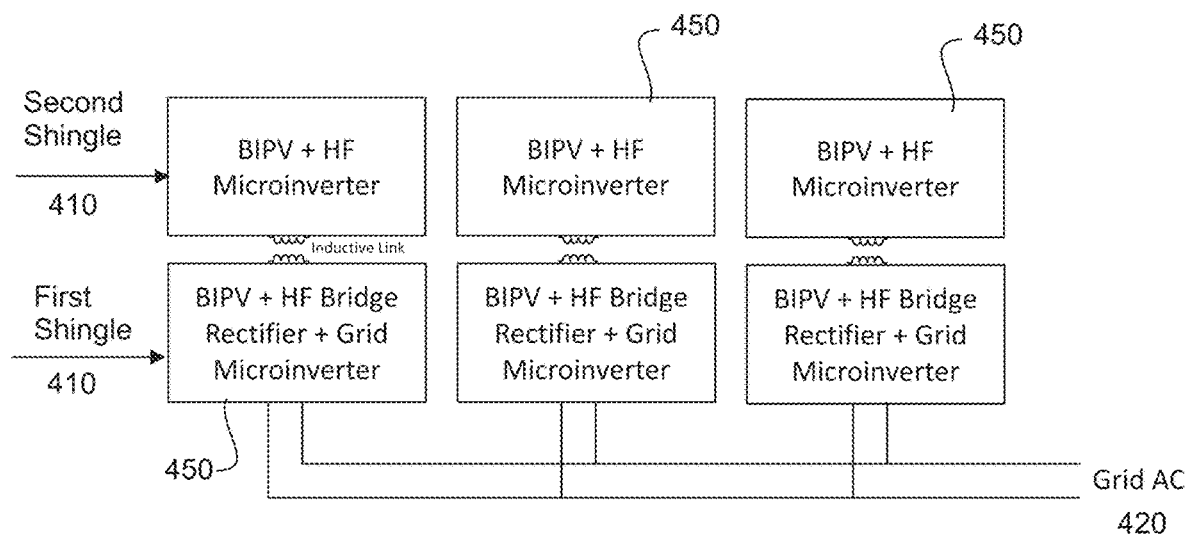
FIG. 45 shows a block diagram of a system with multiple shingles interconnected using inductive power transfer and comprising power conversion module is coupled to an AC grid.

FIG. 45 is a block diagram of a roofing system according to another embodiment with a plurality of shingles 410 like that in FIG. 41/42 but adapted to use wireless power transfer to combine and output power from the PV cells on multiple interconnected shingles 410. A second BIPV shingle 410 converts the DC current of the local PV diode into a high frequency AC current using a HF microinverter 430. This second BIPV shingle 410 transfers power inductively into a high frequency bridge rectifier (see FIG. 47) present in the first BIPV shingle 410. This high frequency AC current is converted to a DC link voltage using a high frequency rectifier 431 before conversion into AC current compatible with the power supply grid 420. Each first and second shingle 410 form a set 450, and there are multiple first/second shingle sets on a roof, all feeding into the AC grid 420.

Referring back to FIG. 41, each shingle is further adapted to enable wireless power transfer coupling of the power generated in the PV cells of one shingle 410 to another shingle 410 for ultimate transfer to the AC grid 420 to implement the block diagram of FIG. 45. The underlapping region 410b of each shingle 410 comprises a local coil moulded recess 415 for carrying a local coil 415a (e.g. Ls in circuit 430, FIG. 47) that forms part of a wireless power transfer (in this case inductive power transfer) circuit; and the shingle overlapping region 410a comprises a remote coil moulded recess 416 for carrying a remote coil 416a (e.g. Lp in circuit 470, FIG. 47) that forms part of another wireless power transfer (in this case inductive power transfer) circuit. The local coil moulded recess can also carry the other inductor of the transformer 433 as described previously. Therefore, the local coil moulded recess can perform the dual function of carrying conductors for wireless power transfer purposes and transformer purposes.

Figure 46:
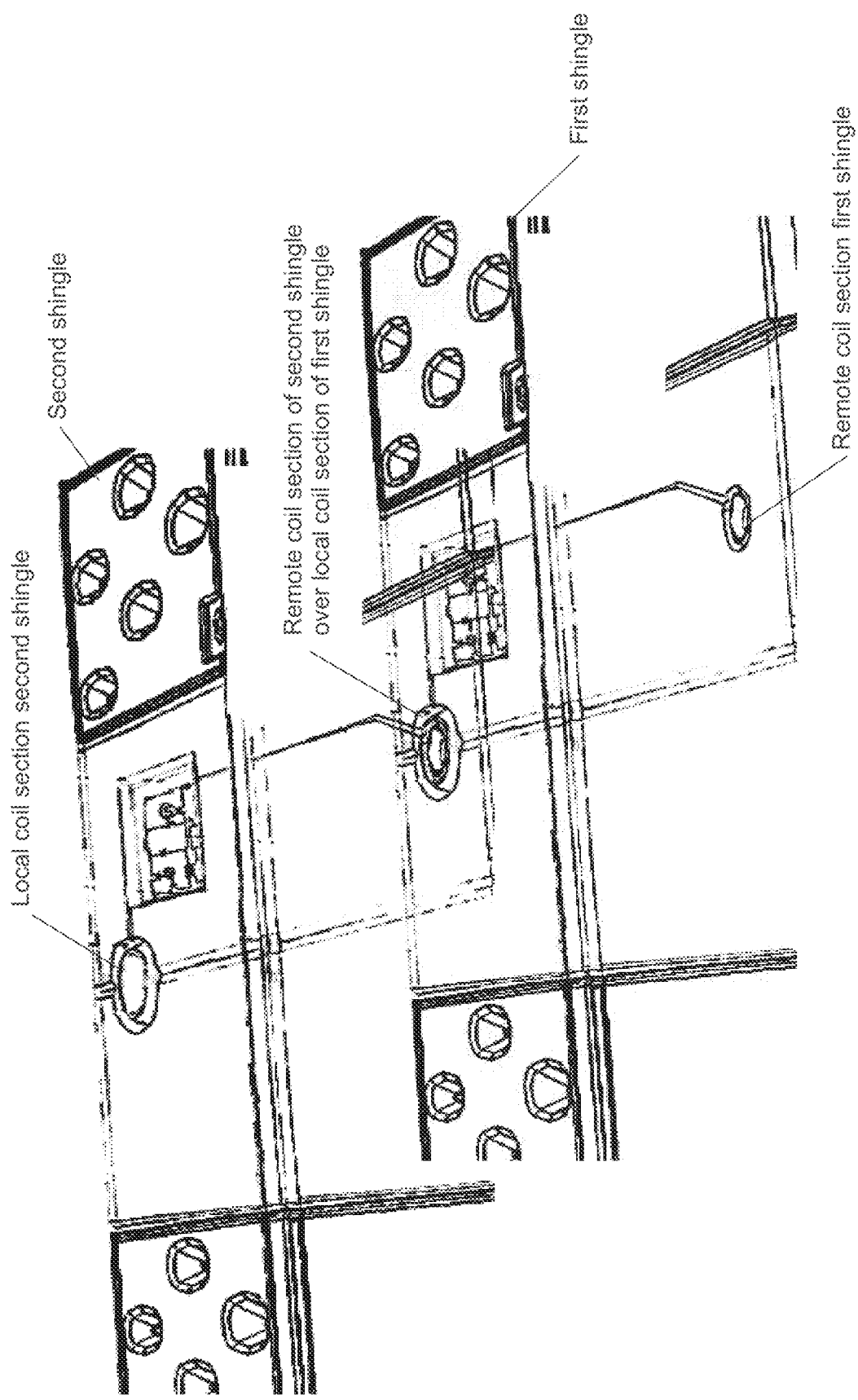
FIGS. 46 and 57 show a shingle like that in FIG. 41 overlaid a similar shingle in which the corresponding remote and local coil sections coincide.
Figure 57:
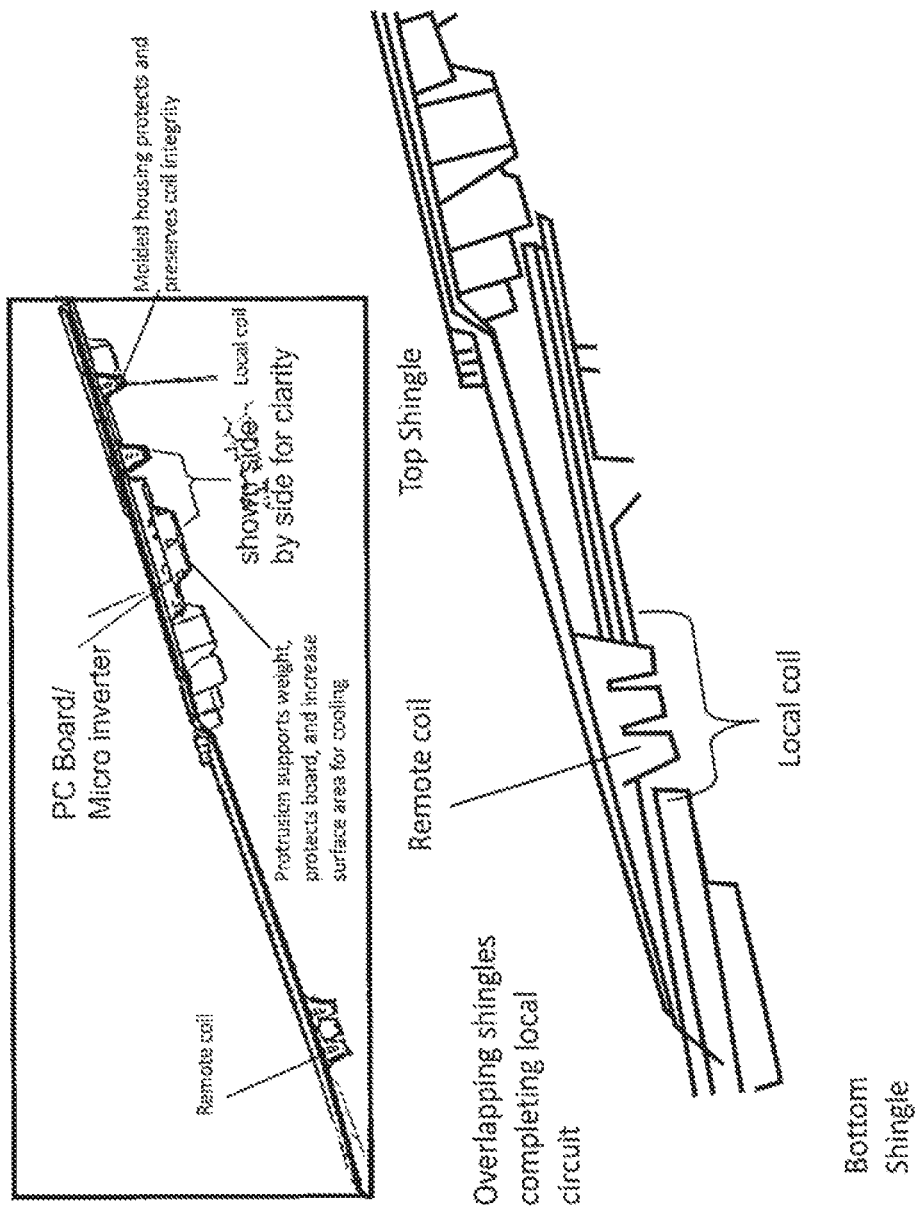

FIG. 46 shows two overlapping and offset shingles 410 (as per FIG. 41), forming the first and second shingles 410 of one set 450. FIG. 57 shows two such shingles in a side on view. Each shingle has the local coil moulded recess 415 on the underlapping side 410b of the shingle is positioned on the shingle to align with and create a physical coupling to a corresponding remote coil recess 416 on the overlapping side 410a of an adjacent shingle 410. The local coil moulded recess 415 sits under and envelops the corresponding remote coil recess 416 on the other shingle 410. Likewise, the remote coil moulded recess 416 on the shingle 410 sits over and couples to a local coil moulded recess 415 on another adjacent shingle. When a local coil moulded recess 415 carrying a local coil 415a is coincident with or otherwise coupled to a corresponding remote coil moulded recess 416 carrying a remote coil 416a on an adjacent shingle 410, the coincidence forms a self-assembled transformer (e.g. 471 in FIG. 47) that transfers electric signals or power from the circuit connected to one coil section to the circuit connected to the other coil section. The core of the remote coil section and local coil section can either be air or some other materials with high magnetic permittivity for enhancing the magnetic coupling co-efficient between coils and shielding.

Figure 47:
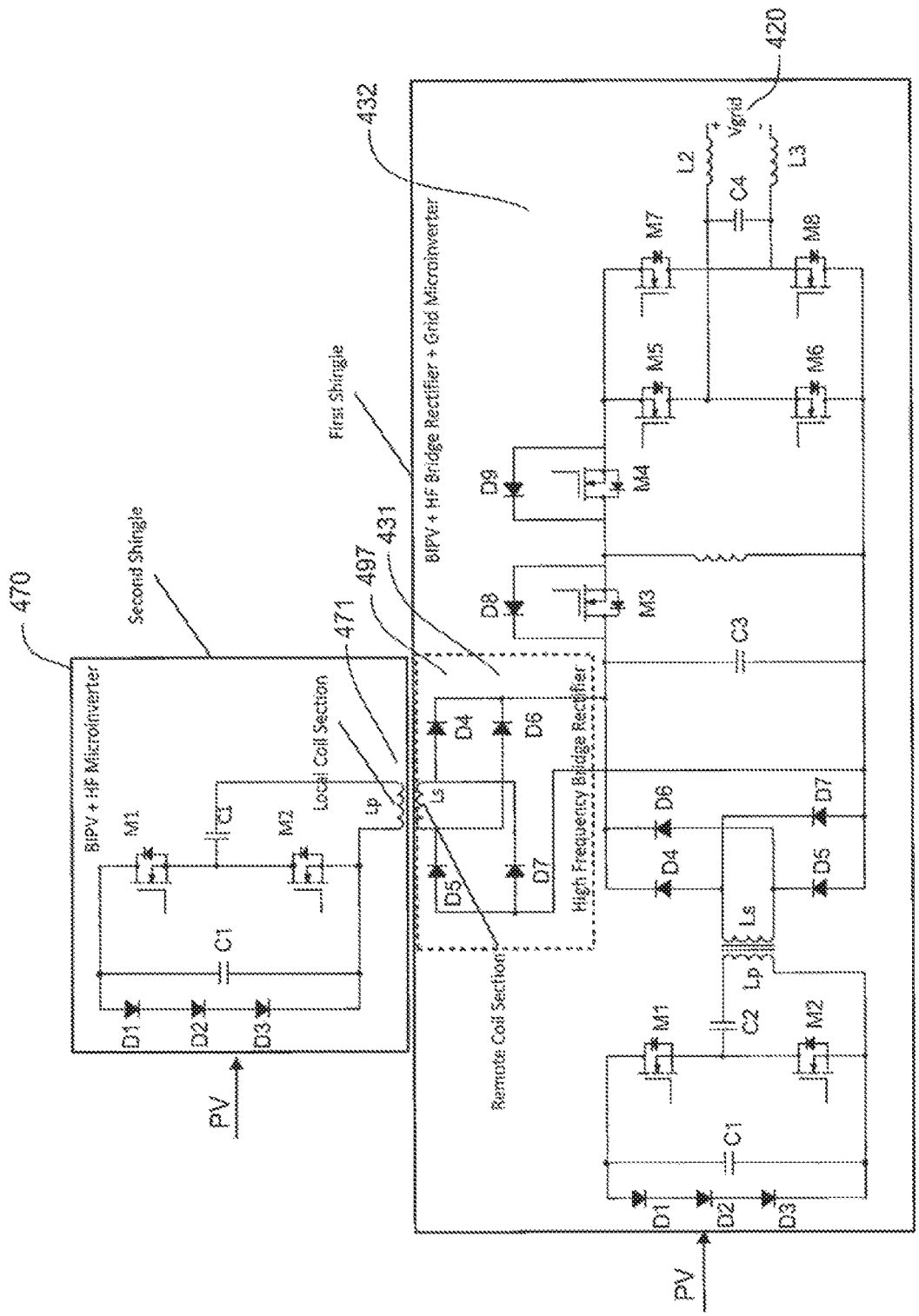
FIG. 47 shows a circuit diagram of the power conversion modules in the first and second shingles respectively in FIG. 45

FIG. 47 shows the power conversion module used for FIGS. 45 and 46. FIG. 47 shows only the components relevant to power conversion from the PV diodes D1-D3 in two BIPV shingles 410 into AC current compatible with the power supply grid 420. A high-frequency microinverter 470 in a second shingle converts the DC current of the PV diode into an AC current. This AC current is magnetically coupled with the first shingle circuit by forming a self-assembled transformer 471 between the remote coil recess/coil 415/415a, (e.g. Lp of circuit 470) of the second shingle with the local coil recess/coil 416/416a (e.g. Ls of circuit) of the first shingle 410. The coils Lp and Ls of circuit 470 respectively are arranged respectively on the local and remote coil moulding recess 415, 416. A high-frequency bridge rectifier 431 integrated in a circuit board in the first shingle 410 then coverts the high-frequency AC current into an intermediate DC voltage that also serves as the intermediate DC voltage for the HF microinverter and HF bridge rectifier that receives power coming from the PV diodes in the first shingle 410. A buck-boost inverter 432 integrated in a circuit board on the first shingle 410 converts the DC voltage into an AC current compatible with the power supply grid 420.

The arrangement described in FIGS. 45 to 47 provides distributed power conversion which allows for efficient transfer of power from one shingle to another and to the AC grid. Circuit 470 in the second shingle provides a conversion to allow transfer of power from that shingle to the first shingle. The first shingle receives this power and provides the DC to AC conversion for output to the AC grid. Distributing the conversion functionality increase efficiency of power transfer across several shingles to the AC grid. It also minimizes total system cost as the buckboost inverter, reconstruction filter, and associated protection circuitry required for grid connection are shared across multiple shingles.

Figure 49:
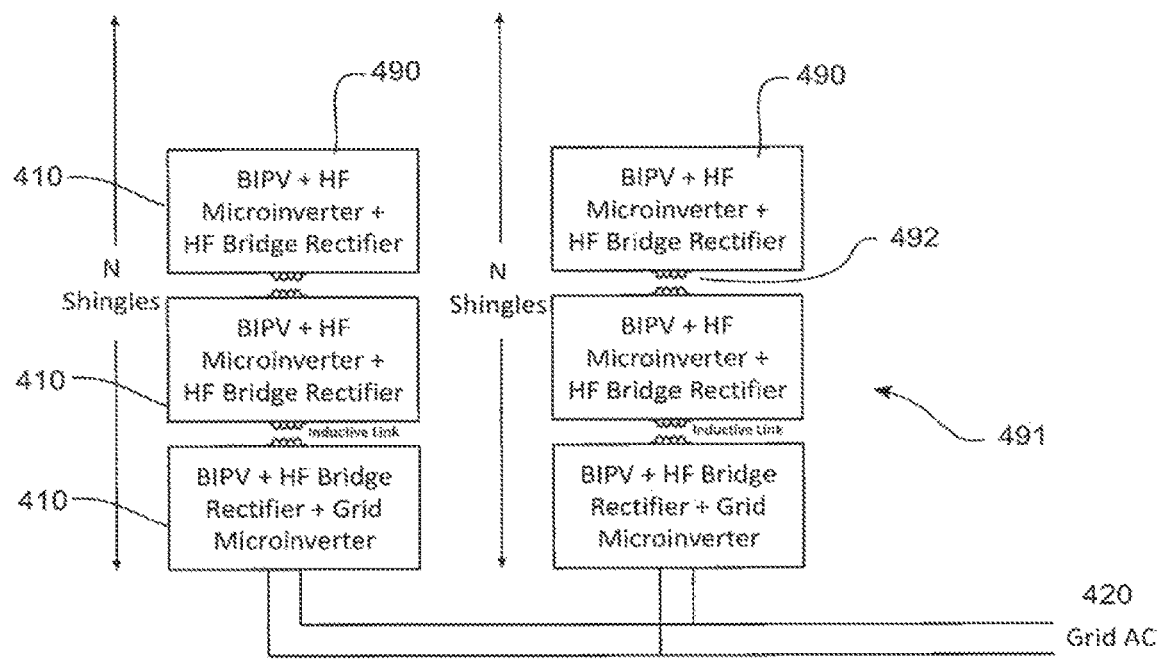
FIG. 49 shows a block diagram of a system with multiple daisy-changed shingles interconnected using inductive power transfer and comprising power conversion module is coupled to an AC grid.

FIG. 49 illustrates a block diagram of a roofing system according to another embodiment similar to that in FIG. 45 but with a series N of shingles 410 coupled and forming each set 490. Multiple slave shingles 410 are daisy-chained wirelessly to deliver power into a master BIPV shingle 410 that is connected to the power supply grid 420. Each slave shingle consists of a high-frequency rectifier that combines power transferred magnetically from an adjacent slave shingle with the DC current from PV diodes D1-D3 present in the slave. A high-frequency microinverter 430 then converts DC current from this local capacitor into high frequency AC current that is transferred magnetically to the next slave node or master node.

Figure 69:
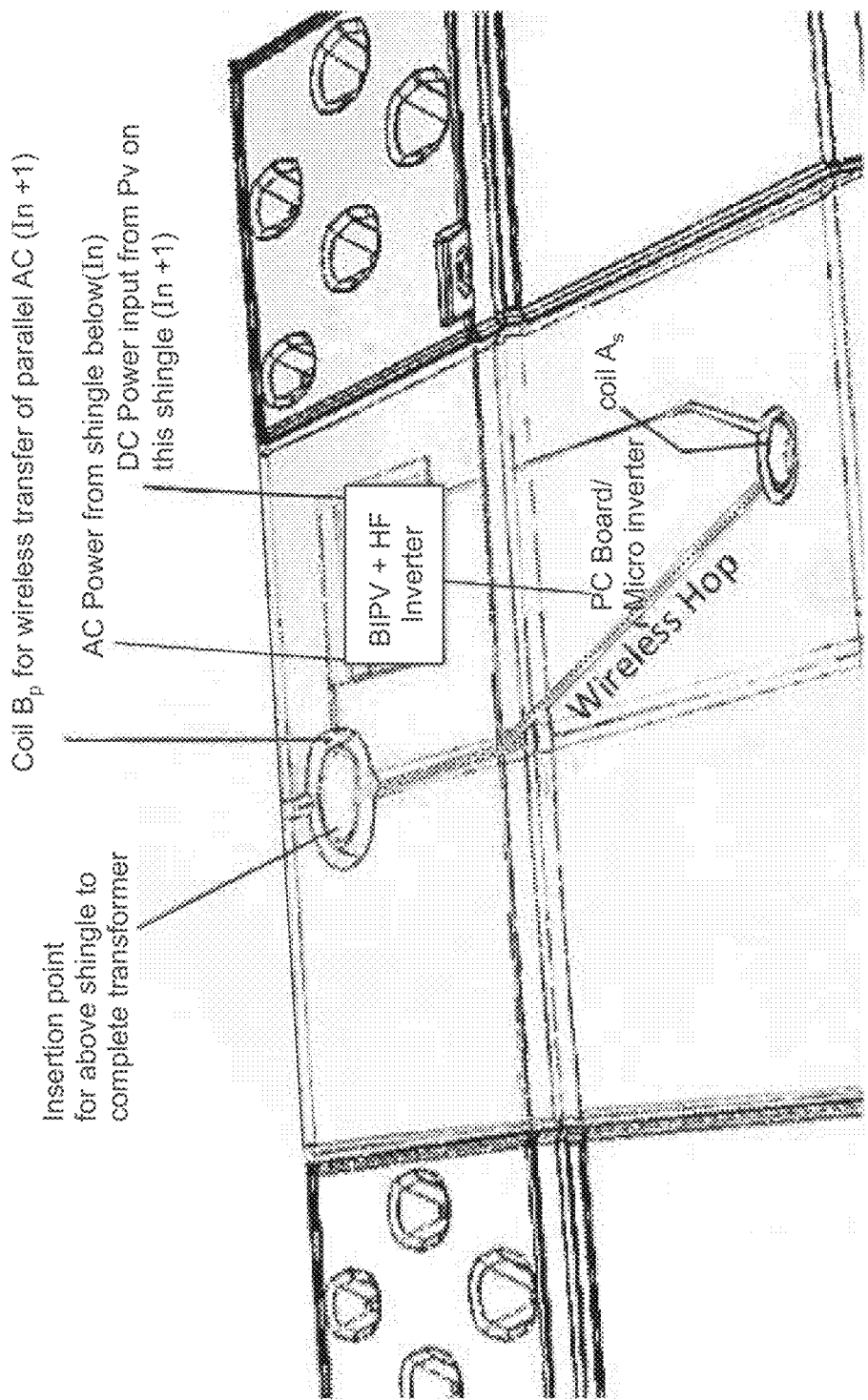
FIG. 69 shows a shingle used in the arrangement of FIG. 49 with a wireless hop.

In a variation, each slave shingle consists of a high-frequency microinverter 430 that converts the DC current of the PV diodes D1-D3 present in the shingle into high frequency AC current. This locally generated AC current is then combined with power delivered wirelessly from an adjacent slave shingle and transferred to the next slave or master shingle. This wireless power transfer between shingles is accomplished using a wireless hop (510—see FIG. 50). An example shingle is shown in FIG. 69, which is the same as shown in FIG. 41 but with the hop 510 shown schematically. Each daisy chained shingle 410 is coupled together as previously shown in FIG. 46.

Figure 50:
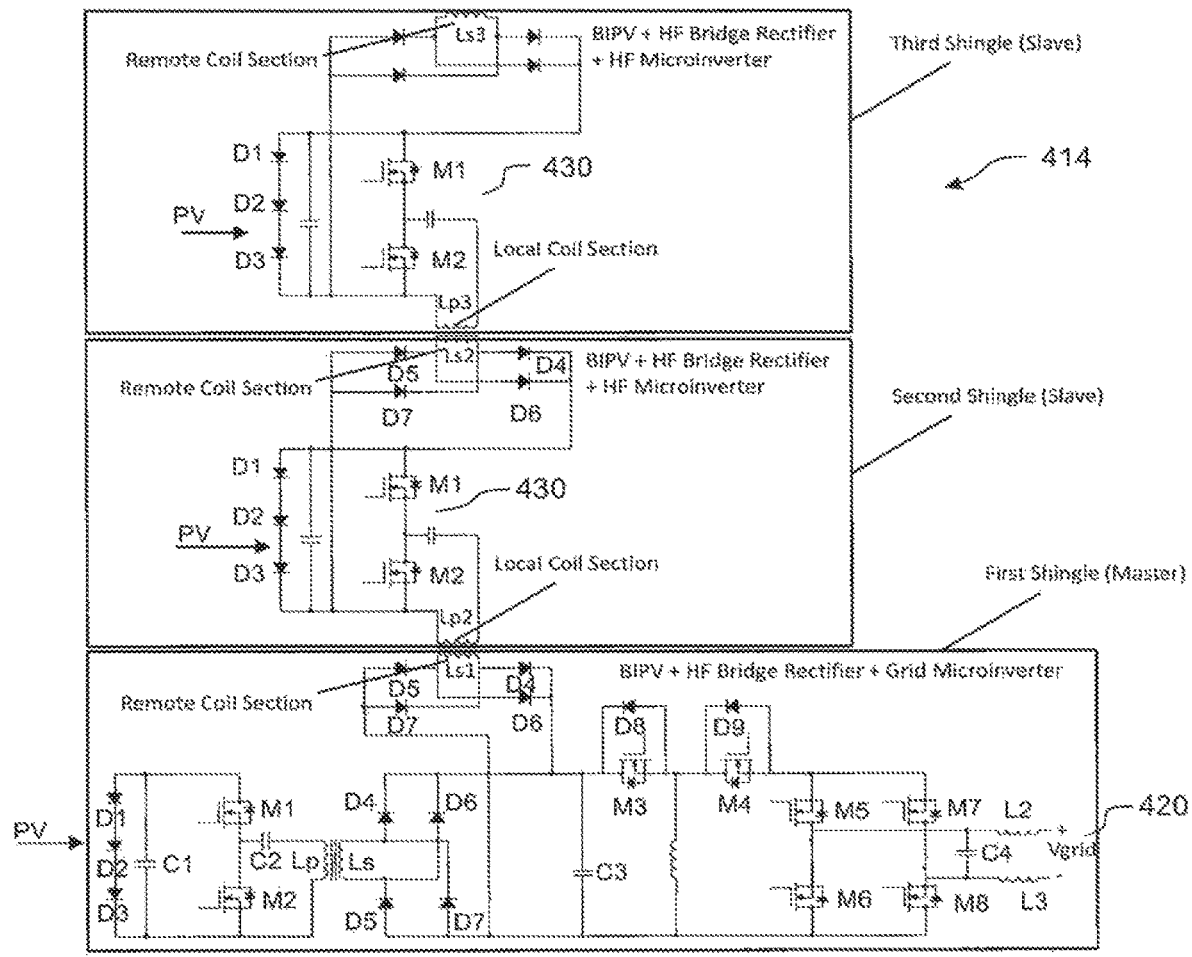
FIG. 50 shows these circuit used for the system in FIG. 49.

FIG. 50 shows the power conversion module 414 used in the daisy chained roof 491, comprising power conversion circuitry and wireless power transfer between nodes e.g. 492 in a slave BIPV shingle. A high-frequency microinverter 430 in the slave BIPV shingle converts the DC current of the PV diode into an AC current which is then converted to magnetic fields through a coil 415a (e.g. Lp3) situated in the local coil section 415. Magnetic fields received in the remote coil section (e.g. Ls3) of the adjacent slave shingle are converted into DC electric currents immediately at the remote coil section 416 by the high-frequency bridge rectifier and routed to the main circuit board where this energy is stored on a capacitor. The DC current coming from PV diodes D1-D3 is combined with the DC current received wirelessly from an adjacent shingle and transferred magnetically to the first shingle which is a master node through local coil Lp2 and remote coil Ls1. The master node combines power received from all adjacent slave shingles together with DC current generated from PV diodes in the master node and provides the DC to AC conversion for output to the AC grid. Note that the third shingle in FIG. 50 does not receive any wireless power even though the high-frequency bridge rectifier and remote coil Ls3 is present in the shingle because it is the last shingle on the daisy-chain.

The power conversion module in the slave BIPV shingles 410 are powered by tapping the DC current produced by the PV diodes D1-D3 in the shingle. The power conversion module in the master BIPV shingle is powered by tapping the DC current produced by the PV diodes D1-D3 in the shingle or by grid AC current.

Figure 70:
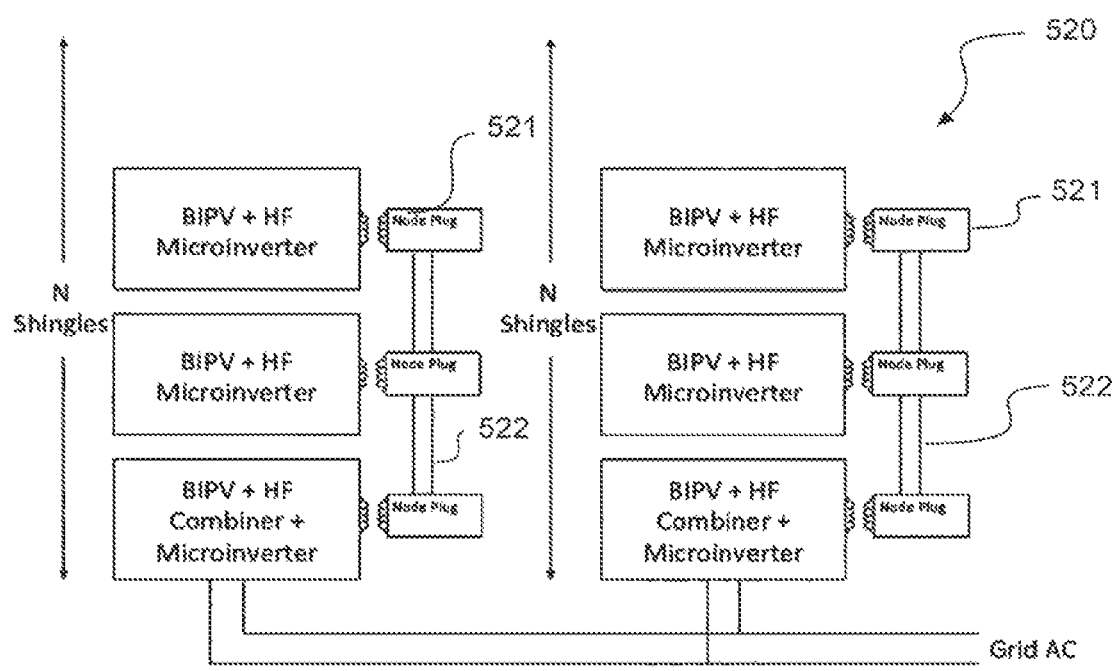

FIG. 70 illustrates a block diagram of a roofing system 520 according to another embodiment similar to that in FIG. 49 but with a series N of shingles daisy-chained together using an AC bus (in another embodiment in could be a DC bus). Multiple slave BIPV shingles convert DC current from the PV diodes in each shingle into high-frequency AC current that is wirelessly transferred through node plugs e.g. 521 to a high-frequency AC bus 522. The wireless power transfer is accomplished through a self-assembled transformer that is formed between the local coil section 415 of each slave BIPV shingle and a node plug 521 on the high-frequency AC bus. Each node plug consists of a coil 542 that is co-incident with the coil 415a in the local coil section of the corresponding slave BIPV shingle as well as a capacitor 541 to form a resonant frequency for maximum power transfer wirelessly. The high-frequency AC bus finally transfers power into a master BIPV shingle also by self-assembled transformer. The master BIPV shingle converts the combined high-frequency AC current into an intermediate DC voltage using a high-frequency rectifier. This intermediate DC voltage is finally converted into an AC current compatible with the power supply grid 420. The power conversion module in the slave BIPV shingles are powered either by tapping the DC current produced by the PV diodes D1-D3 in the shingle or by converting high-frequency AC current fed from the master BIPV shingle. This reverse power transfer from master BIPV shingle to slave BIPV shingles for powering up control circuitry is accomplished by adding additional coils in the local and remote coil sections. This secondary reverse power transfer link is also used to synchronize the high-frequency AC phases of all wirelessly connected shingles. Alternatively, synchronization can also be accomplished through the Zig-Bee wireless communications channel.

Figure 51:
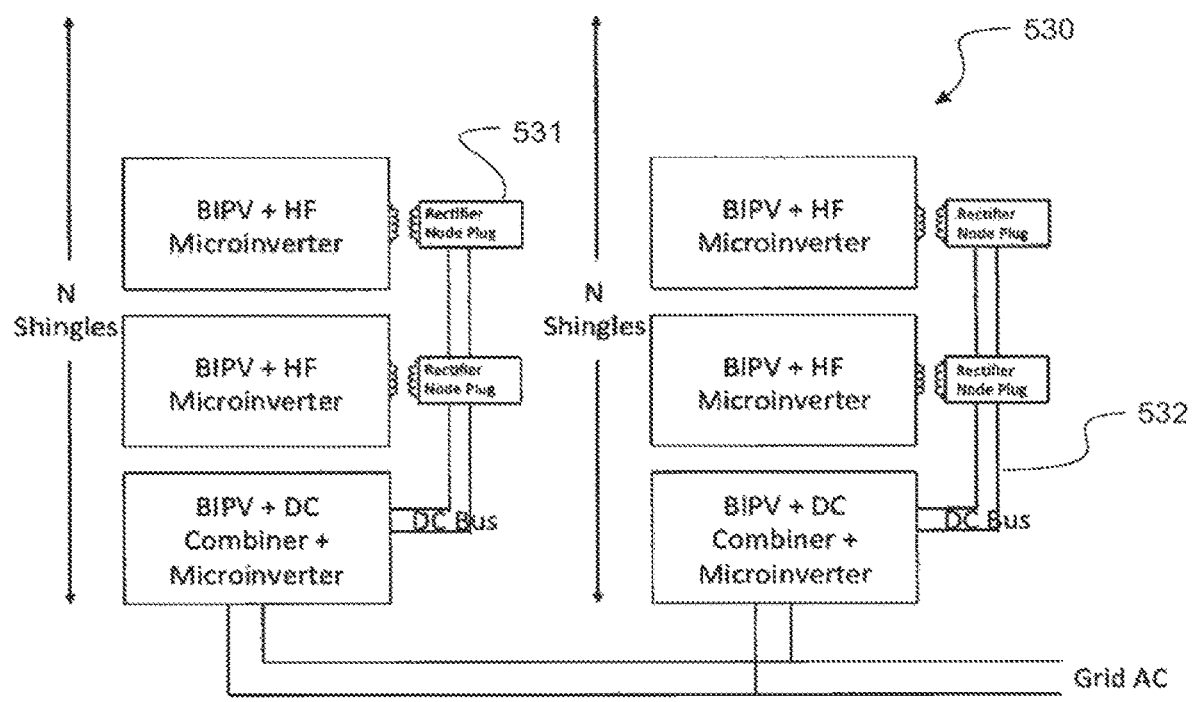
FIGS. 51 and 54 and 70 show block diagram of a system with multiple shingles interconnected using inductive power transfer to a bus and comprising power conversion module is coupled to an AC grid.

FIG. 51 illustrates a block diagram of a roofing system 530 according to another embodiment but with a series N of shingles daisy chained together using DC bus eg. 532. The DC bus is used to transfer power from multiple slave BIPV shingles to a master BIPV shingle. Each slave BIPV shingle converts the DC current from the local PV diodes into a high-frequency current. This high-frequency AC current is transferred through a self-assembled transformer in the local coil section of each slave BIPV shingle to a rectifier node plug (Lp11/Ls1 see FIG. 52). The rectifier node plug rectifies the high-frequency AC current into a DC voltage that is shared across a DC bus and wired into the master BIPV shingle. The master BIPV shingle combines the DC power from the local PV diodes with the DC current from the DC bus and produces AC current compatible with the power supply grid. No synchronisation between BIPV shingles on the same bus is necessary in this case since power is transferred as DC current.

The shingles used for the arrangements in 51 could be any described above, although it is not necessary to have the remote coil moulding recess 416—it would be possible just to have the local coil moulded recess which becomes an output wireless power transfer coupling. In FIG. 53, the shingles have output wireless power transfer couplings (in this case inductive) that carry the primary winding and then physically couple to the receiving coupling carrying the secondary winding on the bus node plug. FIG. 53 shows an example of one such output wireless power transfer coupling (which differs from the arrangement of the local coil moulding previous) being an inductive power transfer plug 556 that carries a winding and snap fits or similar over the receiving coupling on the bus 522 or 532/node plug 521 or 531, which also carries a winding. The winding will be Lp1 and Ls1/Ls—(see FIG. 52) FIG. 53 also shows an alternative capacitive power transfer coupling 557 in which each portion carries a plate and snap fits together.

Figure 48:
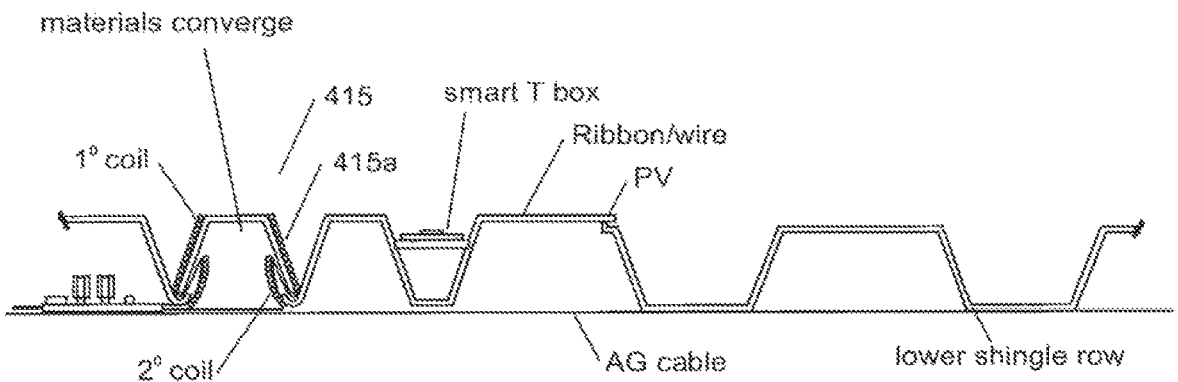
FIG. 48 shows a side profile of a shingle.

FIG. 48 is a side view of two installed and overlapping roofing shingles 410 illustrating the positioning of the local coil 415a and the coil of the node plug. As can be seen, the printed circuit board carrying the node plug electronics is disposed, near the node coil coupling. The local coil moulding recess 415 has the first coil (e.g. Lp of circuit 430) wound around the top portion and the secondary coil (e.g. Ls1/Ls of node plug circuit 545—see FIG. 54) wound around the bottom portion of the coupling The power conversion circuitry in the second shingle is powered by tapping the DC current produced by the PV diodes D1-D3 in the shingle 410 or by converting high-frequency AC current fed from the first shingle 410

Figure 52:
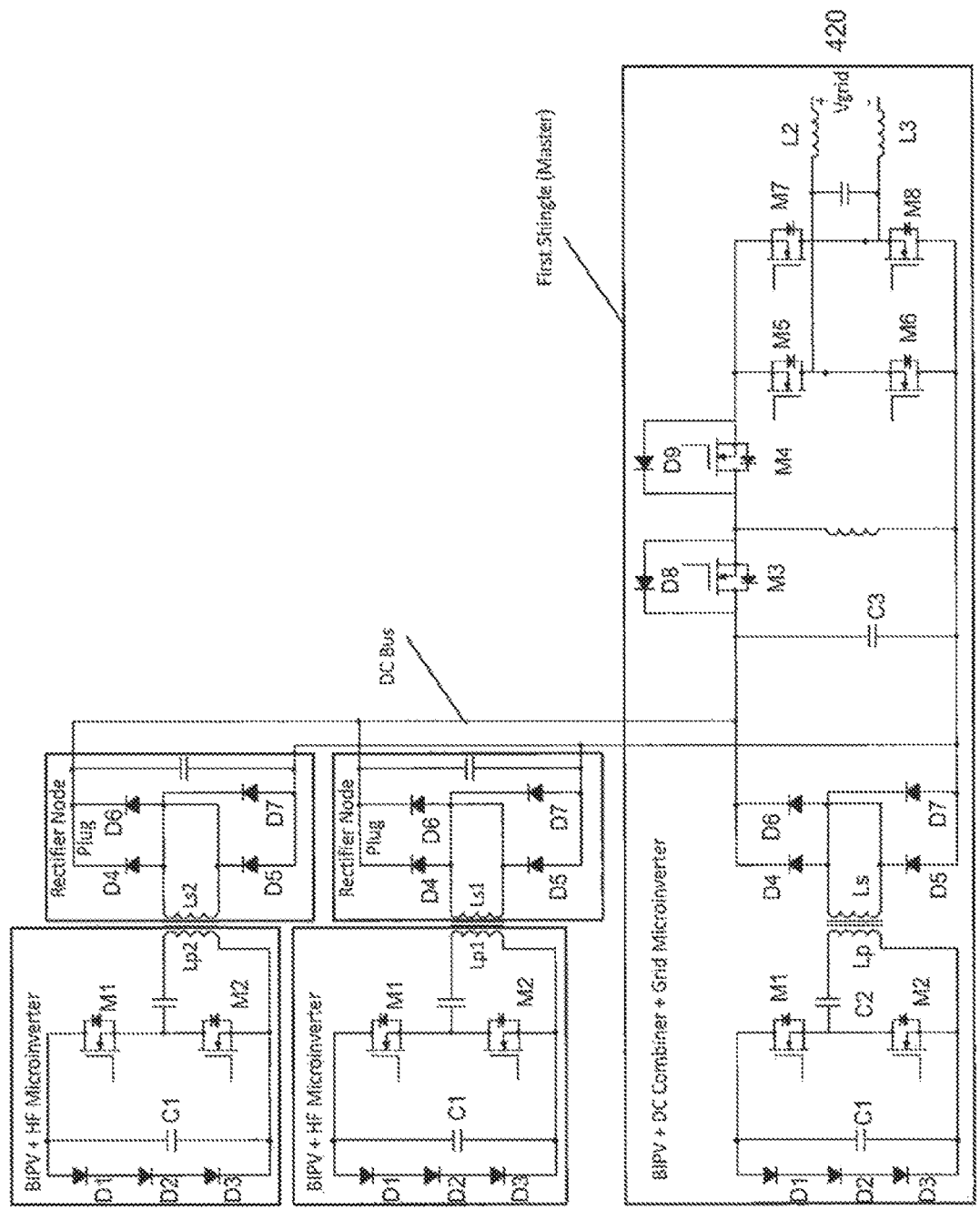
FIG. 52 show the node plugs for the arrangement in FIG. 51.
Figure 53:
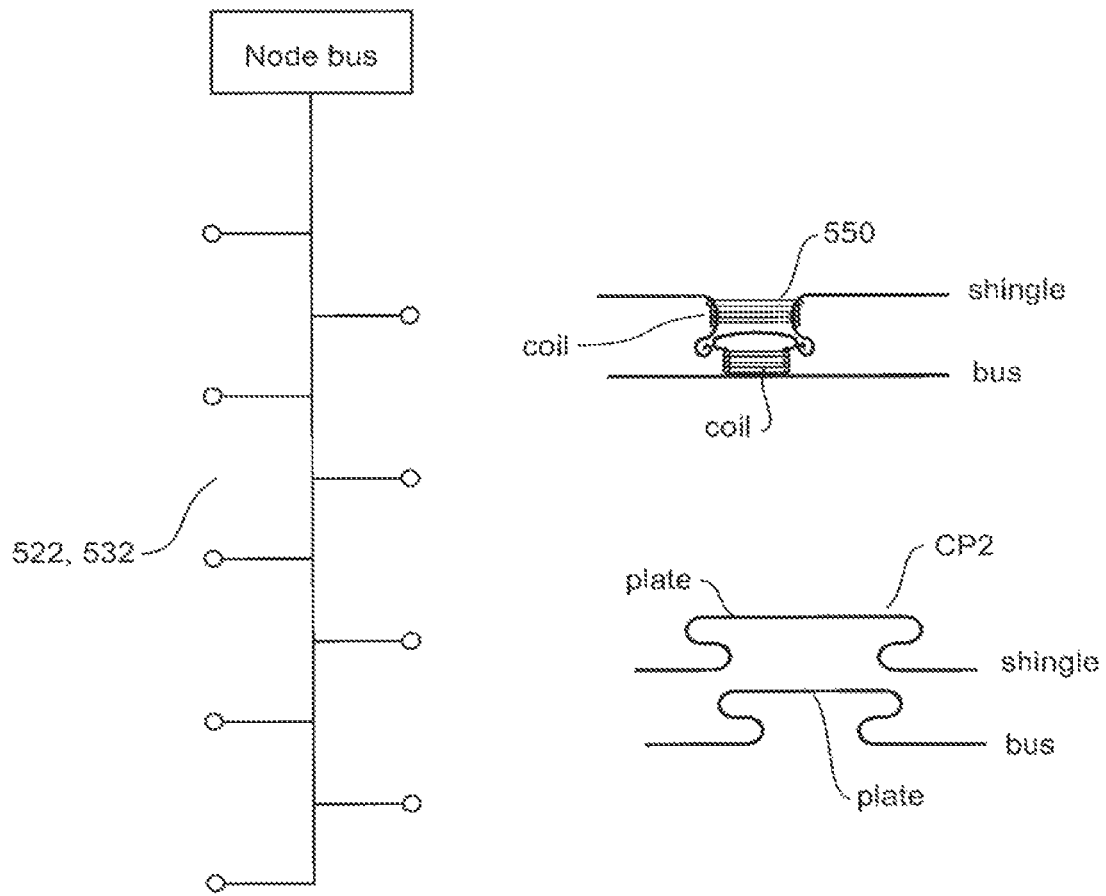
FIG. 53 shows possible couplings to a node bus for inductive and capacitive power transfer.

FIG. 52 illustrates the schematic of two rectifier node plugs sharing a common DC bus. Each node plug 531 consists of a coil e.g. 540 Ls1 that forms a self-assembled transformer when plugged into the local coil section of a slave BIPV shingle. The AC current from this coil is rectified using a bridge rectifier in a rectifier node plug 531. Each rectifier node plug 531 also provides a small localised DC filter capacitor connected across the DC bus. All components in a rectifier node plug are passive and do not require any specific control signals or synchronisation.

FIG. 71 illustrates the schematic of a master BIPV shingle circuit identifying where the DC bus is routed in, according to one embodiment.

Figure 54:
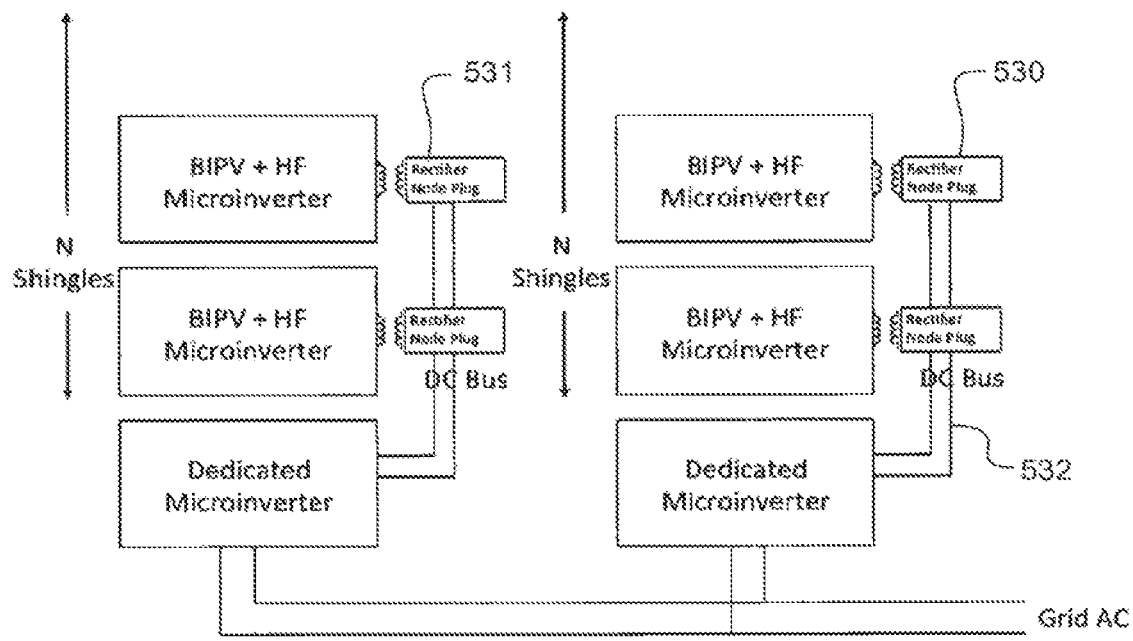

FIG. 54 illustrates a system level configuration alternative to FIG. 52. The dual-purpose master BIPV shingle is replaced with a dedicated microinverter module that converts the DC bus voltage into AC current compatible with the power grid. This dedicated microinverter can be located in a form factor of a half or quarter shingle and can be conveniently tiled with the rest of the BIPV shingles. Alternatively, the DC bus can be routed to a centralised inverter.

Figure 55:
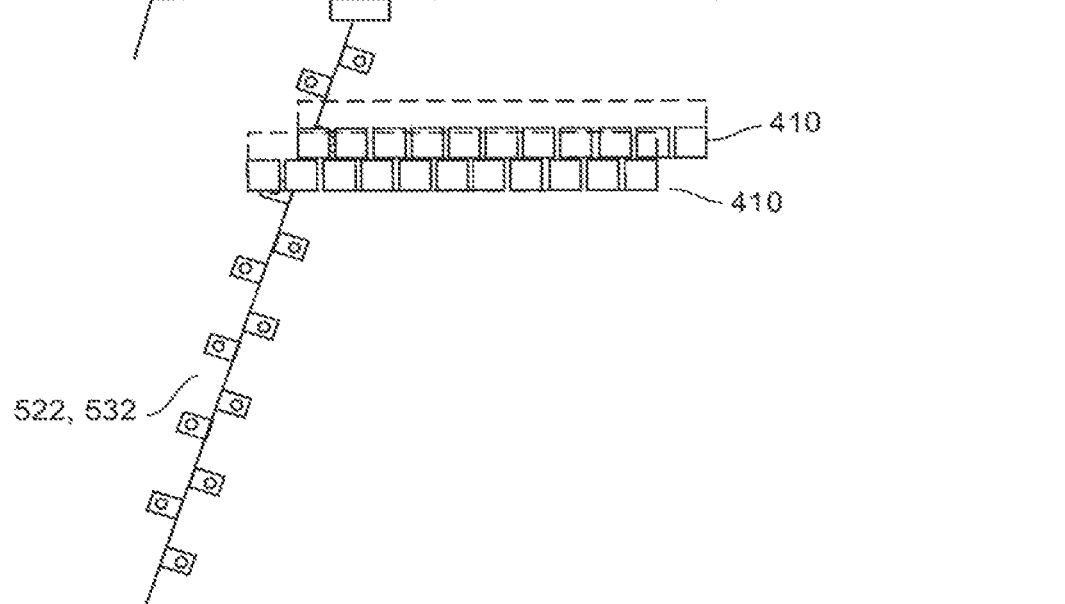
FIG. 55 shows the arrangement of shingles in an overlapping and offset manner and coupled to a node bus on a roofing substrate.

FIG. 55 show how the shingles according to any of the embodiments above are arranged on a roofing substrate. An AC or DC bus runs down the fall of the roofing substrate and has connectors for electrical/wireless (and where appropriate mechanical) coupling (such as wireless power transfer connectors (such as 556, 557 in FIG. 53) to the wireless power output for each roof shingle run. The roofing substrate can be covered with the shingles like this, all configured to couple wirelessly according to any embodiment described above. In an alternative where the bus is not used, but daisy-chaining connections between shingles is utilized, each run is offset with respect to the adjacent runs, so that the local and remote coils can inductively couple (or wirelessly couple in another suitable way, such as capacitively couple).

Figure 56:
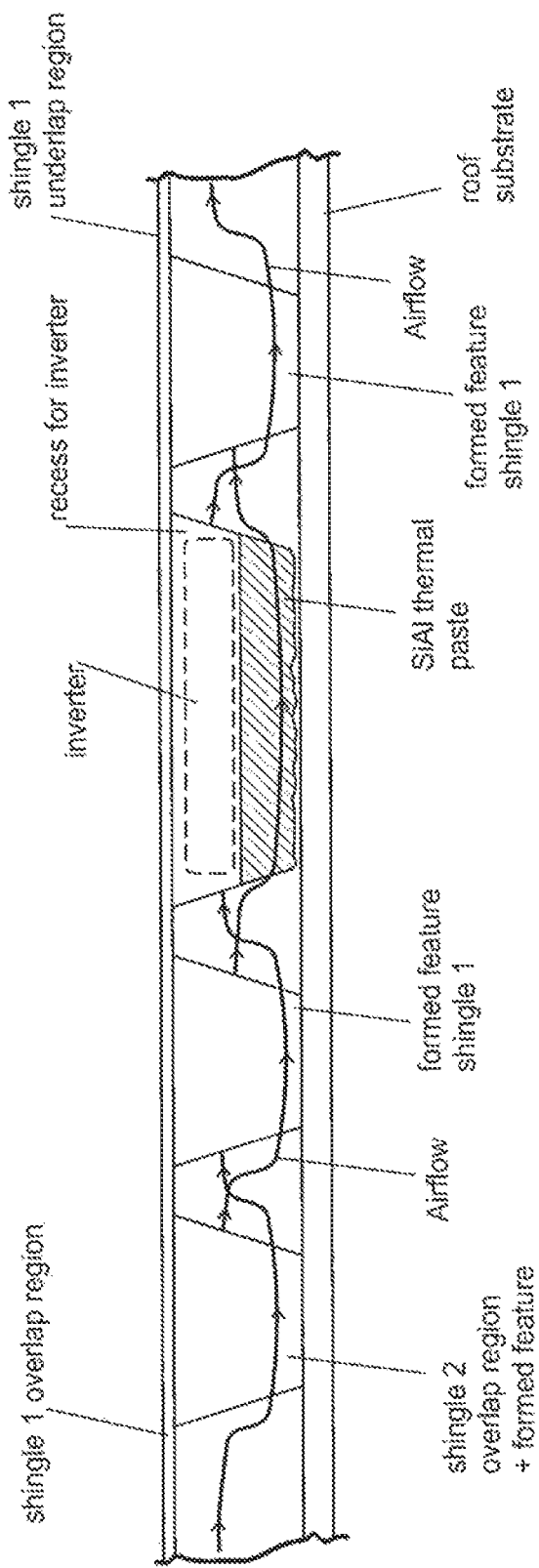
FIG. 56 shows a side profile of the shingle and the airflow channels.

The arrangement of shingles as described according any embodiment above also allows for cooling of the power conversion module or any other electronic circuitry, as shown in FIG. 56. the under lap in region of a first shingle as shown with formed features that displace the shingle away from the roofing substrate thus allowing air flow paths as described previously for thermal capture purposes. This airflow can also be used for electronic cooling purposes. The power conversion module recess sits within these air flow paths, and contain the power conversion module. The power conversion module is thermally coupled to the recess using a thermal material, such as thermal paste, such as silicon (e.g. silicon rubber) doped with aluminium. There is a thermal path between the electronics of the power conversion module through the thermal paste to the airflow which draws heat generated by the electronics away from the power conversion module. The operating temperatures of the electronics is higher than the temperature of the airflow, thus resulting in heat exchange between the electronics and the airflow. The underside of the recess might be profiled to increase thermal transfer. The airflow/cooling increases the lifespan of the inverter/PV and/or increases the efficiency of the PV cell/inverter. Heat can reduce efficiency of the PV cells and/or inverter. Cooling the substrate, cools the roof, which also cools the PV cells.

The arrangements described above provide for an integrated PV module and roofing panel that can be used for constructing a roof that provide PV generated electrical output. The roofing panels are created preferably on a continuous form machine that produces physical formations for integrating components of the power conversion module and/or wireless power transfer circuit, including coils for the transformer in each power conversion module and coils for effecting wireless power transfer between shingles. This creates a fully integrated solution where the power conversion and wireless power transfer functions utilise physical features of the roofing panel to assist physical and power interconnection between shingles. Physical features of the shingles can also assist cooling of the electronics of the power conversion module on each shingle. The physical features of that shingle that assist cooling, interconnection and power transfer and/or the recess also provide housing for the power conversion module. Each shingle can be arranged with other shingles into a roofing system that provide PV generated output. The arrangement allows for distributed DC to AC inversion across multiple shingles that combine to provide a single AC grid output.

The roofing panel surface can go up or down or sideways, it could overlap or underlap, or not overlap or underlap at all. In an alternative embodiment, the panels could be clipped together onto a racking system, the racking system (frame) having the wireless transfer between panels.

While wireless power transfer is described between roofing panels, this is not essential. Wired power transfer between the roofing panels and/or inverters/bridges therein could be use. For example, electrical conductors could be installed between panels, electrically coupling the power conversion modules to transmit power ultimately to the grid. Any wireless power transfer embodiment described could be replaced with wired power transfer.

Figure 59:
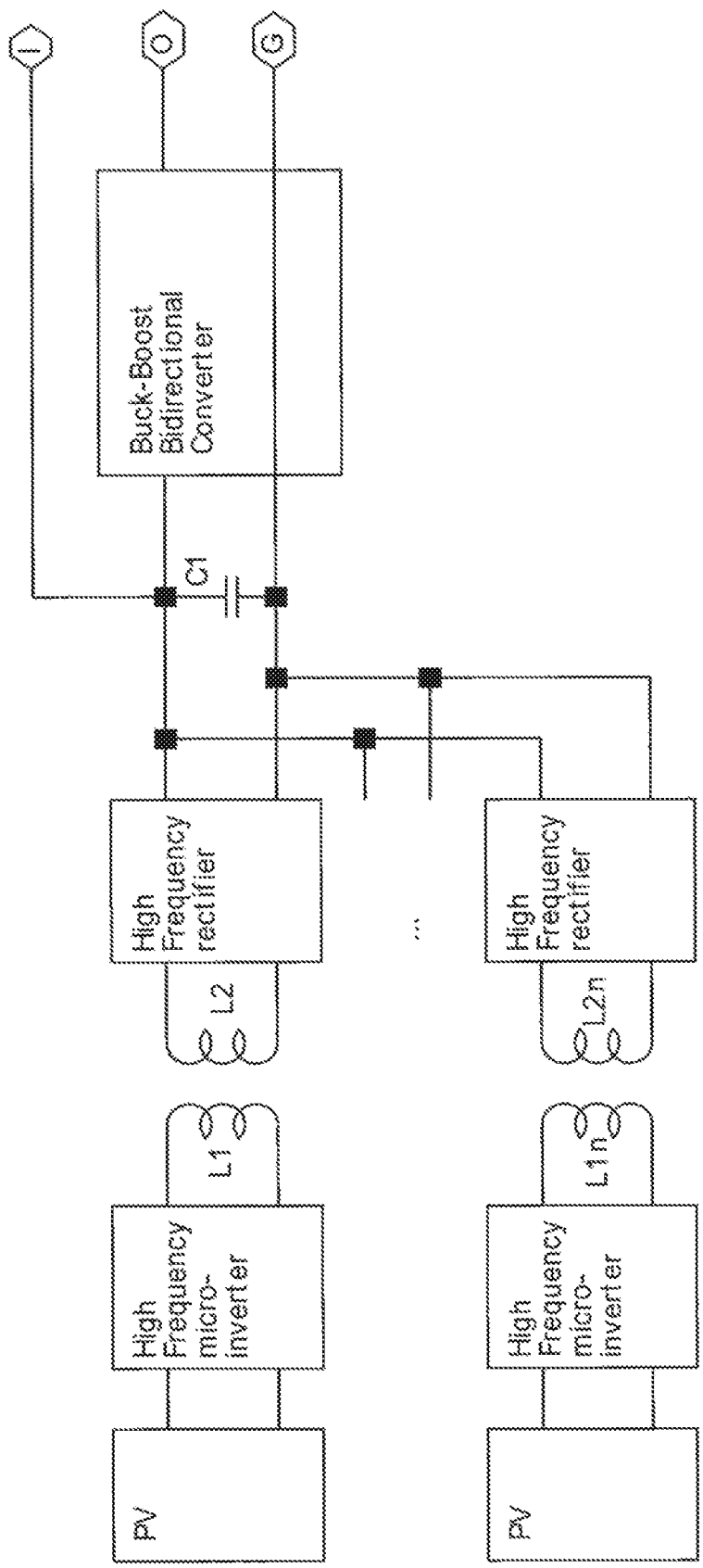
FIGS. 59 and 60 show a unipolar converter according to a first embodiment.
Figure 60:
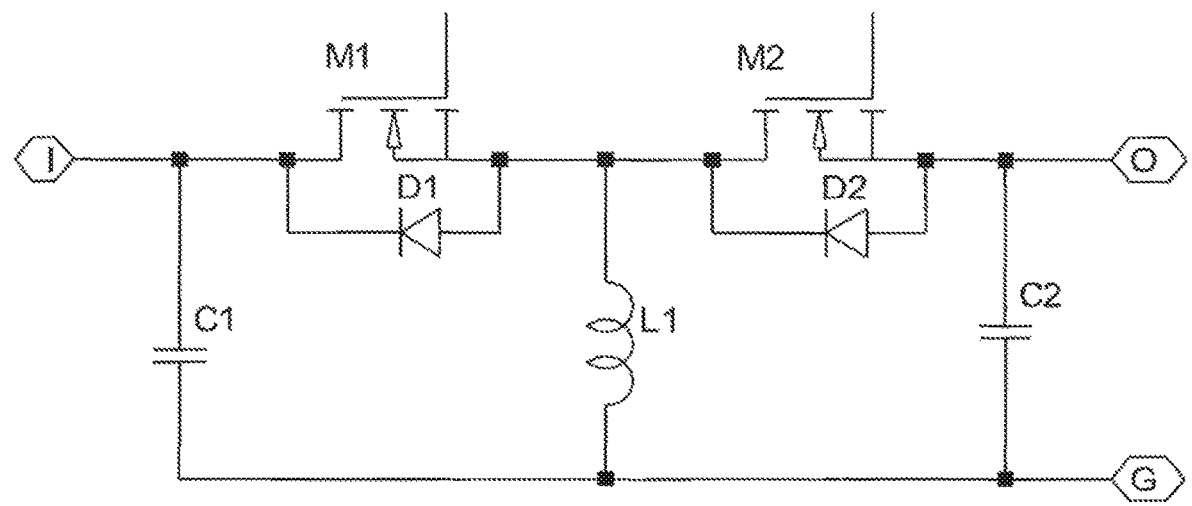

FIG. 59 presents a possible implementation of a unipolar converter using the concept of magnetic coupling from PV modules. Each PV unit connects to a high frequency inverter that drives as described previously the primary of a transformer (L1). The secondary (L2) of the inter-shingle transformer drives a rectifier that generates DC across C1. More identical paths drive in parallel across C1 the energy from each PV module. C1 drives the input to a Buck-Boost bidirectional converter (terminals "I" and "G") that generates a variable voltage at its output (terminals "0" and "G"). The output is indeed unipolar as the output voltage is always negative with respect to "G" while the output current can be positive or negative. Figure S3 shows a possible schematic for the buck-boost stage that was described before.

Figure 61:
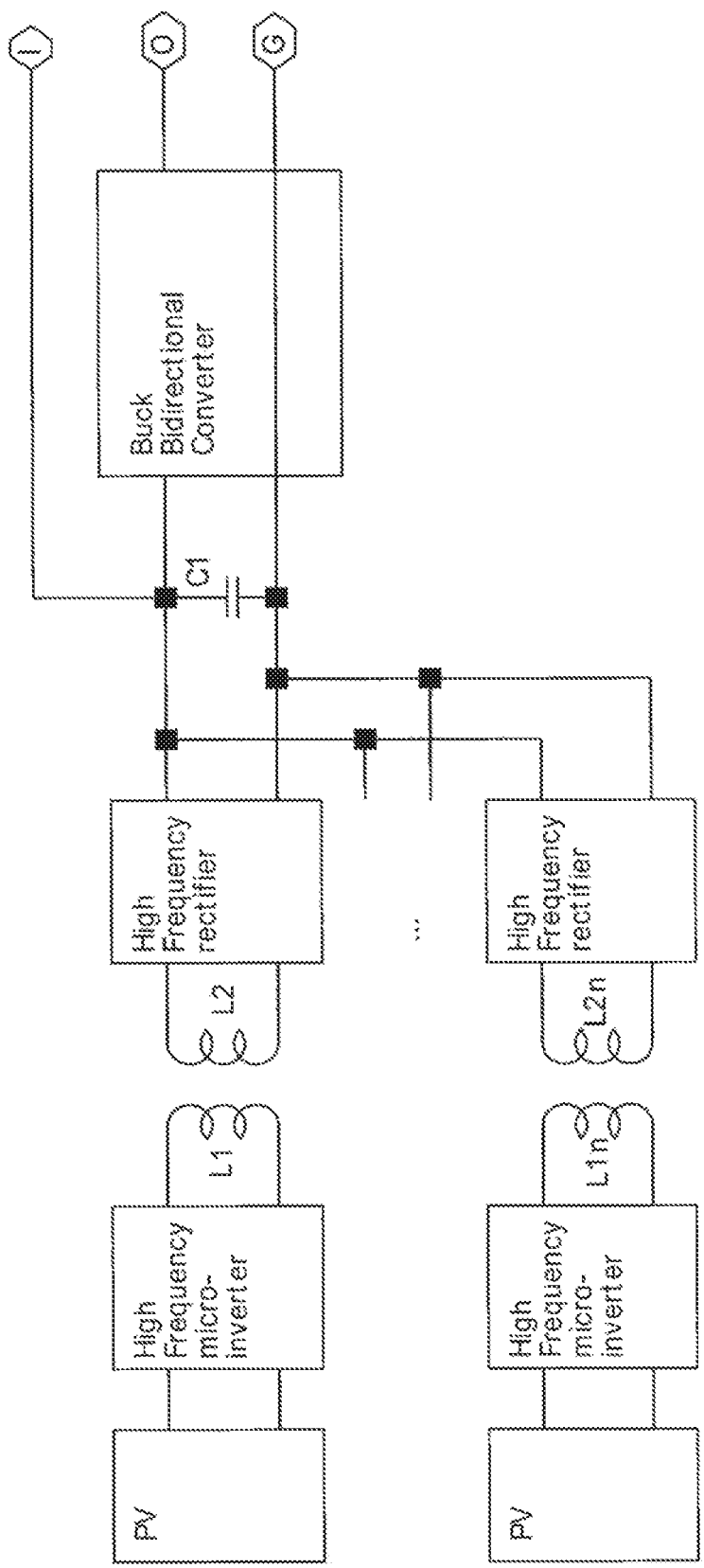
FIGS. 61 and 62 show a unipolar converter according to a second embodiment.
Figure 62:
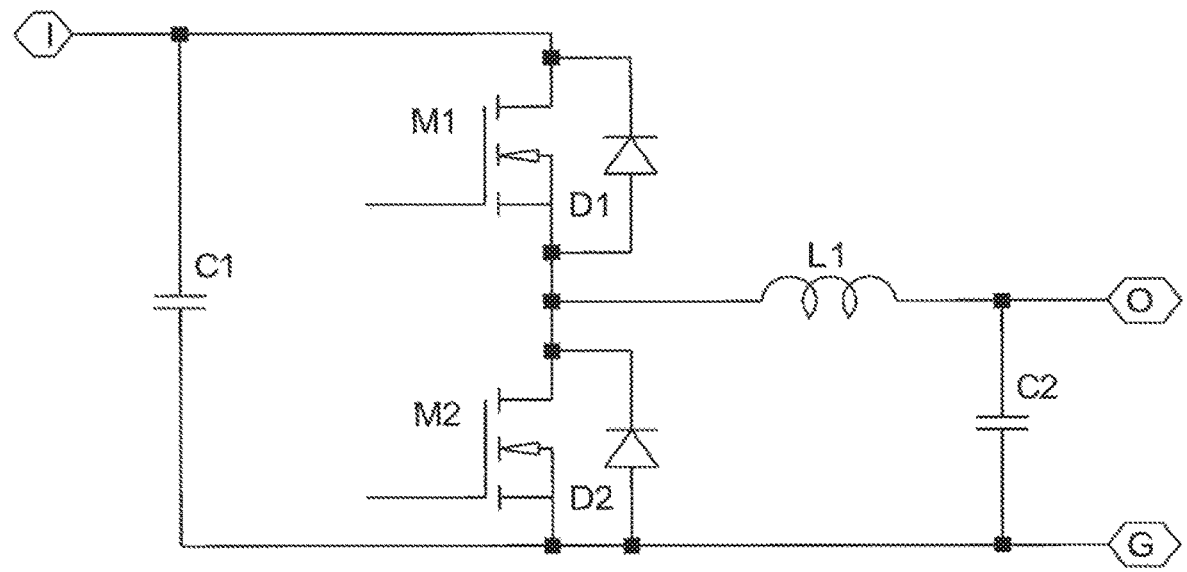

FIG. 61 presents an alternative implementation of a unipolar converter using the concept of magnetic coupling from PV modules. Each PV unit connects to a high frequency inverter that drives as described previously the primary of a transformer (L1). The secondary (L2) of the inter-shingle transformer drives a rectifier that generates DC across C1. More identical paths drive in parallel across C1 the energy from each PV module. C1 drives the input to a Buck bidirectional converter (terminals "I" and "G") that generates a variable voltage at its output (terminals "0" and "G"). The output is indeed unipolar as the output voltage is always positive with respect to "G" while the output current can be positive or negative. FIG. 62 shows a possible schematic for the Buck stage that is known to those skilled in the art.

Figure 63:
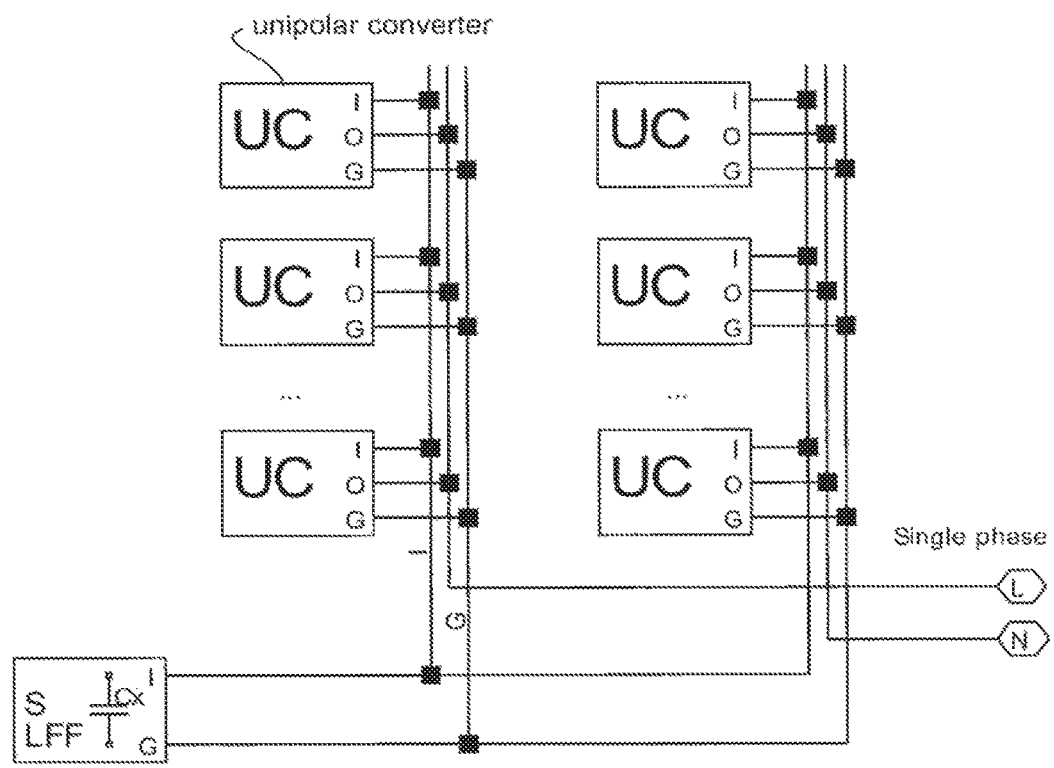
FIG. 63 shows a single phase inverter using unipolar converters.

FIG. 63 shows a single phase inverter implemented using unipolar converters (UC) as described either in figure S2 or in figure S4. The two vertical wire groupings can be three wire cables that connect to each UC. At one end of the cables they connect together as shown and drive the Line (L) and Neutral (N) AC grid interface, the (I) and (G) terminals are grouped together to connect to a S-LFF Storage and Low Frequency Filtering block that concentrates all the needed bulk capacitance for the single phase inversion and constitutes an bidirectional charger for a house battery pack or a DC electrical vehicle charger. The inverter operation using unipolar converters is described in the Unipolar patent.

Figure 64:
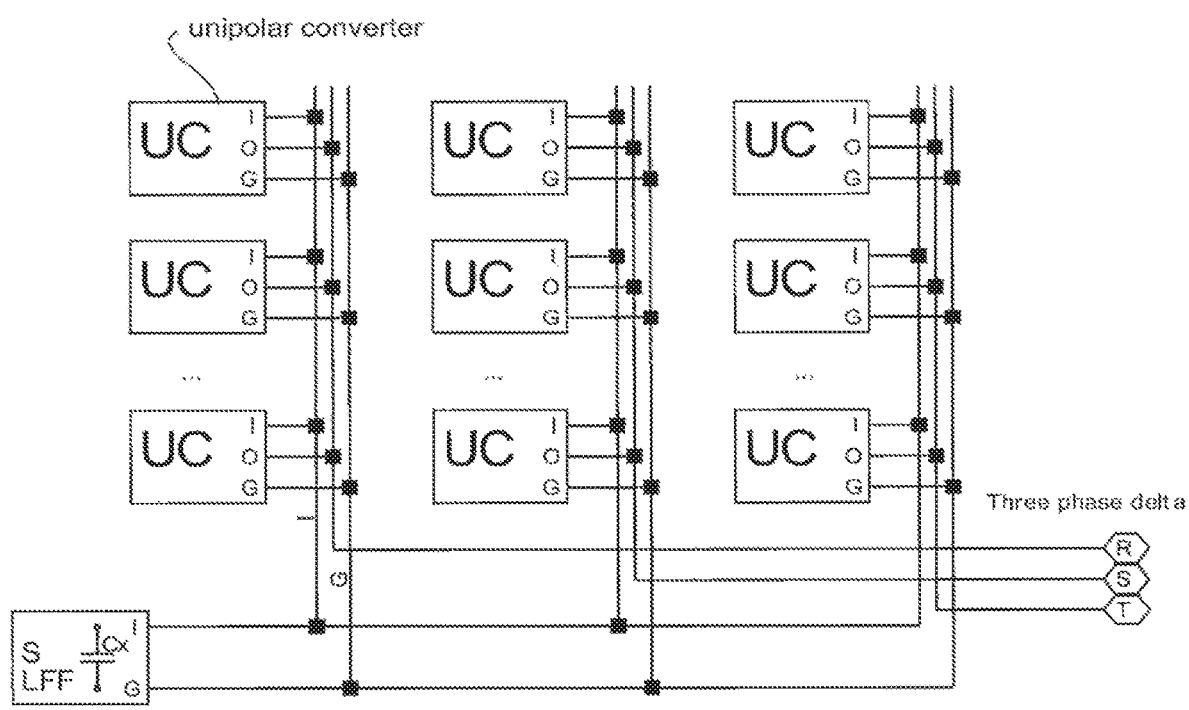
FIG. 64 shows a three phase inverter using unipolar converters.

FIG. 64 shows a three phase inverter implemented using unipolar converters (UC) as described either in figure S2 or in figure S4. The three vertical wire groupings can be each three wire cables that connect to each UC. At one end of the cables they connect together as shown and drive the three phases (R, S, T) AC delta grid interface, the (I) and (G) terminals are grouped together to connect to Storage (S) block that constitutes a bidirectional charger for a house battery pack or a DC electrical vehicle charger. The three phase inverter operation using unipolar converters is described in the Unipolar patent. Please note that there is no need for a large bulk capacitor in three phase operation.

In embodiments, the invention comprises physical structures for transferring power wirelessly between two circuits through magnetic fields. This comprises building-integrated photovoltaic (BIPV) shingles, where the self-aligned overlapping nature of the shingle completes the wireless power interface upon installation. The non-ideal leakage inductances of the transformer, due to physical properties of the structure, such as gaps between coils and core material, are cancelled out by placing the wireless interface in a resonant circuit.

Figure 65:
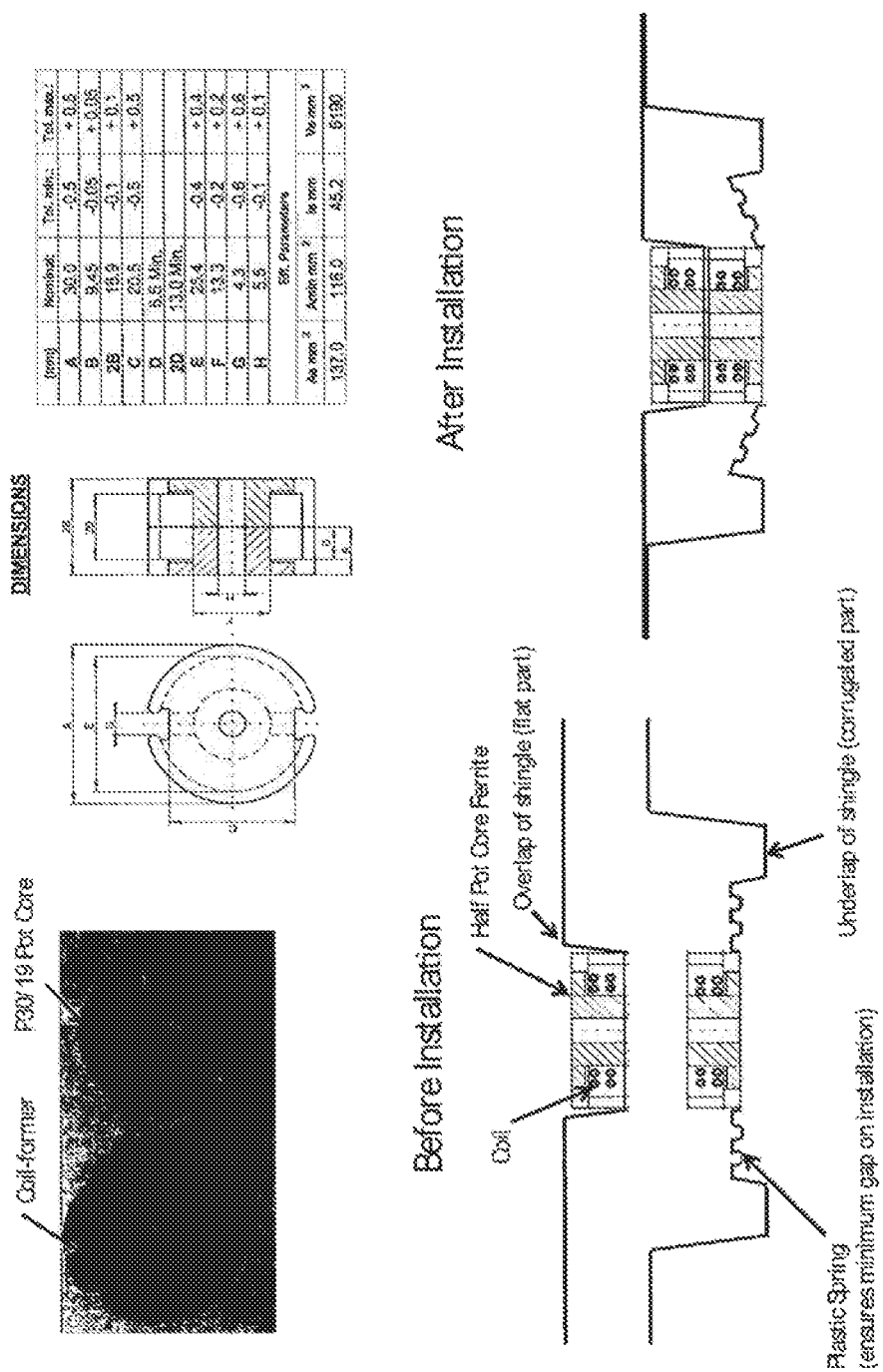
FIG. 65 shows a coil core installation.

Embodiments described comprise a primary coil integrated into a first shingle A and a secondary coil integrated into a second shingle B. The purpose of these coils is two transmit power efficiently between a circuit housed in shingle A to a circuit housed in shingle B. The form factor of shingle A and shingle B are designed in a male-female configuration such that the coils line up concentrically (primary enclosed within secondary or vice versa) or coaxially (primary and secondary coils share the same axis) when shingle A and shingle B are brought together during the installation. This concentric or coaxial lining up of the coils facilitates magnetic coupling between primary and secondary coils when an AC current is applied on either coil. The magnetic fields can either travel through air (air core) or can be deliberately confined into a volume with high magnetic permeability (such as a ferrite core). A ferrite core (or any other material with high magnetic permeability) allows the transformer to achieve higher inductances with less wire length, thus reducing losses. In the case of a ferrite core, the form factor of shingle A and shingle B are designed such that the core totally encloses the coils when shingle A and shingle B are brought together during installation. One practical embodiment is to use pot core halves where one half is enclosed in shingle A while the other half is enclosed in shingle B, as shown in FIG. 65. Other embodiments could use E-I cores.

Figure 58:
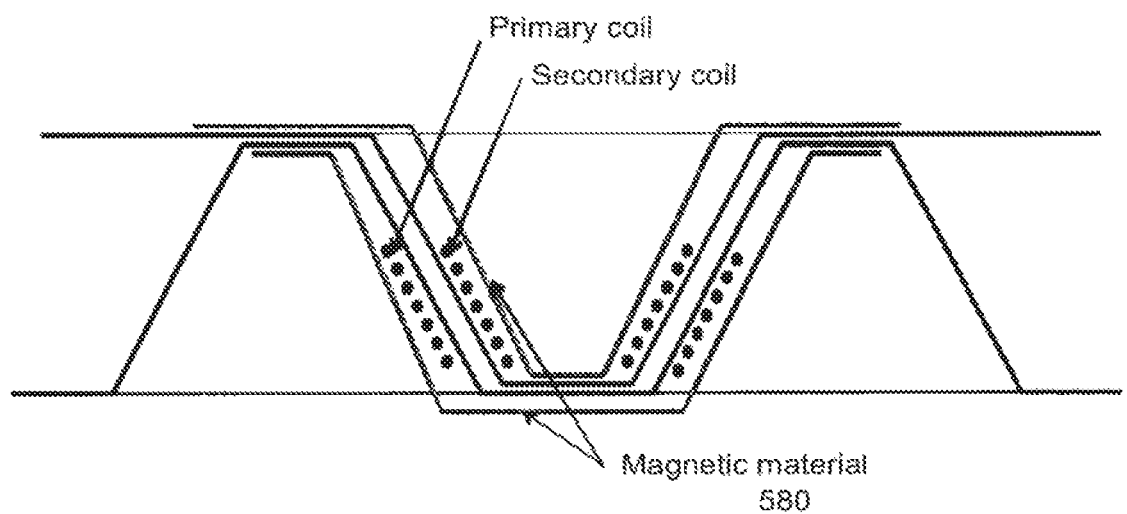
FIG. 58 shows a roofing panel with magnetic shield for the coils.

FIG. 58 shows an improvement of the coil arrangement in FIG. 48. Without the magnetic material the magnetic field is distributed all around the two coils and will easily radiate or dissipate into any conductive material nearby (e.g. nails, attic unshielded cables, attic wires that may form a loop). Adding the two pieces of magnetic material 580 (possibly ferrite) will concentrate the field in the core and in the gap between the two magnetic material pieces. The two added pieces need to be sized large enough so that the magnetic material doesn't saturate due to the coils' magnetic field.

The weather sealing requirements of BIPV shingles requires that the primary and secondary coils, together with their respective core halves, be preferably totally enclosed within each shingle, resulting in weather insulating material present in the interface between the core halves. This interface area can be doped to enhance magnetic permeability, thus removing any "air gap" between the core halves and maximizing magnetic power transfer. Alternatively, the material can be left as it is (plastic), creating an intentional air gap between the two magnetic cores, resulting in leakage inductances. The amount of leakage inductance is well controlled in this application (BIPV shingles) by manufacturing the interface material to be of a well-controlled thickness and ensuring that shingle A and shingle B are mounted tightly by means of fasteners (nails) located close to the transformer. In a more advanced embodiment, the surface surrounding the coils can be designed with elastic or spring-like properties such that force is applied between the two coil halves upon installation, ensuring minimal gap between the coils. This well-controlled leakage inductance, introduced by the "air gap," is factored into the primary and secondary circuits and cancelled out by creating a resonant circuit. This allows efficient wireless power transmission the primary and secondary even in the presence of non-ideal magnetic coupling. Even in the situation where there is no "air gap" between the two core halves, resonant circuit topologies would still be utilized to improve efficiency. This well-controlled leakage inductance introduced by the "air gap" helps achieve a resonant circuit topology without needing additional discrete inductors.

The contactless nature of the power link between shingle A and shingle B is resilient against weather and is more reliable than cabling.

The wireless power transfer that is automatically established upon installation reduces installation time and cost.

The wireless power transfer link between shingles forms an electrical isolation barrier between two circuits, which makes it resilient towards lighting strikes, and voltage spikes.

The embodiment with magnetic core forms a self limiting power link between the circuits in shingle A and shingle B where the amount of power transferred is limited by core saturation. This is an inherent safety feature which prevents dangerous power levels from component failures.

Figure 66:
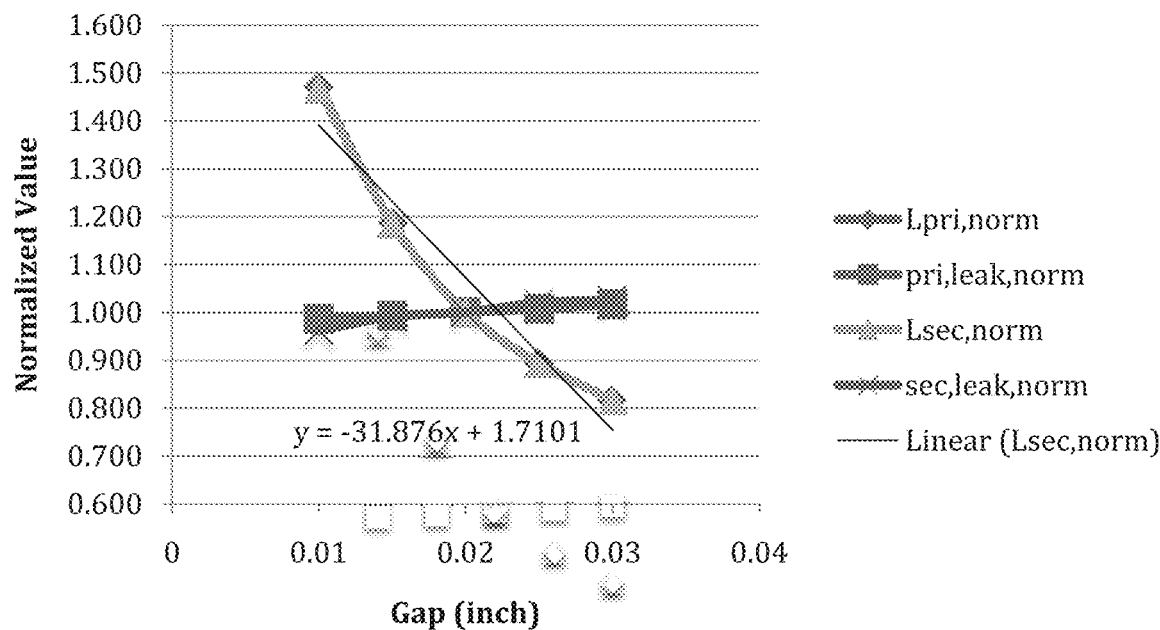
FIG. 66 shows magnetic parameters of a ferrite core transformer.

FIG. 66 presents magnetic parameters measured from a sample self-assembled ferrite core transformer as a function of the air gap between cores.

Figure 67:
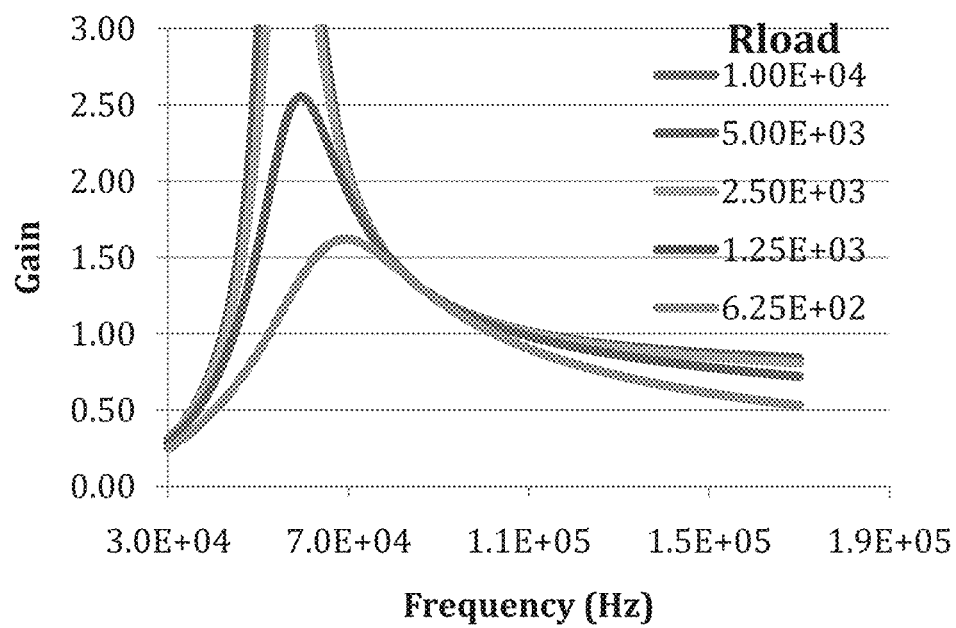
FIG. 67 shows estimated voltage gain curves of a wireless power transfer link using a self assembled transformer.

FIG. 67 presents estimated voltage gain curves of a wireless power transfer link using a self-assembled transformer at different output loads.

Figure 68:
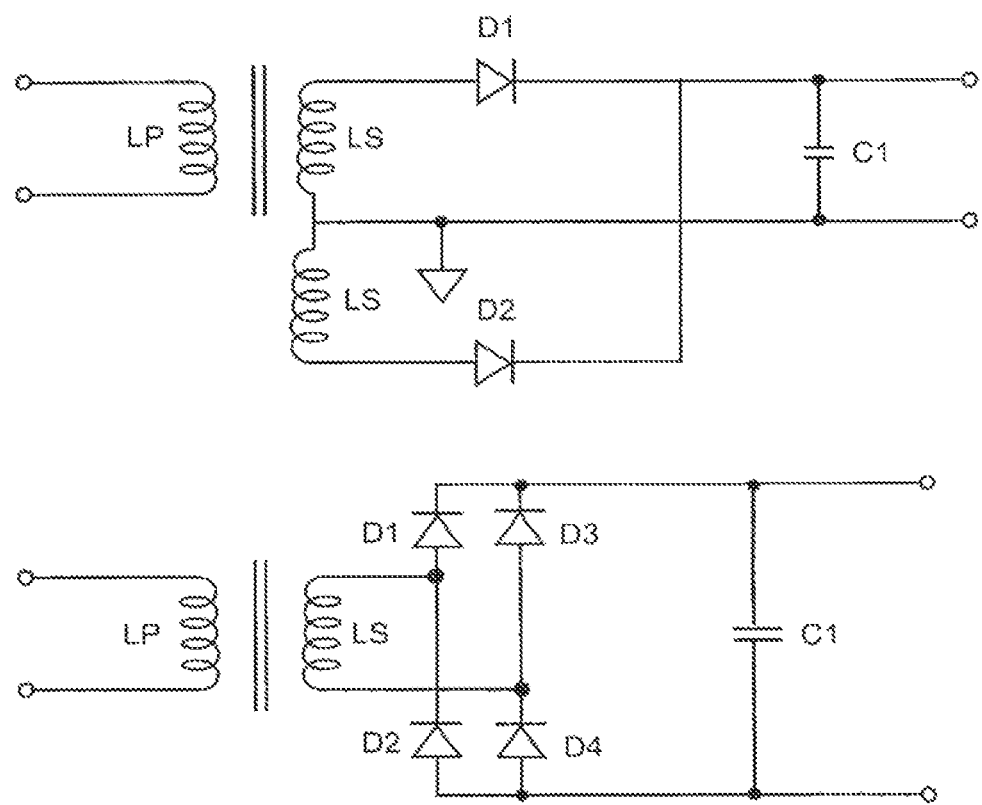
FIG. 68 shows an alternative embodiment of a rectifier.

FIG. 68 shows an alternative embodiment of a HF rectifier with the alternate two winding and only two diodes.

The foregoing description of the invention includes preferred forms thereof. Modifications may be made thereto without departing from the scope of the invention.

The invention claimed is:

1. A roofing panel that is configured to be arranged with an adjacent roofing panel, the roofing panel comprising:
   a substrate,
   a first coil region on the substrate, the first coil region defining a first nestable shape, and
   at least one of:
      a coil for wireless power transfer positioned within the first coil region, or
      a transformer positioned within the first coil region, and
   wherein the first nestable shape nests with a second nestable shape of a second coil region of the adjacent roofing panel such that the coil or the transformer of the first coil region aligns with a coil or a transformer of the second coil region, and
   wherein the coil or the transformer in the first coil region facilitates wireless power transfer between the roofing panel and the adjacent roofing panel when the first nestable shape nests with the second nestable shape.

2. A system comprising:
   a first roofing panel comprising:
      a first substrate;
      a first coil region on the first substrate, the first coil region defining a first nestable shape; and
      at least one of:
         a first coil for wireless power transfer positioned within the first coil region, or
         a first transformer positioned within the first coil region; and
   a second roofing panel comprising:
      a second substrate;
      a second coil region on the second substrate, the second coil region defining a second nestable shape; and
      at least one of:
         a second coil for wireless power transfer positioned within the second coil region, or
         a second transformer positioned within the second coil region;
   wherein the first nestable shape is configured to nest with the second nestable shape such that first coil or the first transformer is aligned with the second coil or the second transformer; and
   wherein the at least one of the first coil or the first transformer in the first coil region facilitates wireless power transfer between the first roofing panel and the second roofing panel when the first nestable shape nests with the second nestable shape.

3. The system according to claim 2 wherein the first coil region is a moulded recess.

4. The system according to claim 2 wherein the second coil region is a moulded recess.

5. The system according to claim 2 wherein the first coil region is configured as a moulded recess to physically couple to the second coil region of the second roofing panel in the system.

6. The system according to claim 3 wherein the first coil region of the first roofing panel envelops the second coil region of the second roofing panel in the system.

7. The system according to claim 4 wherein the second coil region of the second roofing panel envelops the first coil region of the first roofing panel in the system.

8. The system according to claim 3 wherein the first coil region comprises an opening to receive the second coil region of the second roofing panel in the system.

9. The system according to claim 4 wherein the second coil region is configured to extend into an opening of the first coil region of the first roofing panel in the system.

10. The system according to claim 8 wherein the first nestable shape comprises a frustoconical opening for receiving a frustoconical protrusion of the second nestable shape.

11. The system according to claim 8 wherein the first coil region is coaxial or concentric with the received second coil region of the second roofing panel in the system so that the first roofing panel self-aligns and/or interlocks with the second roofing panel.

12. The system according to claim 2 wherein the first coil region and/or the second coil region is sprung to facilitate coil spacing when physically coupled.

13. The system according to claim 2 wherein the first coil is a transmitting coil.

14. The system according to claim 2 wherein the second coil is a receiving coil.

15. The system according to claim 2 wherein the first substrate comprises an underlapping region and the first coil region is formed in the underlapping region and the first substrate comprises an overlapping region and a third coil region is formed in the overlapping region.

16. The system according to claim 15 further comprising:
one or more PV regions for carrying PV cells in the overlapping region,
a recess for carrying a power conversion module.

17. The system according to claim 16 further comprising one or more formed features in the underlapping region to create airflow channels that provide for airflow when the first roofing panel is interconnected with the second roofing panel and/or one or more additional roofing panels.

18. The system according to claim 16 further comprising one or more PV cells in the one or more PV regions, and a power conversion module in the recess connected to an output of the one or more PV cells.

19. The system according to claim 16 wherein the first coil in the first coil region is for inductive coupling with a respective coil on a DC or AC bus.

20. The system according to claim 19 wherein the DC or AC bus wirelessly couples to the second roofing panel and/or one or more additional roofing panels and couples directly or indirectly to an output AC grid bus.

\* \* \* \* \*